(12) United States Patent
Sasaki et al.

(10) Patent No.: US 8,004,045 B2
(45) Date of Patent: Aug. 23, 2011

(54) SEMICONDUCTOR DEVICE AND METHOD FOR PRODUCING THE SAME

(75) Inventors: Yuichiro Sasaki, Osaka (JP); Keiichi Nakamoto, Osaka (JP); Katsumi Okashita, Osaka (JP); Hisataka Kanada, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 127 days.

(21) Appl. No.: 12/512,617

(22) Filed: Jul. 30, 2009

(65) Prior Publication Data

US 2009/0289300 A1 Nov. 26, 2009

Related U.S. Application Data

(63) Continuation-in-part of application No. 12/193,861, filed on Aug. 19, 2008, which is a continuation of application No. PCT/JP2008/000303, filed on Feb. 22, 2008.

(30) Foreign Application Priority Data

Jul. 27, 2007 (JP) ................................. 2007-195860
Jul. 31, 2008 (JP) ................................. 2008-198477

(51) Int. Cl.
*H01L 29/76* (2006.01)
*H01L 29/94* (2006.01)
(52) U.S. Cl. ................. 257/369; 257/401; 257/E27.062
(58) Field of Classification Search .................. 257/369, 257/401, E27.062
See application file for complete search history.

(56) References Cited

U.S. PATENT DOCUMENTS

| 4,912,065 | A | 3/1990 | Mizuno et al. |
| 7,138,305 | B2 | 11/2006 | Datta et al. |
| 7,800,165 | B2 * | 9/2010 | Sasaki et al. ................. 257/327 |
| 2004/0036038 | A1 | 2/2004 | Okumura et al. |

(Continued)

FOREIGN PATENT DOCUMENTS

JP 01-295416 11/1989

(Continued)

OTHER PUBLICATIONS

Khajetoorians, A. A., et al., "Dopant characterization of fin field-effect transistor structures using scanning capaciktance microscopy", J. Appl. Phys, Feb. 9, 2007, vol. 101 No. 3, American Institute of Physics.

(Continued)

*Primary Examiner* — Ngan Ngo
(74) *Attorney, Agent, or Firm* — McDermott Will & Emery LLP

(57) ABSTRACT

First and second gate insulating films are formed so as to cover at least the upper corner of first and second fin-shaped semiconductor regions. The radius of curvature r1' of the upper corner of the first fin-shaped semiconductor region located outside the first gate insulating film is greater than the radius of curvature r1 of the upper corner of the first fin-shaped semiconductor region located under the first gate insulating film and is less than or equal to 2×r1. The radius of curvature r2' of the upper corner of the second fin-shaped semiconductor region located outside the second gate insulating film is greater than the radius of curvature r2 of the upper corner of the second fin-shaped semiconductor region located under the second gate insulating film and is less than or equal to 2×r2.

14 Claims, 27 Drawing Sheets

U.S. PATENT DOCUMENTS

| | | |
|---|---|---|
| 2005/0116218 A1 | 6/2005 | Yang |
| 2005/0280102 A1 | 12/2005 | Oh et al. |
| 2006/0084204 A1 | 4/2006 | Yin et al. |
| 2006/0157749 A1 | 7/2006 | Okuno |
| 2006/0220131 A1 | 10/2006 | Kinoshita et al. |
| 2007/0004117 A1 | 1/2007 | Yagishita |
| 2007/0082437 A1 | 4/2007 | Cheng et al. |
| 2007/0090408 A1 | 4/2007 | Majumdar et al. |
| 2007/0096196 A1 | 5/2007 | Hofmann et al. |
| 2007/0148836 A1 | 6/2007 | Cheng et al. |
| 2007/0155075 A1 | 7/2007 | Kim et al. |
| 2007/0158700 A1 | 7/2007 | Koh et al. |
| 2007/0184627 A1 | 8/2007 | Cho et al. |
| 2007/0210355 A1 | 9/2007 | Izumida |
| 2007/0235819 A1 | 10/2007 | Yagishita |
| 2008/0050897 A1 | 2/2008 | Kottantharayil |
| 2008/0179683 A1* | 7/2008 | Sasaki et al. .................. 257/368 |
| 2009/0181526 A1 | 7/2009 | Okumura et al. |
| 2009/0233383 A1 | 9/2009 | Okumura et al. |
| 2011/0033989 A1* | 2/2011 | Choi et al. .................... 438/154 |
| 2011/0037141 A1* | 2/2011 | Kim et al. ..................... 257/506 |

FOREIGN PATENT DOCUMENTS

| | | |
|---|---|---|
| JP | 2006-196821 | 7/2006 |
| WO | WO 2006/064772 A1 | 6/2006 |
| WO | WO 2006/098109 A1 | 9/2006 |
| WO | WO 2006/106872 A1 | 10/2006 |

OTHER PUBLICATIONS

Lenoble, D., et al., "Enhanced performance of PMOS MUGFET via integration of conformal plasma-doped source/drain extensions", Symposium on VLSI Technology Digest of Technical Papers, 2006, p. 212, IEEE.

United States Office Action issued in U.S. Appl. No. 12/193,861, dated Feb. 16, 2011.

* cited by examiner

SEMICONDUCTOR DEVICE AND METHOD FOR PRODUCING THE SAME

CROSS REFERENCE TO RELATED APPLICATIONS

This is a continuation-in-part of U.S. patent application Ser. No. 12/193,861, filed on Aug. 19, 2008, which is a continuation of International Application No. PCT/JP2008/000303, filed on Feb. 22, 2008, which claims priority to Japanese Patent Application No. 2007-195860, filed on Jul. 27, 2007. This application claims priority under 35 U.S.C. §119(a) to Japanese Patent Applications No. 2007-195860, and No. 2008-198477, filed on Jul. 31, 2008. The entire contents of these applications is herein incorporated by reference in their entirety.

BACKGROUND OF THE INVENTION

The present disclosure relates to a semiconductor device and a method for producing the same, and more particularly to a semiconductor device of a three-dimensional structure including fin-shaped semiconductor regions on a substrate and a method for producing the same.

In recent years, demands for miniaturizing semiconductor devices have been increasing along with the increase in the degree of integration, functionality and speed thereof. In view of this, various device structures have been proposed in the art, aiming at the reduction in the area of the substrate taken up by transistors. Among others, attention has been drawn to field effect transistors having a fin-shaped structure. A field effect transistors having the fin-shaped structure is commonly called a fin-shaped FET (field effect transistor), and has an active region including thin wall (fin)-like semiconductor regions perpendicular to the principle plane of the substrate. In a fin-shaped FET, the side surface of the semiconductor region can be used as a channel surface, whereby it is possible to reduce the area on the substrate taken up by the transistor (see, for example, Patent Document 1 and Non-Patent Document 1).

FIGS. 27A-27D show a structure of a conventional fin-shaped FET, wherein FIG. 27A is a plan view, FIG. 27B is a cross-sectional view taken along line A-A in FIG. 27A, FIG. 27C is a cross-sectional view taken along line B-B in FIG. 27A, and FIG. 27D is a cross-sectional view taken along line C-C in FIG. 27A.

As shown in FIGS. 27A-27D, a conventional fin-shaped FET includes a supporting substrate 101 made of silicon, an insulating layer 102 made of silicon oxide formed on the supporting substrate 101, semiconductor regions 103a to 103d each formed into a fin shape on the insulating layer 102 (hereinafter referred to as the "fin-shaped semiconductor regions"), a gate electrode 105 formed on the fin-shaped semiconductor regions 103a to 103d via gate insulating films 104a to 104d, insulative sidewall spacers 106 formed on side surfaces of the gate electrode 105, extension regions 107 formed on opposite side regions of the fin-shaped semiconductor regions 103a to 103d sandwiching the gate electrode 105 therebetween, and source-drain regions 117 formed on opposite side regions of the fin-shaped semiconductor regions 103a to 103d sandwiching the gate electrode 105 and the insulative sidewall spacer 106 therebetween. The fin-shaped semiconductor regions 103a to 103d are placed on the insulating layer 102 so as to be arranged at regular intervals in the gate width direction. The gate electrode 105 is formed so as to extend across the fin-shaped semiconductor regions 103a to 103d in the gate width direction. The extension region 107 includes a first impurity region 107a formed in an upper portion of each of the fin-shaped semiconductor regions 103a to 103b, and a second impurity region 107b formed in a side portion of each of the fin-shaped semiconductor regions 103a to 103b. The source-drain region 117 includes a third impurity region 117a formed in an upper portion of each of the fin-shaped semiconductor regions 103a to 103b, and a fourth impurity region 117b formed in a side portion of each of the fin-shaped semiconductor regions 103a to 103b. Note that pocket regions are not described herein or shown in the figure.

FIGS. 28A-28D are cross-sectional views showing step by step a conventional method for producing a semiconductor device. Note that FIGS. 28A-28D correspond to the cross-sectional structure taken along line C-C in FIG. 27A. In FIGS. 28A-28D, like elements to those shown in FIGS. 27A-27D are denoted by like reference numerals and will not be described redundantly.

First, as shown in FIG. 28A, there is provided an SOI (silicon on insulator) substrate, in which the insulating layer 102 made of silicon oxide is provided on the supporting substrate 101 made of silicon, and a semiconductor layer made of silicon is provided on the insulating layer 102. Then, the semiconductor layer is patterned to form the fin-shaped semiconductor region 103b to be the active region.

Then, as shown in FIG. 28B, the gate insulating film 104 is formed on the surface of the fin-shaped semiconductor region 103b, after which a polysilicon film 105A is formed across the entire surface of the supporting substrate 101.

Then, as shown in FIG. 28C, the polysilicon film 105A and the gate insulating film 104 are etched successively to form the gate electrode 105 on the fin-shaped semiconductor region 103b with the gate insulating film 104b interposed therebetween. Then, using the gate electrode 105 as a mask, the semiconductor region 103b is ion-implanted with an impurity to form the extension region 107 and the pocket region (not shown).

Then, as shown in FIG. 28D, an insulating film is formed across the entire surface of the supporting substrate 101, and then the insulating film is etched back by using anisotropic dry etching to thereby form the insulative sidewall spacer 106 on the side surface of the gate electrode 105. Then, using the gate electrode 105 and the side wall 106 as a mask, the semiconductor region 103b is ion-implanted with an impurity to form the source-drain region 117.

Through the steps described above, it is possible to obtain a fin-shaped MISFET (metal insulator semiconductor field effect transistor) having the gate electrode 105 formed on the fin-shaped semiconductor region 103b with the gate insulating film 104b interposed therebetween.

In recent years, it has been drawing attention to use a plasma doping method in order to conformally dope the upper surface and the side surface of a fin-shaped semiconductor region. For example, a pulsed DC plasma technique has been proposed in the art (Non-Patent Document 1) as a plasma doping method used for conformal doping. This is a method in which a plasma is generated on and off, and has an advantage in that etching is unlikely to occur. However, if the method is used for doping a fin-shaped semiconductor region, the specific resistance of the side surface of the semiconductor region will be larger than that of the upper surface of the semiconductor region.

Note that in addition to the pulsed DC plasma technique of Non-Patent Document 1, plasma doping methods include a method disclosed in Patent Document 2 as a representative method. Patent Document 2 proposes a technique using an inductively coupled plasma (ICP) method. This is a method desirably capable of uniformly doping into the surface of a large substrate such as a wafer having a diameter of 300 mm, for example, by employing a longer time region (doping time) than that used in a pulsed DC plasma method.

Patent Document 3 discloses a plasma doping method for conformally doping the trench side surface. Note however that this is a technique for doping only the trench side surface, and it is not an object of the technique to dope the upper surface and the side surface of a fin-shaped semiconductor region. That is, with a method doping only the side surface as disclosed in Patent Document 3, doping is performed while masking the upper surface, thus failing to realize effects of the present invention to be described later, such as the realization of conformal doping on the upper surface and the side surface, and the prevention of chipping of the upper corner of a fin-shaped semiconductor region.

Patent Document 1: Japanese Published Patent Application No. 2006-196821

Patent Document 2: International Publication WO2006/064772

Patent Document 3: Japanese Published Patent Application No. H01-295416

Non-Patent Document 1: D. Lenoble, et al., Enhanced performance of PMOS MUGFET via integration of conformal plasma-doped source/drain extensions, 2006 Symposium on VLSI Technology Digest of Technical Papers, p. 212

SUMMARY OF THE INVENTION

However, with conventional methods for producing a semiconductor device disclosed in documents such as Patent Document 1 and Non-Patent Document 1 identified above, it is not possible to obtain desirable transistor characteristics. One of the desirable transistor characteristics is no substantial decrease in the drain current in a fin-shaped MISFET, particularly, in a fin-shaped CMISFET including a fin-shaped NMISFET and a fin-shaped PMISFET.

In view of this, it is an object of the present invention to realize a fin-shaped CMISFET with which desirable characteristics can be obtained.

In order to achieve the object set forth above, the present inventors have studied the reason why desirable transistor characteristics cannot be obtained with a conventional method for producing a fin-shaped FET, leading to the following findings.

FIG. 29A is a cross-sectional view showing the step of forming an extension region of a fin-shaped FET as described in Patent Document 1, and FIG. 29B is a cross-sectional view showing the step of forming an extension region of a fin-shaped FET as described in Non-Patent Document 1. Note that FIGS. 29A and 29B correspond to the cross-sectional structure taken along line B-B in FIG. 27A. In FIGS. 29A and 29B, like elements to those shown in FIGS. 27A-27D are denoted by like reference numerals and will not be described redundantly.

As shown in FIG. 29A, in the method disclosed in Patent Document 1, in order to introduce an impurity not only into the upper surface of the fin-shaped semiconductor regions 103a to 103d but also into the side surface thereof, ions 108a and 108b are implanted by ion implantation into the fin-shaped semiconductor regions 103a to 103d at respective implantation angles inclined with respect to the vertical direction in different directions from each other, thus forming the extension region 107. In such a case, the first impurity region 107a, into which the ions 108a and the ions 108b are both implanted, is formed in the upper portion of the fin-shaped semiconductor regions 103a to 103d. However, the second impurity region 107b, into which either the ions 108a or the ions 108b are implanted, is formed in each side portion of the fin-shaped semiconductor regions 103a to 103d. That is, where the dose of the ions 108a and that of the ions 108b are equal to each other, the implantation dose of a first impurity region 107a is twice as large as the implantation dose of the second impurity region 107b.

As shown in FIG. 29B, in the method disclosed in Non-Patent Document 1, the extension region 107 is formed in the fin-shaped semiconductor regions 103a to 103d by using a plasma doping method. Where an impurity is implanted by using a plasma doping method, the first impurity region 107a is formed in an upper portion of the fin-shaped semiconductor regions 103a to 103d, wherein the implantation dose of the first impurity region 107a is dictated by the balance between implanted ions 109a, an adsorbed species (a neutral species such as gas molecules or radicals) 109b, and an impurity 109c that is desorbed from the fin-shaped semiconductor regions 103a to 103d by sputtering. However, the implantation dose of each side portion of the fin-shaped semiconductor regions 103a to 103d is less influenced by the implanted ions 109a and the impurity 109c desorbed by sputtering, and there is formed a second impurity region 107b whose implantation dose is mainly dictated by the adsorbed species 109b. As a result, the implantation dose of the first impurity region 107a is higher than that of the second impurity region 107b by about 25%, for example, whereby the sheet resistance of the first impurity region 107a is lower than that of the second impurity region 107b by about 25%, for example.

The application of the plasma doping method disclosed in Patent Document 2 in order to form an impurity region in a fin-shaped semiconductor region has the following problem. Where the plasma doping method disclosed in Patent Document 2 (the plasma-generating gas is $B_2H_6$/He) is applied to a flat semiconductor region 151, as shown in FIG. 30A, the amount of chipping of silicon of the semiconductor region 151 is less than or equal to 1 nm/min. However, where an impurity region is formed in a fin-shaped semiconductor region by using the plasma doping method disclosed in Patent Document 2, as shown in FIG. 30B, the amount of chipping of the upper corner of a fin-shaped semiconductor region 152 on the flat semiconductor region 151 is greater than 10 nm/min. FIG. 31 is a perspective view showing a gate electrode formed on a fin-shaped semiconductor region having such a problem with a gate insulating film interposed therebetween. As shown in FIG. 31, a gate electrode 163 is formed so as to bridge over a fin-shaped semiconductor region 161 having an impurity region 161a in an upper portion thereof and an impurity region 161b in a side portion thereof, with a gate insulating film 162 interposed therebetween. Herein, a, b, c and d denote corners on the source side along the inner wall of the gate insulating film 162 having a pommel horse shape, and a", b", c" and d" are obtained by translating the corners a, b, c and d to the source-side end surface of the fin-shaped semiconductor region 161. That is, the amount of chipping G of the upper corner of the fin-shaped semiconductor region 161 is the distance from the upper corner to b" or c", and assuming that the radius of curvature of the upper corner is r, $G=(\sqrt{2}-1)\cdot r$ holds (where the radius of curvature r' of the upper corner before doping is 0). If the amount of chipping G of the upper corner of the fin-shaped semiconductor region 161 increases, there will be an unintended gap between the inner wall corner b or c of the gate insulating film 162 and the impurity region 161a or 161b to be the extension region, for example.

As described above, with a conventional method for forming an extension region of a fin-shaped FET (see FIGS. 27A-27D and 28A-28D), the implantation dose of the first impurity region 107a formed in an upper portion of the fin-shaped semiconductor regions 103a to 103d is higher than that of the second impurity region 107b formed in a side portion of the fin-shaped semiconductor regions 103a to 103d. Moreover, the junction depth of the second impurity region 107b is shallower than that of the first impurity region 107a. Thus, the sheet resistance, the resistivity or the spreading resistance of the first impurity region 107a is lower than that of the second impurity region 107b. Herein, Rs=ρ/t, where Rs is the sheet resistance of the object, ρ is the specific resistance (resistivity), t is the thickness (the junction depth), and ρw is the spreading resistance. As represented in the relational expression ρw=CF×k×ρ/2πr, which is widely known for the spreading resistance measurement, the specific resistance (resistivity) ρ and the spreading resistance ρw basically have a one-to-one correspondence, whereby there is a proportional relationship between Rs and ρw/t. In the relational expression, CF denotes the term of correction taking into consideration the volume effect of the spreading resistance ρw (CF=1 where no correction is made), k denotes the term of correction taking into consideration the polarity dependency at the Schottky barrier between the probe and the sample (for example, k=1 where the sample is p-type silicon, and k=1 to 3 where the sample is n-type silicon), and r denotes the radius of curvature of the tip of the probe.

When a fin-shaped FET having such an extension structure is operated, the current flowing through the extension region 107 is localized in the first impurity region 107a where the implantation dose is higher, i.e., the sheet resistance is lower, than the second impurity region 107b, thereby failing to obtain desirable transistor characteristics.

Moreover, in the conventional fin-shaped FET (see FIGS. 27A-27D and 28A-28D), the source-drain region is also formed by using an ion implantation method or a plasma doping method similar to that for the extension region. Therefore, also in the source-drain region 117, the implantation dose of the third impurity region 117a formed in an upper portion of the fin-shaped semiconductor regions 103a to 103d is higher than that of the fourth impurity region 117b formed in a side portion of the fin-shaped semiconductor regions 103a to 103d. Moreover, the junction depth of the fourth impurity region 117b is shallower than that of the third impurity region 117a. When a fin-shaped FET having such a source-drain structure is operated, the current flowing through the source-drain region 117 is localized in the second impurity region 117a where the implantation dose is higher, i.e., the sheet resistance is lower, than the fourth impurity region 117b, thereby failing to obtain desirable transistor characteristics.

With the conventional method for forming an extension region of a fin-shaped FET (see FIG. 31), there will be an unintended gap between the inner wall of the gate insulating film 162 bridging over the fin-shaped semiconductor region 161 and the extension region of the fin-shaped semiconductor region 161. When a fin-shaped FET having such an extension structure is operated, the current flowing through the extension region is less likely to flow through the upper corner of the fin-shaped semiconductor region 161, thereby failing to obtain desirable transistor characteristics.

Particularly, when a fin-shaped CMISFET is formed by using the method for forming an extension region of a conventional fin-shaped FET, the upper corner of the fin-shaped semiconductor region forming the fin-shaped NMISFET is more chipped off because the mass of arsenic (As) or phosphorus (P) which is an n-type impurity for forming the fin-shaped NMISFET is greater than that of boron (B) which is a p-type impurity for forming the fin-shaped PMISFET.

Based on the above findings, the present inventors have invented a method for forming an impurity region in a side portion of a fin-shaped semiconductor region of each MISFET in a fin-shaped CMISFET that includes not only a fin-shaped PMISFET but also a fin-shaped NMISFET on the same substrate so that the implantation dose in the side portion is greater than or equal to 80% of that in an upper portion of the fin-shaped semiconductor region, by setting the pressure during plasma doping for the n-type impurity implantation to be less than or equal to the pressure during plasma doping for the p-type impurity implantation.

More specifically, the present inventors have invented a method for realizing a fin-shaped CMISFET, i.e., a semiconductor device including an impurity region in a side portion of a fin-shaped semiconductor region of each of a PMISFET and an NMISFET where the implantation dose is greater than or equal to 80% of that in an upper portion of the fin-shaped semiconductor region, by setting the pressure (which hereinafter refers to the chamber pressure) during plasma doping for the p-type impurity implantation to be less than or equal to 0.6 Pa and by setting the pressure during plasma doping for the n-type impurity implantation to be less than or equal to 0.4 Pa.

Particularly, in some cases with a fin-shaped FET, the width of the impurity region formed in a side portion of the fin-shaped semiconductor region accounts for 70% or more of the width of the extension region and the source-drain region in the gate width direction. Therefore, it has become important that the implantation dose of the impurity region formed in a side portion of the fin-shaped semiconductor region is made substantially equal to or greater than that of the impurity region formed in an upper portion of the fin-shaped semiconductor region as much as possible. In other words, it has become important that the resistivity, the spreading resistance or the sheet resistance of the impurity region formed in the side portion of the fin-shaped semiconductor region is set to be less than or equal to 1.25 times that of the impurity region formed in the upper portion of the fin-shaped semiconductor region.

Note that while the lower limit of the pressure during plasma doping can be set to be low within such a range that does not present problems with respect to the throughput, the limitations of the apparatus, etc., the lower limit is about 0.1 Pa in view of the performance of a state-of-the-art ICP plasma apparatus, etc., and is about 0.01 Pa in view of the performance of a plasma apparatus to be used in the future.

A semiconductor device of the present invention is a semiconductor device obtained by plasma doping method described above, including: a first fin-shaped semiconductor region formed on a substrate, the first fin-shaped semiconductor region having first-conductivity-type impurity region formed therein; a second fin-shaped semiconductor region formed on the substrate, the second fin-shaped semiconductor region having second-conductivity-type impurity region formed therein; a first gate insulating film formed so as to cover at least a side surface and an upper corner of a predetermined portion of the first fin-shaped semiconductor region, the upper corner of the first fin-shaped semiconductor region having a radius of curvature of r1 under the first gate insulating film different from a radius of curvature of r1' outside the first gate insulating film; and a second gate insulating film formed so as to cover at least a side surface and an upper corner of a predetermined portion of the second fin-shaped semiconductor region, the upper corner of the second fin-shaped semiconductor region having a radius of curvature of r2 under the second gate insulating film different from a radius of curvature of r2' outside the second gate insulating film, wherein r1' is greater than r1 and less than or equal to 2×r1, and r2' is greater than r2 and less than or equal to 2×r2.

In the semiconductor device of the present invention, the first-conductivity type impurity region may include a first first-conductivity-type impurity region formed in an upper portion of the first fin-shaped semiconductor regions and a second first-conductivity-type impurity region formed in a side portion of the first fin-shaped semiconductor region, and the second-conductivity-type impurity region may include a first second-conductivity-type impurity region formed in an upper portion of the second fin-shaped semiconductor region and a second second-conductivity-type impurity region formed in a side portion of the second fin-shaped semiconductor region.

In the semiconductor device of the present invention, the transistor characteristics can be significantly improved over the conventional techniques, if the implantation dose of the impurity region formed in the side portion of each fin-shaped semiconductor region is about 80% (more preferably 90%) or more of that of the impurity region formed in the upper portion of each fin-shaped semiconductor regions; in other words, if the sheet resistance, the resistivity or the spreading resistance of the impurity region formed in the side portion of each fin-shaped semiconductor region is less than or equal to 1.25 times (more preferably 1.1 times) that of the impurity region formed in the upper portion of each fin-shaped semiconductor region.

If "the height of the side surface of the fin-shaped semiconductor region"/"the width of the upper surface of the fin-shaped semiconductor region in the gate width direction" (hereinafter referred to as the "aspect ratio") is small, there will be little degradation in the transistor characteristics even if the implantation dose of the impurity region formed in the side portion of each fin-shaped semiconductor region is somewhat smaller than that of the impurity region formed in the upper portion of each fin-shaped semiconductor region. On the other hand, an increase in the aspect ratio accordingly increases the necessity to make the implantation dose of the impurity region formed in the side portion of each fin-shaped semiconductor region to be 80% or more of that of the impurity region formed in the upper portion of each fin-shaped semiconductor region.

In order to make the gap between the impurity region provided in each fin-shaped semiconductor region and the inner wall of the gate insulating film to be completely zero, the amount of etching of each fin-shaped semiconductor region by using a plasma doping needs to be made completely zero. For this, it is necessary to use conditions with very small ion densities, which makes the amount of time required for the plasma doping process to be very long, thereby lowering the productivity very much. Therefore, if the gap between the impurity region provided in each fin-shaped semiconductor region and the inner wall of the gate insulating film is greater than zero and less than or equal to about 10 nanometers; in other words, if the radius of curvature r' of the upper corner of a portion of each fin-shaped semiconductor region located outside the gate insulating film is greater than the radius of curvature r of the upper corner of a portion of each fin-shaped semiconductor region located under the gate insulating film and is less than or equal to 2×r, it is possible to ensure the productivity of the plasma doping process while suppressing deterioration in the transistor characteristics.

In the semiconductor device of the present invention, a junction depth of the second first-conductivity-type impurity region may be substantially equal to or greater than that of the first first-conductivity-type impurity region, and a junction depth of the second second-conductivity-type impurity region may be substantially equal to or greater than that of the first second-conductivity-type impurity region.

The semiconductor device of the present invention may further include: a first gate electrode formed on the first gate insulating film; and a second gate electrode formed on the second gate insulating film, wherein the first first-conductivity-type impurity region and the second first-conductivity-type impurity region are formed in another portion of the first fin-shaped semiconductor region other than the predetermined portion, and the first second-conductivity-type impurity region and the second second-conductivity-type impurity region are formed in another portion of the second fin-shaped semiconductor region other than the predetermined portion. In such a case, the first gate insulating film may be formed also on an upper surface of the predetermined portion of the first fin-shaped semiconductor region, and the second gate insulating film may be formed also on an upper surface of the predetermined portion of the second fin-shaped semiconductor region. Moreover, the first first-conductivity-type impurity region and the second first-conductivity-type impurity region may be p-type extension regions, and the first second-conductivity-type impurity region and the second second-conductivity-type impurity region may be n-type extension regions. Furthermore, the semiconductor device may further include: a first insulative sidewall spacer formed on a side surface of the first gate electrode; a second insulative sidewall spacer formed on a side surface of the second gate electrode; a third first-conductivity-type impurity region formed in the upper portion of the first fin-shaped semiconductor region; a fourth first-conductivity-type impurity region formed in the side portion of the first fin-shaped semiconductor region; a third second-conductivity-type impurity region formed in the upper portion of the second fin-shaped semiconductor region; and a fourth second-conductivity-type impurity region formed in the side portion of the second fin-shaped semiconductor region, wherein the third first-conductivity-type impurity region and the fourth first-conductivity-type impurity region are formed in a portion of the other portion of the first fin-shaped semiconductor region that is located outside the first insulative sidewall spacer, and the third second-conductivity-type impurity region and the fourth second-conductivity-type impurity region are formed in a portion of the other portion of the second fin-shaped semiconductor region that is located outside the second insulative sidewall spacer. Herein, the third first-conductivity-type impurity region and the fourth first-conductivity-type impurity region may be p-type source-drain regions, and the third second-conductivity-type impurity region and the fourth second-conductivity-type impurity region may be n-type source-drain regions.

In the semiconductor device of the present invention, an insulating film may be formed between the substrate and each of the first fin-shaped semiconductor region and the second fin-shaped semiconductor region.

The effects of the present invention can be better realized if, in the semiconductor device of the present invention, a height of a side surface of the first fin-shaped semiconductor region is greater than a width in a gate width direction of an upper surface of the first fin-shaped semiconductor region, and a height of a side surface of the second fin-shaped semiconductor region is greater than a width in a gate width direction of an upper surface of the second fin-shaped semiconductor region.

The effects of the present invention can be better realized if, in the semiconductor device of the present invention, a width in a gate width direction of an upper surface of each of the first fin-shaped semiconductor region and the second fin-shaped semiconductor region is less than or equal to 20 nm.

A method of the present invention is a method for producing a semiconductor device based on the plasma doping method of the present invention described above, the method including the steps of: (a) forming a first fin-shaped semiconductor region on a substrate; (b) forming a second fin-shaped semiconductor regions on the substrate; (c) implanting the first fin-shaped semiconductor region with a first-conductivity-type impurity by a plasma doping method; and (d) implanting the second fin-shaped semiconductor region with a second-conductivity-type impurity by a plasma doping method, wherein the first-conductivity-type impurity is a p-type impurity or an n-type impurity, the second-conductivity-type impurity is an impurity of a conductivity type different from that of the first-conductivity-type impurity, in a case where a mass of the second-conductivity-type impurity is greater than that of the first-conductivity-type impurity, a pressure during plasma doping in the step (d) is set to be less than or equal to that in the step (c), and in a case where the mass of the first-conductivity-type impurity is greater than that of the second-conductivity-type impurity, the pressure during plasma doping in the step (c) is set to be less than or equal to that in the step (d).

That is, a characteristic of the method for producing a semiconductor device of the present invention is in the control of the amount of etching and the implantation dose for the fin-shaped semiconductor region using a plasma doping method, whereby it is possible to control the amount of etching by adjusting the pressure during plasma doping and it is possible to control the sheet resistance to a desirable value through the control of the implantation dose by annealing after doping.

Specifically, in plasma doping, as a material gas is supplied into a plasma, there will be radicals, ions or constituent molecules of the material gas or molecules or atoms resulting from the decomposition of the molecules in the plasma. In view of this, the method for producing a semiconductor device of the present invention is a method for applying the following properties to a three-dimensional device such as a fin-shaped FET:

(1) ions in a plasma are basically incident on the substrate vertically with respect to the principle plane of the substrate;

(2) neutral species such as gas molecules, radicals, etc., in a plasma are incident on the substrate in random directions with respect to the principle plane of the substrate; and (3) an impurity introduced into a semiconductor, whether it is introduced in the form of ions or neutral species, contributes to electrical conduction after being activated by a heat treatment.

Moreover, in addition to these inherent properties (1)-(3) of ions, gas molecules, radicals, etc., the present inventors have newly found in an experiment the following property characteristic of plasma doping on a fin-shaped semiconductor region:

(4) the factor that etches the corner portion (the upper corner) of a fin-shaped semiconductor region is basically the ions in the plasma, and the amount of etching of the corner portion is suppressed by reducing the ion density.

Based on these findings, the primary characteristic of the method for producing a semiconductor device of the present invention lies in "decreasing the pressure during plasma doping as the mass of the introduced impurity increases" Thus, by sufficiently decreasing the pressure during plasma doping, the ion density decreases to a very low level, thereby suppressing the amount of etching of the corner portion of the fin-shaped semiconductor region. At the same time, it is possible to reduce the amount of impurity incident upon the principle plane of the substrate in a perpendicular direction, and to relatively increase the amount of impurity incident upon the principle plane of the substrate in random directions. Moreover, for the decrease in the implantation dose due to the decrease in the ion density, it is possible to compensate for the decrease in the implantation dose to thereby achieve a desirable implantation dose by increasing the proportion of an impurity-containing gas in the material gas with respect to the diluent gas. Therefore, it is possible to obtain a semiconductor device in which an impurity region in a side portion of the semiconductor region has an implantation dose of 80% or more of that in an upper portion of the semiconductor region. Therefore, it is possible to obtain desirable transistor characteristics even if the proportion of the width of the impurity region formed in the side portion of the fin-shaped semiconductor region increases with respect to the width in the gate width direction of the extension region and the source-drain region of a fin-shaped FET, for example.

In the method for producing a semiconductor device of the present invention, the step (c) may include forming a first first-conductivity-type impurity region in an upper portion of the first fin-shaped semiconductor region and forming a second first-conductivity-type impurity region in a side portion of the first fin-shaped semiconductor region, and the step (d) may include forming a first second-conductivity-type impurity region in an upper portion of the second fin-shaped semiconductor region and forming a second second-conductivity-type impurity region in a side portion of the second fin-shaped semiconductor region. In this case, in the step (c), an implantation dose of the second first-conductivity-type impurity region may be 80% or more of that of the first first-conductivity-type impurity region, and in the step (d), an implantation dose of the second second-conductivity-type impurity region may be 80% or more of that of the first second-conductivity-type impurity region.

The method for producing a semiconductor device of the present invention may further include the step of: forming, before the step (c), a first gate insulating film so as to cover at least a side surface and an upper corner of a predetermined portion of the first fin-shaped semiconductor region, wherein after the step (c), a radius of curvature r1' of the upper corner of the first fin-shaped semiconductor region located outside the first gate insulating film is greater than a radius of curvature r1 of the upper corner of the first fin-shaped semiconductor region located under the first gate insulating film. In this case, after the step (c), r1' may be less than or equal to 2×r1.

The method for producing a semiconductor device of the present invention may further includes forming, before the step (d), a second gate insulating film so as to cover at least a side surface and an upper corner of a predetermined portion of the second fin-shaped semiconductor region, wherein after the step (d), a radius of curvature r2' of the upper corner of the second fin-shaped semiconductor region located outside the second gate insulating film is greater than a radius of curvature r2 of the upper corner of the second fin-shaped semiconductor region located under the second gate insulating film. In this case, wherein after the step (d), r2' is less than or equal to 2×r2.

In the method for producing a semiconductor device of the present invention, a mass of the second-conductivity-type impurity may be greater than that of the first-conductivity-type impurity, in the step (c), an ion current density during plasma doping may be set to be less than or equal to 0.5 mA/cm$^2$, and in the step (d), the ion current density during plasma doping may be set to be less than or equal to 0.1 mA/cm$^2$.

In the method for producing a semiconductor device of the present invention, a mass of the second-conductivity-type impurity may be greater than that of the first-conductivity-type impurity, the first-conductivity-type impurity may be boron, the second-conductivity-type impurity may be arsenic or phosphorus, the step (c) may be performed by using a plasma generated from a gas containing the first-conductivity-type impurity, and the step (d) may be performed by using a plasma generated from a gas containing the second-conductivity-type impurity.

In the method for producing a semiconductor device of the present invention, the step (c) may be performed by using a plasma generated from a first gas containing the first-conductivity-type impurity, the step (d) may be performed by using a plasma generated from a second gas containing the second-conductivity-type impurity, the first gas may be a gas obtained by diluting molecules containing the first-conductivity-type impurity with helium, and the second gas may be a gas obtained by diluting molecules containing the second-conductivity-type impurity with helium.

In the method for producing a semiconductor device of the present invention, the step (c) may be performed by using a plasma generated from a first gas containing the first-conductivity-type impurity, the step (d) may be performed by using a plasma generated from a second gas containing the second-conductivity-type impurity, and one of the first gas and the second gas may be a mixed gas of $B_2H_6$ and He.

In the method for producing a semiconductor device of the present invention, the step (c) may be performed by using a plasma generated from a first gas containing the first-conductivity-type impurity, the step (d) may be performed by using a plasma generated from a second gas containing the second-conductivity-type impurity, and one of the first gas and the second gas may be a mixed gas of $AsH_3$ and He.

In the method for producing a semiconductor device of the present invention, the step (c) may be performed by using a plasma generated from a first gas containing the first-conductivity-type impurity, the step (d) may be performed by using a plasma generated from a second gas containing the second-conductivity-type impurity, and one of the first gas and the second gas may be mixed gas of $PH_3$ and He.

In the method for producing a semiconductor device of the present invention, the first-conductivity-type impurity may be a p-type impurity and the second-conductivity-type impurity is an n-type impurity, and a pressure during the step (c) is set so as to be less than or equal to 0.6 Pa and the pressure during the step (d) may be set so as to be less than or equal to 0.4 Pa.

According to the present invention, it is possible to obtain a semiconductor device including an impurity region in a side portion of a fin-shaped semiconductor region of each of a PMISFET and an NMISFET, wherein the implantation dose of the impurity region is substantially equal to or greater than that in an upper portion of the fin-shaped semiconductor region; in other words, a semiconductor device including an impurity region of a low sheet resistance in a side portion of the fin-shaped semiconductor region of each of the PMISFET and the NMISFET. Therefore, it is possible to prevent deterioration of characteristics of a three-dimensional device such as a fin-shaped CMISFET.

That is, the present invention relates to a semiconductor device and a method for producing the same. Particularly, the present invention is useful in obtaining desirable characteristics in a three-dimensional semiconductor device having a fin-shaped semiconductor region on a substrate, particularly, a fin-shaped CMISFET.

BRIEF DESCRIPTION OF THE DRAWINGS

FIGS. 1A-1E show a structure of a semiconductor device according to a first embodiment, wherein FIG. 1A is a plan view, FIG. 1B is a cross-sectional view taken along line A-A in FIG. 1A, FIG. 1C is a cross-sectional view taken along line B-B in FIG. 1A, FIG. 1D is a cross-sectional view taken along line C-C in FIG. 1A, and FIG. 1E is a cross-sectional view taken along line D-D in FIG. 1A.

FIGS. 25A-25D show a cross-sectional structure of a semiconductor device according to a second variation of the first embodiment, wherein FIG. 25A is a cross-sectional view taken along line A-A in FIG. 1A, FIG. 25B is a cross-sectional view taken along line B-B in FIG. 1A, FIG. 25C is a cross-sectional view taken along line C-C in FIG. 1A, and FIG. 25D is a cross-sectional view taken along line D-D in FIG. 1A.

FIGS. 27A-27D show a structure of a conventional fin-shaped FET, wherein FIG. 27A is a plan view, FIG. 27B is a cross-sectional view taken along line A-A in FIG. 27A, FIG. 27C is a cross-sectional view taken along line B-B in FIG. 27A, and FIG. 27D is a cross-sectional view taken along line C-C in FIG. 27A.

DETAILED DESCRIPTION OF THE INVENTION

First Embodiment

The structure of a semiconductor device according to a first embodiment will now be described with reference to the drawings.

Figure 1A:
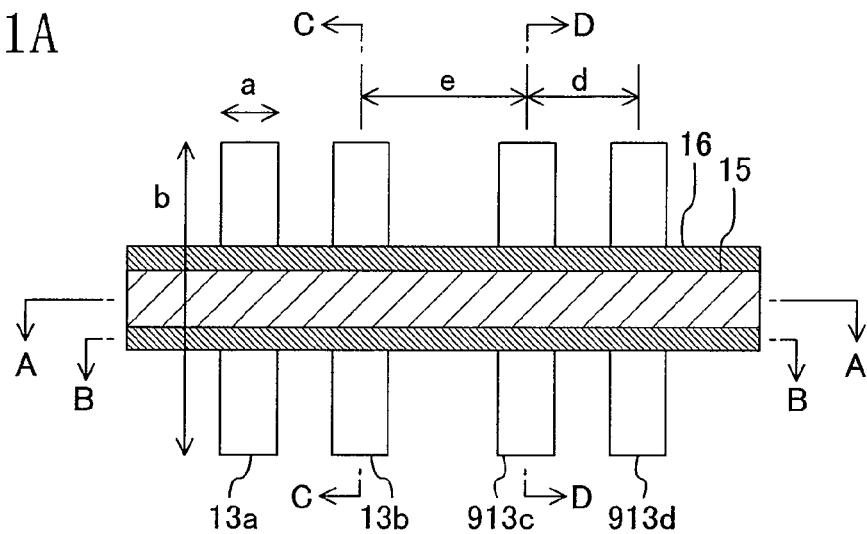
Figure 1B:
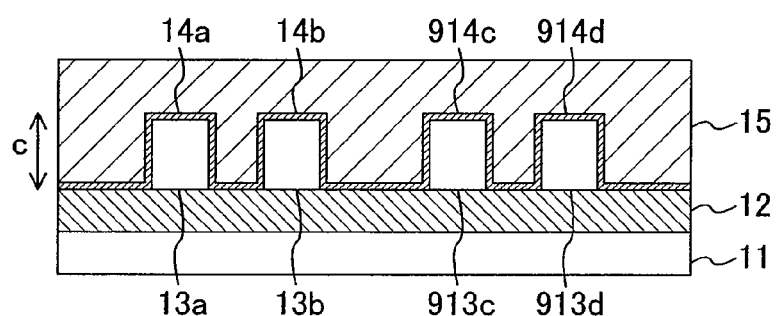
Figure 1C:
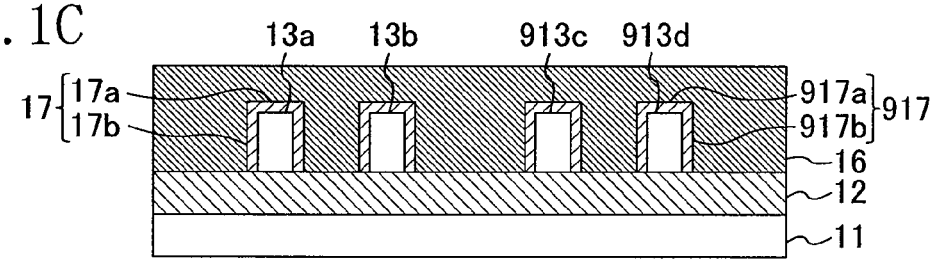
Figure 1D:
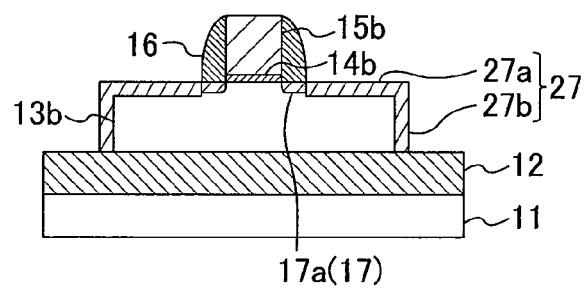
Figure 1E:
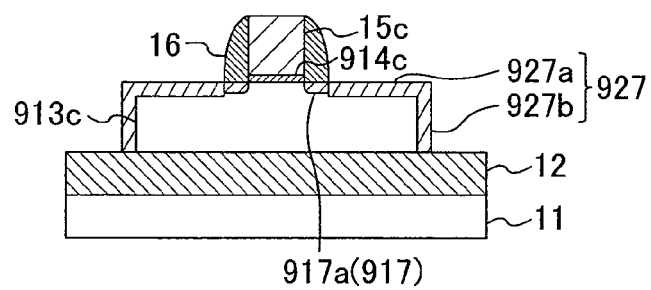

FIGS. 1A-1E show a structure of a semiconductor device according to the first embodiment, i.e., a semiconductor device including a fin-shaped CMISFET, wherein FIG. 1A is a plan view, FIG. 1B is a cross-sectional view taken along line A-A in FIG. 1A, FIG. 1C is a cross-sectional view taken along line B-B in FIG. 1A, FIG. 1D is a cross-sectional view taken along line C-C in FIG. 1A, and FIG. 1E is a cross-sectional view taken along line D-D in FIG. 1A.

As shown in FIGS. 1A-1E, the fin-shaped CMISFET of the present embodiment includes a supporting substrate 11 made of a p-type silicon substrate, for example, an insulating layer 12 made of silicon oxide, for example, and formed on the supporting substrate 11, n-type fin-shaped semiconductor regions 13a and 13b and p-type fin-shaped semiconductor regions 913c and 913d formed on the insulating layer 12, a gate electrode 15 formed on the n-type fin-shaped semiconductor regions 13a and 13b and the p-type fin-shaped semiconductor regions 913c and 913d with gate insulating films 14a, 14b, 914c and 914d, respectively, which are made of a silicon oxynitride film, for example, interposed therebetween, insulative sidewall spacers 16 formed on the side surfaces of the gate electrode 15, p-type extension regions 17 formed in opposing regions of the n-type fin-shaped semiconductor regions 13a and 13b that are opposing each other with the gate electrode 15 interposed therebetween, n-type extension regions 917 formed in opposing regions of the p-type fin-shaped semiconductor regions 913c and 913d that are opposing each other with the gate electrode 15 interposed therebetween, p-type source-drain regions 27 formed in opposing regions of the n-type fin-shaped semiconductor regions 13a and 13b that are opposing each other with the gate electrode 15 and the insulative sidewall spacers 16 interposed therebetween, and n-type source-drain regions 927 formed in opposing regions of the p-type fin-shaped semiconductor regions 913c and 913d that are opposing each other with the gate electrode 15 and the insulative sidewall spacers 16 interposed therebetween.

In the present embodiment, the n-type fin-shaped semiconductor regions 13a and 13b are formed by ion-implanting a p-type fin-shaped semiconductor region with an n-type impurity such as As.

In the present embodiment, the n-type fin-shaped semiconductor regions 13a and 13b and the p-type fin-shaped semiconductor regions 913c and 913d each have a width a in the gate width direction of about 30 nm, for example, a width b in the gate length direction of about 200 nm, for example, and a height (thickness) c of about 50 nm. On the insulating layer 12, the fin-shaped semiconductor regions of the same conductivity type are arranged with a pitch d (about 60 nm, for example) in the gate width direction, and the fin-shaped semiconductor regions of different conductivity types are arranged with a pitch e (about 200 nm, for example) in the gate width direction.

In the present embodiment, the upper surface and the side surface of the n-type fin-shaped semiconductor regions 13a and 13b and the p-type fin-shaped semiconductor regions 913c and 913d may or may not be perpendicular to each other.

In the present embodiment, the gate electrode 15 is formed so as to extend across the n-type fin-shaped semiconductor regions 13a and 13b and the p-type fin-shaped semiconductor regions 913c and 913d in the gate width direction (the gate electrode 15 extending across the n-type fin-shaped semiconductor region 13b is referred to as a gate electrode 15b, and the gate electrode 15 extending across the p-type fin-shaped semiconductor region 913c is referred to as a gate electrode 15c). The p-type extension region 17 includes a first p-type impurity region 17a formed in an upper portion of each of the n-type fin-shaped semiconductor regions 13a and 13b, and a second p-type impurity region 17b formed in a side portion of each of the n-type fin-shaped semiconductor regions 13a and 13b. The n-type extension region 917 includes a first n-type impurity region 917a formed in an upper portion of each of the p-type fin-shaped semiconductor regions 913c and 913d, and a second n-type impurity region 917b formed in a side portion of each of the p-type fin-shaped semiconductor regions 913c and 913d. The p-type source-drain region 27 includes a third p-type impurity region 27a formed in an upper portion of each of the n-type fin-shaped semiconductor regions 13a and 13b, and a fourth p-type impurity region 27b formed in a side portion of each of the n-type fin-shaped semiconductor regions 13a and 13b. The n-type source-drain 927 includes a third n-type impurity region 927a formed in an upper portion of each of the p-type fin-shaped semiconductor regions 913c and 913d, and a fourth n-type impurity region 927b formed in a side portion of each of the p-type fin-shaped semiconductor regions 913c and 913d. Note that pocket regions are not described herein or shown in the figure.

The present embodiment is characteristic in that the implantation dose of the impurity regions 17b and 917b formed in the side portion of the fin-shaped semiconductor regions 13a, 13b, 913c and 913d of the fin-shaped CMISFET is set to be 80% or more of that of the impurity regions 17a and 917a formed in the upper portion of the fin-shaped semiconductor regions 13a, 13b, 913c and 913d. Thus, the sheet resistance of the impurity regions 17b and 917b of the extension regions 17 and 917 formed in the side portion of the fin-shaped semiconductor regions can be set to be less than or equal to 1.25 times that of the impurity regions 17a and 917a of the extension regions 17 and 917 formed in the upper portion of the fin-shaped semiconductor regions, whereby it is possible to obtain desirable transistor characteristics even if the proportion of the width of the impurity regions 17b and 917b formed in the side portion of the fin-shaped semiconductor regions increases with respect to the width in the gate width direction of the extension regions 17 and 917.

Similarly, the sheet resistance of the impurity regions 27b and 927b formed in the side portion of the fin-shaped semiconductor regions 13a, 13b, 913c and 913d of the fin-shaped CMISFET can be set to be less than or equal to 1.25 times that of the impurity regions 27a and 927a formed in the upper portion of the fin-shaped semiconductor regions 13a, 13b, 913c and 913d, whereby it is possible to obtain desirable transistor characteristics even if the proportion of the width of the impurity regions 27b and 927b formed in the side portion of the fin-shaped semiconductor regions increases with respect to the width in the gate width direction of the source-drain regions 27 and 927.

In the above description, the sheet resistance of the second p-type impurity region 17b and the second n-type impurity region 917b (the fourth p-type impurity region 27b and the fourth n-type impurity region 927b) is set to be less than or equal to 1.25 times that of the first p-type impurity region 17a and the first n-type impurity region 917a (the third p-type impurity region 27a and the third n-type impurity region 927a). Herein, similar effects can be obtained when the resistivity or the spreading resistance, instead of the sheet resistance, of the second p-type impurity region 17b and the second n-type impurity region 917b (the fourth p-type impurity region 27b and the fourth n-type impurity region 927b) may be set to be less than or equal to 1.25 times that of the first p-type impurity region 17a and the first n-type impurity region 917a (the third p-type impurity region 27a and the third n-type impurity region 927a). Herein, $Rs=\rho/t$, where Rs is the sheet resistance of the object, $\rho$ is the specific resistance (resistivity), t is the thickness (the junction depth), and $\rho w$ is the spreading resistance. Since the specific resistance (resistivity) $\rho$ and the spreading resistance $\rho w$ basically have a one-to-one correspondence, there is a proportional relationship between Rs and $\rho w/t$. While "sheet resistance" is mainly used in the following description, the magnitude of the resistance can be represented by "resistivity" or "spreading resistance" instead of "sheet resistance".

In the present embodiment, the transistor characteristics can be significantly improved over the conventional techniques, if the implantation dose of the second p-type impurity region 17b and the second n-type impurity region 917b formed in the side portion of the fin-shaped semiconductor regions is about 80% (more preferably 90%) or more of that of the first p-type impurity region 17a and the first n-type impurity region 917a formed in the upper portion of the fin-shaped semiconductor regions; in other words, if the sheet resistance, the resistivity or the spreading resistance of the second p-type impurity region 17b and the second n-type impurity region 917b is less than or equal to 1.25 (more preferably 1.1) times that of the first p-type impurity region 17a and the first n-type impurity region 917a.

Similarly, the transistor characteristics can be significantly improved over the conventional techniques, if the implantation dose of the fourth p-type impurity region 27b and the fourth n-type impurity region 927b formed in the side portion of the fin-shaped semiconductor regions is about 80% (more preferably 90%) or more of that of the third p-type impurity region 27a and the third n-type impurity region 927a formed in the upper portion of the fin-shaped semiconductor regions; in other words, if the sheet resistance, the resistivity or the spreading resistance of the fourth p-type impurity region 27b and the fourth n-type impurity region 927b is less than or equal to 1.25 (more preferably 1.1) times that of the third p-type impurity region 27a and the third n-type impurity region 927a.

In the present embodiment, if "the height of the side surface of the fin-shaped semiconductor region"/"the width of the upper surface of the fin-shaped semiconductor region in the gate width direction" (hereinafter referred to as the "aspect ratio") is small, there will be little degradation in the transistor characteristics (e.g., the drain current) even if the implantation dose of the second p-type impurity region 17b and the second n-type impurity region 917b formed in the side portion of the fin-shaped semiconductor regions is somewhat smaller than that of the first p-type impurity region 17a and the first n-type impurity region 917a formed in the upper portion of the fin-shaped semiconductor regions, i.e., even if the sheet resistance, the resistivity or the spreading resistance of the second p-type impurity region 17b and the second n-type impurity region 917b is somewhat larger than that of the first p-type impurity region 17a and the first n-type impurity region 917a. On the other hand, an increase in the aspect ratio accordingly increases the necessity to make the implantation dose of the second p-type impurity region 17b and the second n-type impurity region 917b substantially equal to or greater than that of the first p-type impurity region 17a and the first n-type impurity region 917a, i.e., to make the sheet resistance, the resistivity or the spreading resistance of the second p-type impurity region 17b and the second n-type impurity region 917b substantially equal to or less than that of the first p-type impurity region 17a and the first n-type impurity region 917a.

Similarly, if the aspect ratio is small, there will be little degradation in the transistor characteristics even if the implantation dose of the fourth p-type impurity region 27b and the fourth n-type impurity region 927b formed in the side portion of the fin-shaped semiconductor regions is somewhat smaller than that of the third p-type impurity region 27a and the third n-type impurity region 927a formed in the upper portion of the fin-shaped semiconductor regions, i.e., even if the sheet resistance, the resistivity or the spreading resistance of the fourth p-type impurity region 27b and the fourth n-type impurity region 927b is somewhat larger than that of the third p-type impurity region 27a and the third n-type impurity region 927a. On the other hand, an increase in the aspect ratio accordingly increases the necessity to make the implantation dose of the fourth p-type impurity region 27b and the fourth n-type impurity region 927b substantially equal to or greater than that of the third p-type impurity region 27a and the third n-type impurity region 927a, i.e., to make the sheet resistance, the resistivity or the spreading resistance of the fourth p-type impurity region 27b and the fourth n-type impurity region 927b substantially equal to or less than that of the third p-type impurity region 27a and the third n-type impurity region 927a.

While the transistor characteristics described above, specifically the drain current characteristics, are dependent on the dose of the three surfaces (the upper surface and the opposing side surfaces) of the fin-shaped semiconductor region, the drain current can be maintained to be large in the present embodiment since the implantation dose of the second p-type impurity region 17b and the second n-type impurity region 917b (the fourth p-type impurity region 27b and the fourth n-type impurity region 927b) is relatively large even if the width of the first p-type impurity region 17a and the first n-type impurity region 917a (the third p-type impurity region 27a and the third n-type impurity region 927a) located on the upper surface is smaller than the width of the second p-type impurity region 17b and the second n-type impurity region 917b (the fourth p-type impurity region 27b and the fourth n-type impurity region 927b) located on the side surface.

A method for producing a semiconductor device according to the first embodiment will now be described with reference to the drawings.

FIGS. 2A-2J and 3A-3H are cross-sectional views showing step by step the method for producing a semiconductor device of the first embodiment. Note that FIGS. 2A, 2C, 2E, 2G, 2I, 3A, 3C, 3E and 3G correspond to the cross-sectional structure taken along line C-C in FIG. 1A. On the other hand, FIGS. 2B, 2D, 2F, 2H, 2J, 3B, 3D, 3F and 3H correspond to the cross-sectional structure taken along line D-D in FIG. 1A. In FIGS. 2A-2J and 3A-3H, like elements to those shown in FIGS. 1A-1E are denoted by like reference numerals and will not be described redundantly. Moreover, it is understood that the specific figures of thickness, width, etc., used in the following description are merely examples, and that the present invention is not limited by these specific figures.

Figure 2A:
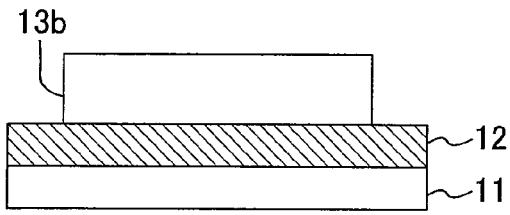
FIGS. 2A-2J are cross-sectional views showing step by step the method for producing a semiconductor device according to the first embodiment.
Figure 2B:
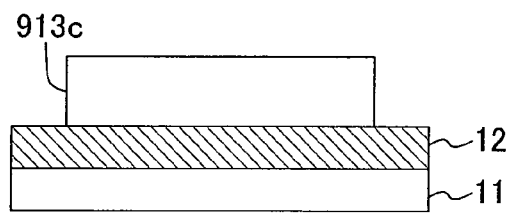

First, as shown in FIGS. 2A and 2B, there is provided an SOI substrate, in which the insulating layer 12 having a thickness of 150 nm and made of silicon oxide, for example, is provided on the supporting substrate 11 having a thickness of 800 µm and made of p-type silicon, for example, and a semiconductor layer having a thickness of 50 nm and made of p-type silicon, for example, is provided on the insulating layer 12. Then, the semiconductor layer is patterned to form the n-type fin-shaped semiconductor region 13b and the p-type fin-shaped semiconductor region 913c to be the active regions. Herein, the n-type fin-shaped semiconductor region 13b and the p-type fin-shaped semiconductor region 913c have a width a in the gate width direction of about 30 nm, for example, a width b in the gate length direction of about 200 nm, for example, and a height (thickness) c of about 50 nm, for example. Fin-shaped semiconductor regions of the same conductivity type are arranged with a pitch d (about 60 nm, for example) in the gate width direction, and fin-shaped semiconductor regions of different conductivity types are arranged with a pitch e (about 200 nm, for example) in the gate width direction.

In the present embodiment, the n-type fin-shaped semiconductor region 13b is formed by performing dry-etching, or the like, on the p-type semiconductor layer to form a p-type fin-shaped semiconductor region, and then doping the p-type fin-shaped semiconductor region with an n-type impurity such as As by ion implantation, or the like.

Figure 2C:
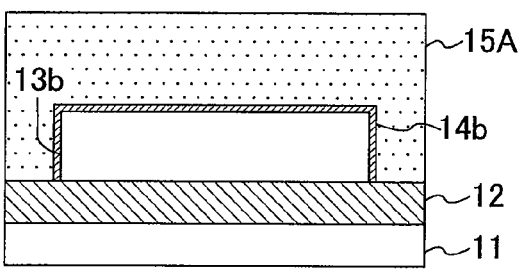
Figure 2D:
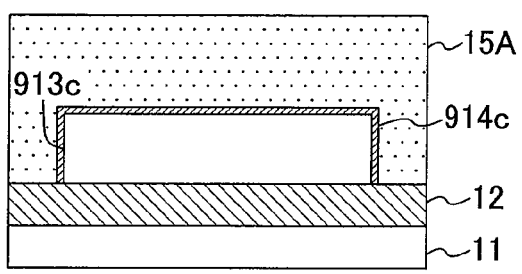

Then, as shown in FIGS. 2C and 2D, the gate insulating films 14b and 914c having a thickness of about 3 nm and made of a silicon oxynitride film, for example, is formed on the surface of each of the n-type fin-shaped semiconductor region 13b and the p-type fin-shaped semiconductor region 913c, and a polysilicon film 15A having a thickness of 60 nm, for example, is formed across the entire surface of the supporting substrate 11.

Figure 2E:
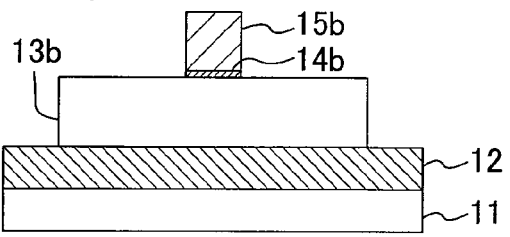
Figure 2F:
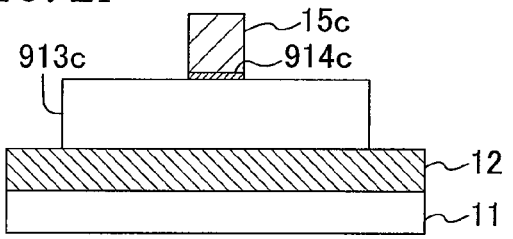

Then, as shown in FIGS. 2E and 2F, the polysilicon film 15A is etched to form the gate electrodes 15b and 15c having a width in the gate length direction of 60 nm, for example, on the n-type fin-shaped semiconductor region 13b and the p-type fin-shaped semiconductor region 913c with the gate insulating films 14b and 914c respectively interposed therebetween.

Figure 2G:
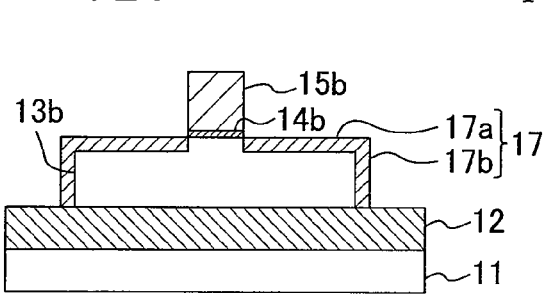
Figure 2H:
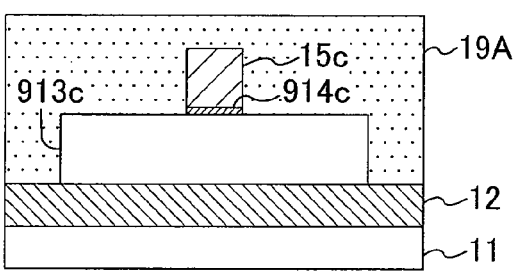

Then, as shown in FIGS. 2G and 2H, a protection film 19A (e.g., a resist, or the like) covering the fin-shaped NMISFET formation region including the area on the p-type fin-shaped semiconductor region 913c is formed, after which using the gate electrode 15b and the protection film 19A as a mask, the n-type fin-shaped semiconductor region 13b is doped with a p-type impurity under a plasma doping condition where the pressure during plasma doping is set to be less than or equal to 0.6 Pa. Thus, there is formed a p-type extension region 17 including the first p-type impurity region 17a formed in the upper portion of the n-type fin-shaped semiconductor region 13b and the second p-type impurity region 17b formed in the side portion of the n-type fin-shaped semiconductor region 13b. In this process, the formation is done so that the implantation dose of the second p-type impurity region 17b is 80% or more of that of the first p-type impurity region 17a. Thus, the second p-type impurity region 17b can be formed so that the sheet resistance, the resistivity or the spreading resistance of the second p-type impurity region 17b is less than or equal to 1.25 times that of the first p-type impurity region 17a. Herein, the plasma doping condition is such that the material gas is $B_2H_6$ (diborane) diluted with He (helium), the $B_2H_6$ concentration in the material gas is 0.5% by mass, the total flow rate of the material gas is 100 cm³/min (standard state), the chamber pressure is 0.35 Pa, the source power (the plasma-generating high-frequency power) is 500 W, the bias voltage (Vpp) is 250 V, the substrate temperature is 30° C., and the plasma doping time is 60 seconds. Then, using the gate electrode 15b and the protection film 19A as a mask, the n-type fin-shaped semiconductor region 13b is ion-implanted with an impurity to form an n-type pocket region (not shown).

Figure 2I:
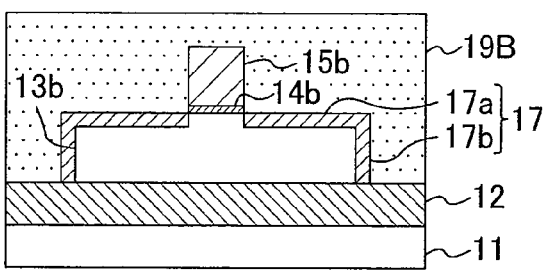
Figure 2J:
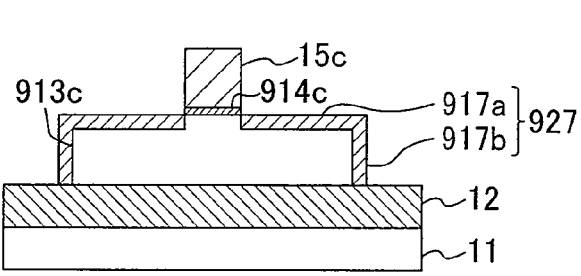

Then, as shown in FIGS. 2I and 2J, the protection film 19A is removed, and a protection film 19B (e.g., a resist, or the like) covering the fin-shaped PMISFET formation region including the area on the n-type fin-shaped semiconductor region 13b is formed, after which the p-type fin-shaped semiconductor region 913c is doped with an n-type impurity using the gate electrode 15c and the protection film 19B as a mask under a plasma doping condition where the pressure during plasma doping is set to be less than or equal to 0.4 Pa. Thus, there is formed the n-type extension region 917 including the first n-type impurity region 917a formed in the upper portion of the p-type fin-shaped semiconductor region 913c and the second n-type impurity region 917b formed in the side portion of the p-type fin-shaped semiconductor region 913c. In this process, the second n-type impurity region 917b is formed so that the implantation dose thereof is 80% or more of that of the first n-type impurity region 917a. Thus, the second n-type impurity region 917b can be formed so that the sheet resistance, the resistivity or the spreading resistance of the second n-type impurity region 917b is less than or equal to 1.25 times that of the first n-type impurity region 917a. Herein, the plasma doping condition is such that the material gas is $AsH_3$ (arsine) diluted with He (helium), the $AsH_3$ concentration in the material gas is 0.5% by mass, the total flow rate of the material gas is 100 cm³/min (standard state), the chamber pressure is 0.30 Pa, the source power (the plasma-generating high-frequency power) is 500 W, the bias voltage (Vpp) is 250 V, the substrate temperature is 30° C., and the plasma doping time is 60 seconds. Then, using the gate electrode 15c and the protection film 19B as a mask, the p-type fin-shaped semiconductor region 913c is ion-implanted with an impurity to form a p-type pocket region (not shown).

Figure 3A:
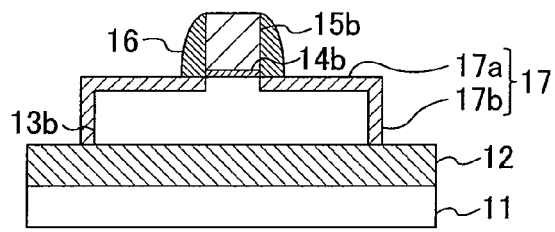
FIGS. 3A-3H are cross-sectional views showing step by step the method for producing the semiconductor device according to the first embodiment.
Figure 3B:
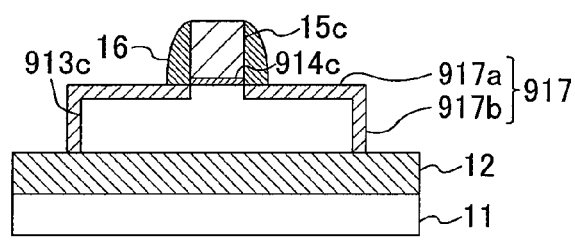

Then, after the protection film 19B is removed, an insulating film having a thickness of about 60 nm, for example, is formed across the entire surface of the supporting substrate 11, and then the insulating film is etched back by using anisotropic dry etching to thereby form the insulative sidewall spacer 16 on the side surface of each of the gate electrodes 15b and 15c, as shown in FIGS. 3A and 3B.

Figure 3C:
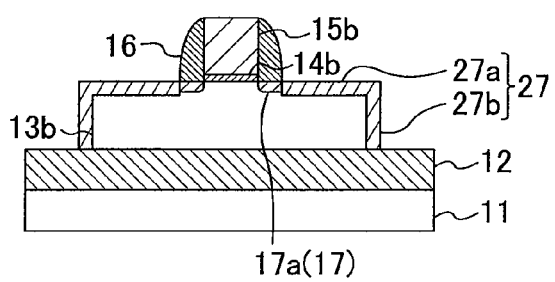
Figure 3D:
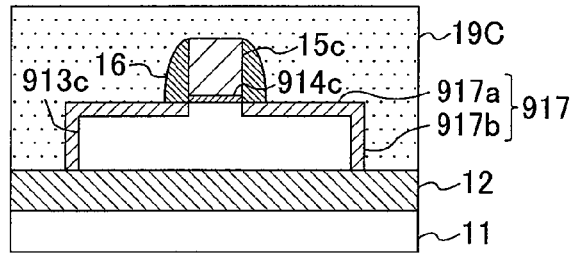

Then, as shown in FIGS. 3C and 3D, a protection film 19C (e.g., a resist, or the like) covering the fin-shaped NMISFET formation region including the area on the p-type fin-shaped semiconductor region 913c is formed, after which the n-type fin-shaped semiconductor region 13b is ion-implanted with a p-type impurity using the gate electrode 15b, the insulative sidewall spacer 16 and the protection film 19C as a mask. Thus, there is formed the p-type source-drain region 27 including the third p-type impurity region 27a formed in the upper portion of the n-type fin-shaped semiconductor region 13b and the fourth p-type impurity region 27b formed in the side portion of the n-type fin-shaped semiconductor region 13b. In this process, the gate electrode 15b is also implanted with a p-type impurity. Herein, the ion implantation conditions are, for example, such that the implantation ion is boron ion ($B^+$), the implantation energy is about 1 to 10 keV, the implantation dose is 1 to $5\times10^{15}$ cm$^{-2}$, and the tilt angle is 0°. The p-type impurity may be doped by, instead of an ion implantation process, a plasma doping process where the chamber pressure is set to be less than or equal to 0.6 Pa. Then, the implantation dose of the fourth p-type impurity region 27b formed in the side portion of the n-type fin-shaped semiconductor region 13b can be set to be 80% or more of that of the third p-type impurity region 27a formed in the upper portion of the n-type fin-shaped semiconductor region 13b. Thus, the fourth p-type impurity region 27b can be formed so that the sheet resistance, the resistivity or the spreading resistance of the fourth p-type impurity region 27b is less than or equal to 1.25 times that of the third p-type impurity region 27a.

Figure 3E:
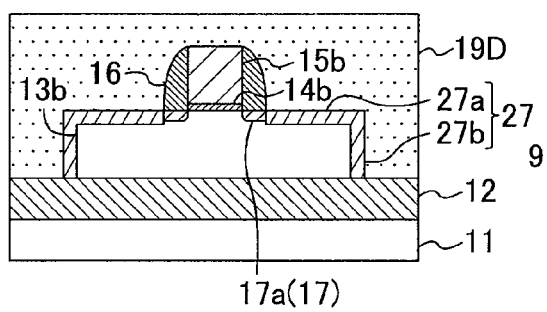
Figure 3F:
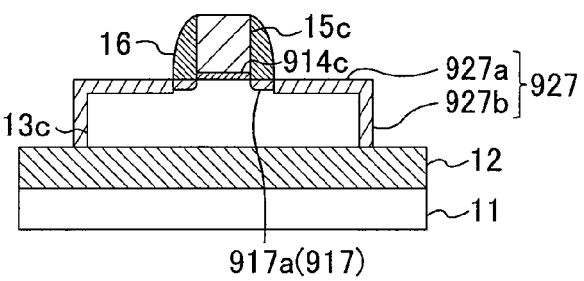

Then, as shown in FIGS. 3E and 3F, after the protection film 19C is removed, a protection film 19D (e.g., a resist, or the like) covering the fin-shaped PMISFET formation region including the area on the n-type fin-shaped semiconductor region 13b is formed, after which the p-type fin-shaped semiconductor region 913c is ion-implanted with an n-type impurity using the gate electrode 15c, the insulative sidewall spacer 16 and the protection film 19D as a mask. Thus, there is formed the n-type source-drain region 927 including the third n-type impurity region 927a formed in the upper portion of the p-type fin-shaped semiconductor region 913c and the fourth n-type impurity region 927b formed in the side portion of the p-type fin-shaped semiconductor region 913c. In this process, the gate electrode 15c is also implanted with an n-type impurity. Herein, the ion implantation conditions are, for example, such that the implantation ion is arsenic ion ($As^+$), the implantation energy is about 1 to 10 keV, the implantation dose is 1 to $5\times10^5$ cm², and the tilt angle is 0°. The n-type impurity may be doped by, instead of an ion implantation process, a plasma doping process where the chamber pressure is set to be less than or equal to 0.4 Pa. Then, the implantation dose of the fourth n-type impurity region 927b formed in the side portion of the p-type fin-shaped semiconductor region 913c can be set to be 80% or more of that of the third n-type impurity region 927a formed in the upper portion of the p-type fin-shaped semiconductor region 913c. Thus, the fourth n-type impurity region 927b can be formed so that the sheet resistance, the resistivity or the spreading resistance of the fourth n-type impurity region 927b is less than or equal to 1.25 times that of the third n-type impurity region 927a.

Figure 3G:
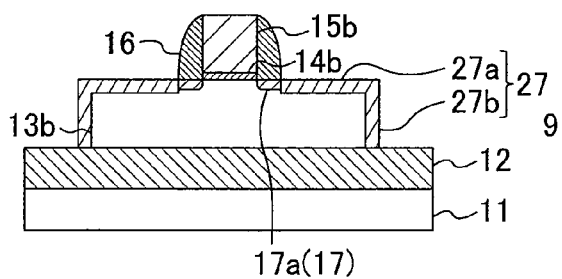
Figure 3H:
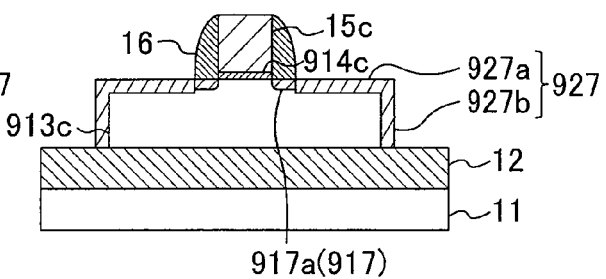

Finally, as shown in FIGS. 3G and 3H, the protection film 19D is removed, thus obtaining a fin-shaped CMISFET of the present embodiment.

The present embodiment is characteristic in the way the extension region 17 of the fin-shaped PMISFET and the extension region 917 of the fin-shaped NMISFET are formed on the same substrate 11 using a plasma doping method. Specifically, in the formation of the extension region 17 of the fin-shaped PMISFET, the pressure during the p-type impurity plasma doping is set to be 0.6 Pa or less, and in the formation of the extension region 917 of the fin-shaped NMISFET, the pressure during the n-type impurity plasma doping is set to be less than or equal to 0.4 Pa. Thus, it is possible to obtain a fin-shaped CMISFET including a fin-shaped PMISFET and a fin-shaped NMISFET on the same substrate, wherein the fin-shaped PMISFET includes the extension region 17 where the implantation dose of the impurity region 17b formed in the side portion of the n-type fin-shaped semiconductor region 13b is 80% or more of that of the impurity region 17a formed in the upper portion of the n-type fin-shaped semiconductor region 13b, and the fin-shaped NMISFET includes the extension region 917 where the implantation dose of the impurity region 917b formed in the side portion of the p-type fin-shaped semiconductor region 913c is 80% or more of that of the impurity region 917a formed in the upper portion of the p-type fin-shaped semiconductor region 913c.

Therefore, the sheet resistance, the resistivity or the spreading resistance of the impurity region 17b formed in the side portion of the n-type fin-shaped semiconductor region 13b of the fin-shaped PMISFET can be set to be less than or equal to 1.25 times that of the impurity region 17a formed in the upper portion of the n-type fin-shaped semiconductor region 13b, whereby it is possible to obtain desirable transistor characteristics even if the proportion of the width of the impurity region 17b formed in the side portion of the fin-shaped semiconductor region 13b of the fin-shaped PMISFET increases with respect to the width in the gate width direction of the extension region 17 of the fin-shaped semiconductor region 13b.

The sheet resistance, the resistivity or the spreading resistance of the impurity region 917b formed in the side portion of the p-type fin-shaped semiconductor region 913c of the fin-shaped NMISFET can be set to be less than or equal to 1.25 times that of the impurity region 917a formed in the upper portion of the p-type fin-shaped semiconductor region 913c, whereby it is possible to obtain desirable transistor characteristics even if the proportion of the width of the impurity region 917b formed in the side portion of the fin-shaped semiconductor region 913c increases with respect to the width in the gate width direction of the extension region 917 of the fin-shaped semiconductor region 913c of the fin-shaped NMISFET.

Similarly, where the source-drain region 27 of the fin-shaped PMISFET is formed by using a plasma doping method, the pressure during plasma doping can be set to be 0.6 Pa or less, whereby it is possible to obtain the fin-shaped PMISFET including the source-drain region 27 where the implantation dose of the impurity region 27b formed in the side portion of the n-type fin-shaped semiconductor region 13b is 80% or more of that of the impurity region 27a formed in the upper portion of the n-type fin-shaped semiconductor region 13b. Therefore, the sheet resistance, the resistivity or the spreading resistance of the impurity region 27b can be set to be less than or equal to 1.25 times that of the impurity region 27a, whereby it is possible to obtain desirable transistor characteristics even if the proportion of the width of the impurity region 27b formed in the side portion of the fin-shaped semiconductor region 13b of the fin-shaped PMISFET increases with respect to the width in the gate width direction of the source-drain region 27 of the fin-shaped semiconductor region 13b.

Where the source-drain region 927 of the fin-shaped NMISFET is formed by using a plasma doping method, the pressure during plasma doping can be set to be 0.4 Pa or less, whereby it is possible to obtain the fin-shaped NMISFET including the source-drain region 927 where the implantation dose of the impurity region 927b formed in the side portion of the p-type fin-shaped semiconductor region 913c is 80% or more of that of the impurity region 927a formed in the upper portion of the p-type fin-shaped semiconductor region 913c. Therefore, the sheet resistance, the resistivity or the spreading resistance of the impurity region 927b can be set to be less than or equal to 1.25 times that of the impurity region 927a, whereby it is possible to obtain desirable transistor characteristics even if the proportion of the width of the impurity region 927b formed in the side portion of the fin-shaped semiconductor region 913c of the fin-shaped NMISFET increases with respect to the width in the gate width direction of the source-drain region 927 of the fin-shaped semiconductor region 913c.

In the present embodiment, the p-type extension region 17 (the p-type impurity regions 17a and 17b) is formed by plasma doping of boron (B) which is a p-type impurity in the step shown in FIGS. 2G and 2H, and the n-type extension region 917 (the n-type impurity regions 917a and 917b) is formed by plasma doping of arsenic (As) which is an n-type impurity in the step shown in FIGS. 2I and 2J, wherein the pressure during plasma doping of boron (B) which has a relatively small mass is set to be 0.6 Pa or less and the pressure during plasma doping of arsenic (As) which has a relatively large mass is set to be 0.4 Pa or less. However, if the mass of the p-type impurity for forming the p-type extension region 17 is larger than that of the n-type impurity for forming the n-type extension region 917, the pressure during the p-type impurity plasma doping may be set to be less than or equal to that during the n-type impurity plasma doping. That is, the example plasma doping method is characteristic in that the pressure during plasma doping is set to be lower as the mass of the implanted impurity is larger.

It is understood that in the present embodiment, other parameters such as the gas concentration, the source power or the bias power may be controlled so as to realize a larger implantation dose obtained by the plasma doping in the plasma doping step shown in FIGS. 2G and 2H and in the plasma doping step shown in FIGS. 2I and 2J.

Moreover, in the present embodiment, in order to reduce the sheet resistance, the resistivity or the spreading resistance of the second p-type impurity region 17b formed in the side portion of the n-type fin-shaped semiconductor region 13b of the fin-shaped PMISFET, it is preferred that the junction depth of the second p-type impurity region 17b is set to be substantially equal to or greater than the junction depth of the first p-type impurity region 17a formed in the upper portion of the n-type fin-shaped semiconductor region 13b. Such a configuration can be realized by, for example, performing appropriate annealing after performing plasma doping so that the implantation dose of the second p-type impurity region 17b is greater than that of the first p-type impurity region 17a. Similarly, in order to reduce the sheet resistance, the resistivity or the spreading resistance of the second n-type impurity region 917b formed in the side portion of the p-type fin-shaped semiconductor region 913c of the fin-shaped NMISFET, it is preferred that the junction depth of the second n-type impurity region 917b is set to be substantially equal to or greater than the junction depth of the first n-type impurity region 917a formed in the upper portion of the p-type fin-shaped semiconductor region 913c. Such a configuration can be realized by, for example, performing appropriate annealing after performing plasma doping so that the implantation dose of the second n-type impurity region 917b is greater than that of the first n-type impurity region 917a.

While $B_2H_6$ diluted with He is used in the present embodiment as the material gas of plasma doping in the formation of the p-type extension region 17 (the p-type impurity regions 17a and 17b) by a p-type impurity plasma doping in the step shown in FIGS. 2G and 2H, the material gas is not limited to any particular gas as long as the gas contains the impurity to be implanted into the n-type fin-shaped semiconductor region 13b. Instead of $B_2H_6$, one may employ, for example, other molecules containing boron atoms (e.g., $BF_3$), or other molecules composed of boron atoms and hydrogen atoms. A gas containing an impurity may or may not be diluted with a rare gas such as He. Note that where $B_2H_6$ diluted with He is used as the material gas of plasma doping as in the present embodiment, it is preferred that the concentration by mass of $B_2H_6$ in the material gas is greater than or equal to 0.01% and less than or equal to 1%. This is preferred because it is then possible to easily introduce boron into silicon. Specifically, a sufficient amount of boron is unlikely to be introduced with the $B_2H_6$ gas concentration being less than or equal to 0.01%, and a boron-containing deposit is likely to deposit on the surface of the semiconductor substrate with the $B_2H_6$ gas concentration being greater than or equal to 1%.

While $AsH_3$ diluted with He is used in the present embodiment as the material gas of plasma doping in the formation of the n-type extension region 917 (the n-type impurity regions 917a and 917b) by an n-type impurity plasma doping in the step shown in FIGS. 2I and 2J, the material gas is not limited to any particular gas as long as the gas contains the impurity to be implanted into the p-type fin-shaped semiconductor region 913c. Instead of $AsH_3$, one may employ, for example, $PH_3$, or the like. A gas containing an impurity may or may not be diluted with a rare gas such as He. Note that where $AsH_3$ diluted with He is used as the material gas of plasma doping as in the present embodiment, it is preferred that the concentration by mass of $AsH_3$ in the material gas is greater than or equal to 0.01% and less than or equal to 1%. This is preferred because it is then possible to easily introduce arsenic into silicon. Specifically, a sufficient amount of arsenic is unlikely to be introduced with the $AsH_3$ gas concentration being less than or equal to 0.01%, and a arsenic-containing deposit is likely to deposit on the surface of the semiconductor substrate with the $AsH_3$ gas concentration being greater than or equal to 1%.

[Mechanism of Present Invention]

The mechanism of the present invention will now be described with reference to FIG. 4 with respect to a case where the p-type extension region 17 (the p-type impurity regions 17a and 17b) is formed by a p-type impurity plasma doping. Note that the following description similarly applies to the mechanism of the formation of the n-type extension region 917 (the p-type impurity regions 917a and 917b) by an n-type impurity plasma doping.

Figure 4:
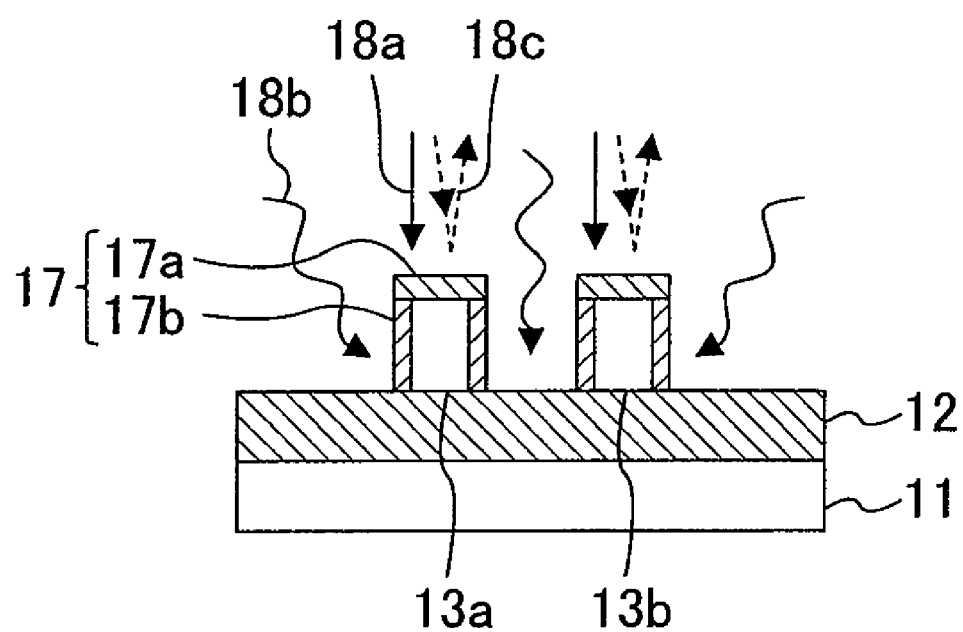
FIG. 4 is a cross-sectional view illustrating a doping method using an example plasma doping process.

First, as shown in FIG. 4, the n-type fin-shaped semiconductor regions 13a and 13b are implanted with a p-type impurity by using a plasma doping method. Thus, the first p-type impurity region 17a is formed in the upper portion of the fin-shaped semiconductor regions 13a and 13b, wherein the implantation dose of the first p-type impurity region 17a is dictated by the balance between implanted ions 18a, an adsorbed species (a neutral species such as gas molecules or radicals) 18b, and an impurity 18c that is desorbed from the fin-shaped semiconductor regions 13a and 13b by sputtering. Moreover, the second p-type impurity region 17b is formed in the side portion of the fin-shaped semiconductor regions 13a and 13b, wherein the implantation dose of the second p-type impurity region 17b is dictated primarily by the adsorbed species (a neutral species such as gas molecules or radicals) 18b. In this process, since there are ions that are incident on the side surface of the fin-shaped semiconductor regions 13a and 13b from an inclined direction, there are present the implanted ions 18a and the impurity 18c that is desorbed from the fin-shaped semiconductor regions 13a and 13b by sputtering, but nevertheless the influence thereof is very little as compared with the adsorbed species 18b and doping by the adsorbed species 18b will be dominant. That is, the number of the implanted ions 18a doped into the side portion of the fin-shaped semiconductor regions 13a and 13b and the impurity 18c desorbed from the side portion of the fin-shaped semiconductor regions 13a and 13b by sputtering is very small as compared with the number of the implanted ions 18a doped into the upper portion of the fin-shaped semiconductor regions 13a and 13b and the impurity 18c desorbed from the upper portion of the fin-shaped semiconductor regions 13a and 13b by sputtering.

As described above, the difference between the doping of the upper portion and that of the side portion of the fin-shaped semiconductor regions 13a and 13b occurs because the influence of the implanted ions 18a and the influence of the impurity 18c desorbed from the fin-shaped semiconductor regions 13a and 13b by sputtering are significant in the upper portion of the fin-shaped semiconductor regions 13a and 13b, whereas these influences are very little in the side portion of the fin-shaped semiconductor regions 13a and 13b. Herein, the amount of the impurity 18c desorbed from the fin-shaped semiconductor regions 13a and 13b by sputtering is also influenced by the amount of the implanted ions 18a and the implantation energy. That is, the fundamental difference between the doping of the upper portion and that of the side portion of the fin-shaped semiconductor regions 13a and 13b is that the amount of the implanted ions 18a incident on the fin-shaped semiconductor regions 13a and 13b is very different from that incident on the side surface of the fin-shaped semiconductor regions 13a and 13b, i.e., the difference occurs because the amount of the implanted ions 18a incident on the upper surface of the fin-shaped semiconductor regions 13a and 13b is much larger than the side surface of the fin-shaped semiconductor regions 13a and 13b.

Therefore, by making the amount of the implanted ions 18a incident on the upper surface of the fin-shaped semiconductor regions 13a and 13b very small, the fundamental difference between the doping of the upper surface and that of the side surface of the fin-shaped semiconductor regions 13a and 13b can be substantially dissolved. That is, by making the amount of the implanted ions 18a incident on the fin-shaped semiconductor regions 13a and 13b very small, the amount of the implanted ions 18a implanted into the upper portion of the fin-shaped semiconductor regions 13a and 13b is made very small while the amount of the impurity 18c desorbed from the upper portion is also made very small. Then, in the upper portion of the fin-shaped semiconductor regions 13a and 13b, the influence of the implanted ions 18a on the implantation dose relatively becomes smaller than the influence of the adsorbed species 18b on the implantation dose, whereby doping by the adsorbed species 18b becomes the primary factor that influences the implantation dose. On the other hand, in the side portion of the fin-shaped semiconductor regions 13a and 13b, doping by the adsorbed species 18b is dominant in the first place. As a result, both in the upper portion and the side portion of the fin-shaped semiconductor regions 13a and 13b, the implantation dose is substantially dictated by the amount of doping by the adsorbed species 18b. Since the amount of doping by the adsorbed species 18b is an amount that is dictated by adsorption of a neutral species (such as gas molecules or radicals) moving in random directions without being influenced by the electric field, the amount of doping is equal for the upper portion and for the side portion of the fin-shaped semiconductor regions 13a and 13b. Thus, the implantation dose of the first p-type impurity region 17a can be made equal to that of the second p-type impurity region 17b.

The example fin-shaped CMISFET where the implantation dose of the fin upper portion (the impurity regions 17a and 917a) and that of the fin side portion (the impurity regions 17b and 917b) are substantially equal to each other will now be described in greater detail by way of specific examples.

FIRST EXAMPLE

Figure 5A:
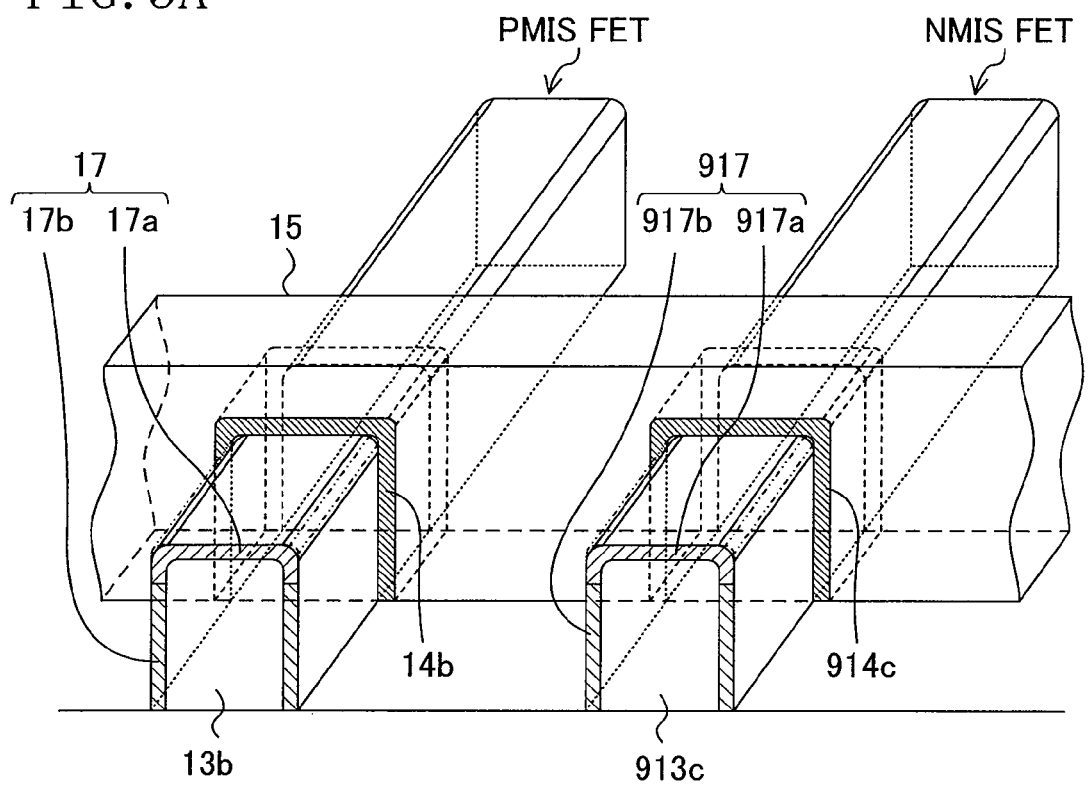
FIG. 5A is a perspective view of a fin-shaped CMISFET according to a first example.
Figure 5B:
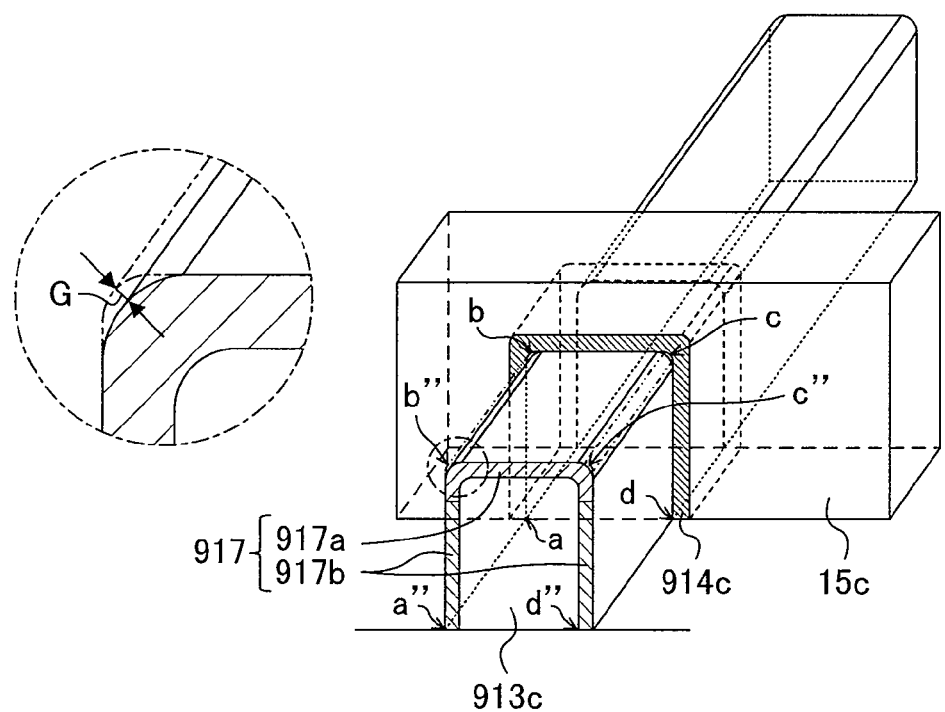
FIG. 5B is an enlarged perspective view showing an NMISFET of the fin-shaped CMISFET shown in FIG. 5A.

FIG. 5A is a perspective view of an example (first example) of a fin-shaped CMISFET, and FIG. 5B is an enlarged perspective view showing an NMISFET of the fin-shaped CMISFET shown in FIG. 5A. In FIGS. 5A and 5B, like elements to those of the fin-shaped CMISFET shown in FIGS. 1A-1E are denoted by like reference numerals and will not be described redundantly.

First, referring to FIG. 5B, the chipping of the fin corner portion (the upper corner) of a fin-shaped NMISFET will be described. This similarly applies to the chipping of the fin corner portion of a fin-shaped PMISFET. As shown in FIG. 5B, the gate electrode 15c is formed so as to extend across the p-type fin-shaped semiconductor region 913c having the n-type impurity region 917a in an upper portion thereof and the n-type impurity region 917b in a side portion thereof, with the gate insulating film 914c interposed therebetween. Herein, the height and the width of the p-type fin-shaped semiconductor region 913c (and those of the n-type fin-shaped semiconductor region 13b) are 120 nm and 160 nm, respectively. In FIG. 5B, a, b, c and d denote corners on the source side along the inner wall of the gate insulating film 914c having a pommel horse shape, and a", b", c" and d" are obtained by translating the corners a, b, c and d to the source-side end surface of the p-type fin-shaped semiconductor region 913c.

In the present example, the distance G between the corner b" and the upper-portion n-type impurity region 917a, i.e., the distance G between the corner c" and the upper-portion n-type impurity region 917a, is greater than zero and less than or equal to 10 nm. Therefore, the amount of chipping (the amount of increase in the radius of curvature) of the fin corner portion of the fin-shaped NMISFET of the fin-shaped CMISFET of the present example (and that of the fin-shaped PMISFET) after the plasma doping process is within an acceptable range.

The implantation process by plasma doping for the p-type impurity and that for the n-type impurity will now be described in greater detail.

[Suppression of Amount of Chipping of Fin Corner Portion of Fin-Shaped PMISFET]

First, the suppression of the amount of chipping of the fin corner portion of the fin-shaped PMISFET in the first example will be described with reference to FIGS. 6A and 6B.

Figure 6A:
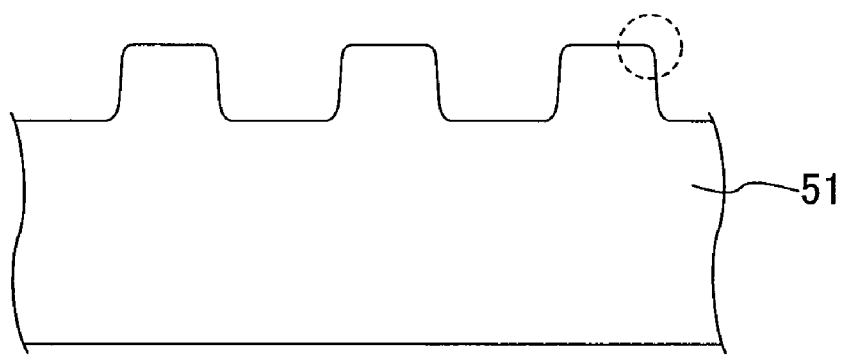
FIG. 6A schematically shows a cross-sectional shape of a fin-shaped semiconductor region before plasma doping in the fin-shaped PMISFET of the fin-shaped CMISFET according to the first example, and FIG. 6B schematically shows a cross-sectional shape of a fin-shaped semiconductor region after plasma doping in the fin-shaped PMISFET of the fin-shaped CMISFET according to the first example.

FIG. 6A schematically shows a cross-sectional shape of the fin-shaped semiconductor region (strictly, a semiconductor region 51 having fins) before a p-type impurity plasma doping. Herein, the height and the width of the fin are 120 nm and 160 nm, respectively, and the distance between fins is 210 nm. That is, the distance between the center of a fin in the width direction and that in an adjacent fin is 370 nm. Moreover, the radius of curvature of the fin corner portion (the region indicated by a broken line in the figure) is 8.7 nm. Note that the fin corner portion is in a shape with a curvature, but not a completely right-angled shape, even before the p-type impurity plasma doping because the fin corner portion is chipped off slightly in the dry etching step and the cleaning step before the p-type impurity plasma doping.

Figure 6B:
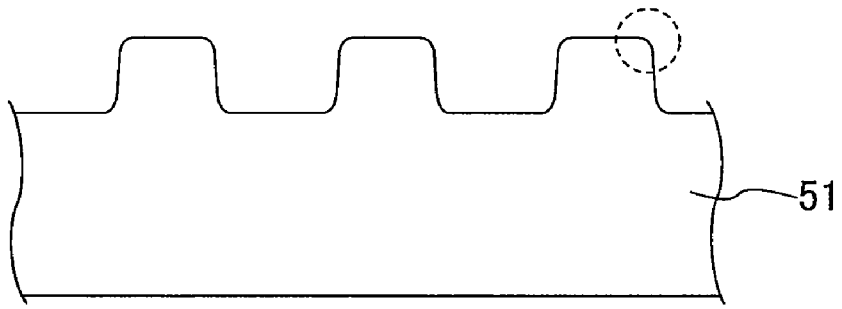

FIG. 6B schematically shows a cross-sectional shape of a fin-shaped semiconductor region (strictly, the semiconductor region 51 having fins) after a p-type impurity plasma doping. The p-type impurity plasma doping condition is such that, for example, the material gas is $B_2H_6$ diluted with He, the $B_2H_6$ concentration in the material gas is 0.5% by mass, the chamber pressure is 0.35 Pa, the source power (the plasma-generating high-frequency power) is 600 W, the bias voltage Vpp is 130 V, the substrate temperature is 20° C., and the plasma doping time is 200 seconds. An ICP method, for example, was used as a plasma generating method. Note that in the first example, in order to make the amount of implanted ions incident on the fin upper surface very small to suppress the amount of chipping of the fin corner portion, the chamber pressure is set to be 0.35 Pa, a very small value for an ICP method. The radius of curvature of the fin corner portion (the region indicated by a broken line in the figure) after the p-type impurity plasma doping is performed under such a condition is 10.6 nm. That is, in the first example, the difference between the radius of curvature of the fin corner portion before the p-type impurity plasma doping and that after the p-type impurity plasma doping is 1.9 nm, which is the amount of change over a plasma doping time of 200 seconds, and therefore it can be seen that the amount of chipping (the amount of increase in the radius of curvature) per minute is 0.6 nm, which is a very small value.

[Conformal Doping Property of Fin-Shaped PMISFET]

Figure 7C:
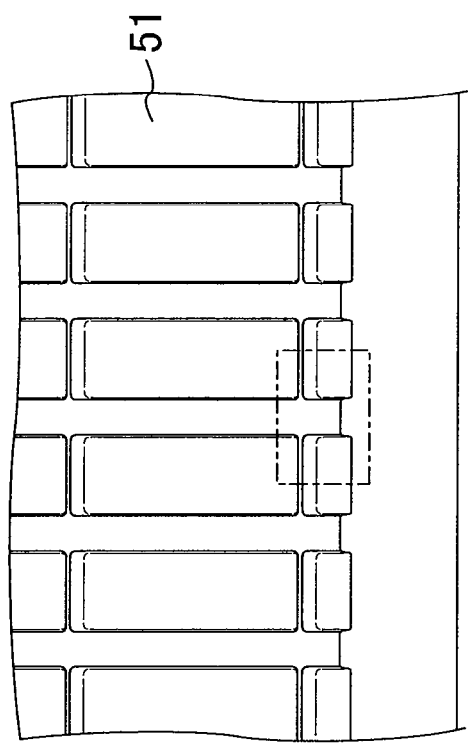
FIG. 7C is a perspective view of the fin-shaped semiconductor region shown in FIGS. 7A and 7B.
Figure 7D:
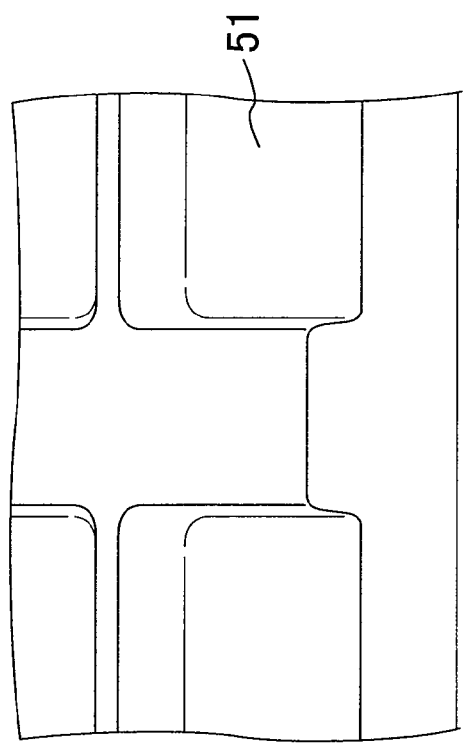
FIG. 7D is an enlarged view thereof.
Figure 7A:
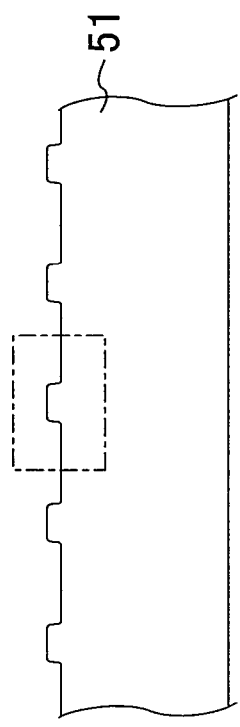
FIG. 7A is a diagram schematically showing a cross-sectional shape of a fin-shaped semiconductor region before plasma doping in the fin-shaped PMISFET of the fin-shaped CMISFET according to the first example.
Figure 7B:
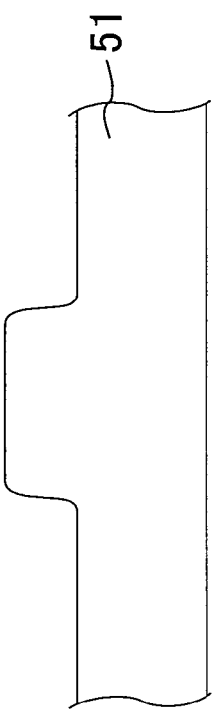
FIG. 7B is an enlarged view thereof.

Next, the sheet resistance of the first p-type impurity region (the impurity region of the fin upper portion) and that of the second p-type impurity region (the impurity region of the fin side portion) in the fin-shaped PMISFET of the first example will be described with reference to the drawings. The p-type impurity plasma doping condition is such that, for example, the material gas is $B_2H_6$ diluted with He, the $B_2H_6$ concentration in the material gas is 0.8% by mass, the chamber pressure is 0.35 Pa, the source power (the plasma-generating high-frequency power) is 500 W, the bias voltage Vpp is 250V, the substrate temperature is 20° C., and the plasma doping time is 60 seconds. An ICP method, for example, was used as a plasma generating method. Moreover, the chamber pressure is set to be 0.35 Pa, a very small value for an ICP method, in order to make the amount of implanted ions incident on the fin upper surface very small so that the amount of doping by the adsorbed species is the main factor influencing the implantation dose of the first p-type impurity region (the fin upper portion); in other words, so that the implantation dose of the first p-type impurity region (the fin upper portion) approaches that of the second p-type impurity region (the fin side portion) where the main factor is the amount of doping by the adsorbed species in the first place. The amount of chipping of the fin corner portion in this case is also very small, and about the same as that described above in Suppression Of Amount Of Chipping Of Fin Corner Portion Of Fin-Shaped PMISFET. FIG. 7A is a diagram schematically showing a cross-sectional shape of the fin-shaped semiconductor region (strictly, the semiconductor region 51 having fins) before the p-type impurity plasma doping, FIG. 7B is an enlarged view thereof, FIG. 7C is a perspective view of the fin-shaped semiconductor region shown in FIGS. 7A and 7B, and FIG. 7D is an enlarged view thereof. The height and the width of the fin-shaped semiconductor region shown in FIGS. 7A-7D are 128 nm and 342 nm, respectively, and the distance between fins is 743 n. That is, the distance between the center of a fin in the width direction and that in an adjacent fin is 1085 nm.

Figure 8A:
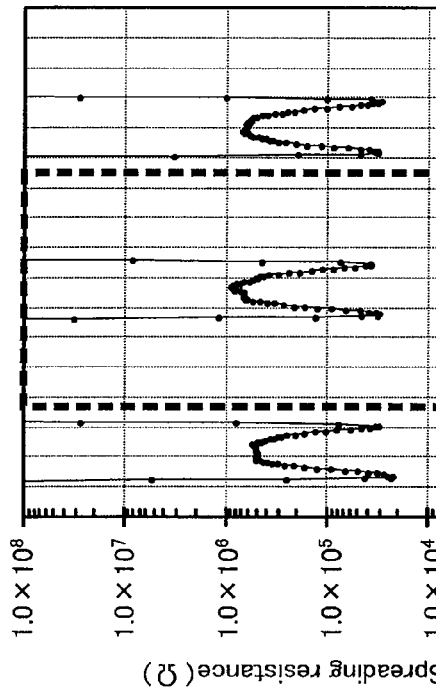
FIG. 8A schematically shows a cross-sectional structure of a fin-shaped semiconductor region after plasma doping in the fin-shaped PMISFET of the fin-shaped CMISFET according to the first example.

FIG. 8A shows how a low-resistance region 52 is formed by implanting boron into silicon of the n-type fin-shaped semiconductor region (strictly, the n-type semiconductor region 51 having fins) by plasma doping and then performing a heat treatment by a spike RTA (rapid thermal annealing) at 1050° C. to thereby electrically activate boron in silicon. As shown in FIG. 8A, the low-resistance region 52 is formed not only in the first p-type impurity region (fin upper portion) but also in the second p-type impurity region (the fin side portion).

Figure 8B:
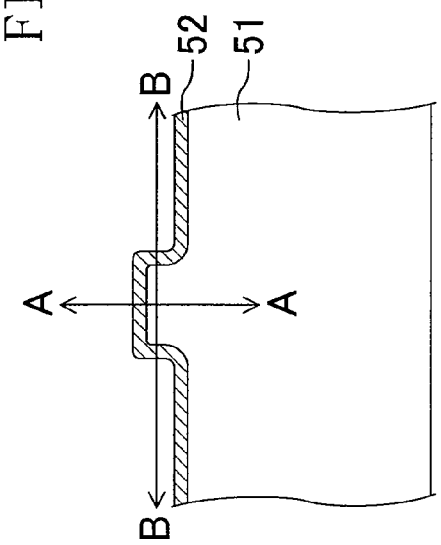
FIG. 8B shows the transition of the spreading resistance along line A-A in FIG. 8A.

FIG. 8B shows the transition of the spreading resistance as measured by using SSRM (2D Scanning Spreading Resistance Microscopy) along line A-A in FIG. 8A. In FIG. 8B, the zero point along the horizontal axis means the fin upper surface. As shown in FIG. 8B, the spreading resistance of the first p-type impurity region (fin upper portion) is $2.9\times10^4\Omega$. Moreover, as the depth along the horizontal axis increases (i.e., more into the fin), the distance from the first p-type impurity region of the low-resistance region 52 of the fin upper portion) increases. A region away from the fin upper surface by about 0.3 m or more is a region into which boron has not been implanted or has not substantially diffused by heat treatment, and a spreading resistance of the substrate (about $1.5\times10^6\Omega$) is observed in this region.

Figure 8C:
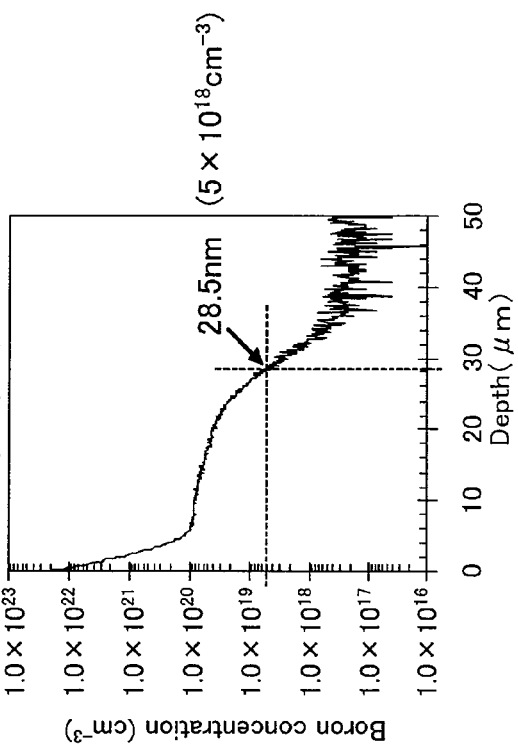
FIG. 8C shows the transition of the spreading resistance along line B-B in FIG. 8A.

Next, FIG. 8C shows the transition of the spreading resistance along line B-B in FIG. 8A. Note that FIG. 8C shows the results of an SSRM observation of a portion where three fins as shown in FIG. 8A are arranged together, and the zero point along the horizontal axis in FIG. 8C means a position at a predetermined distance from the left-side surface of the leftmost fin to the left along line B-B. The region delimited by a thick broken line in FIG. 8C represents the spreading resistance of the semiconductor region including the fin shown in FIG. 8A. Referring to the region delimited by the thick broken line, in a region where the depth along the horizontal axis is small (e.g., a region where the depth along the horizontal axis is around $1.0\,\mu m$), the spreading resistance of an insulator (not shown in FIG. 8A) provided between fins for the purpose of SSRM measurement is observed, whose value is very high. A region where the depth along the horizontal axis is around $1.35\,\mu m$ corresponds to the second p-type impurity region located in a left-side portion of the fin shown in FIG. 8A, and the spreading resistance of this portion is $3.0\times10^4\Omega$. A region where the depth along the horizontal axis is around $1.5\,\mu m$ corresponds to the central portion of the fin shown in FIG. 8A, i.e., a portion surrounded by the first p-type impurity region (the fin upper portion) and two second p-type impurity regions (opposing side portions of the fin), and this is a region into which boron has not been implanted or has not so much diffused by heat treatment, whereby a value close to the spreading resistance of the substrate is observed as the spreading resistance of this portion. A region where the depth along the horizontal axis is around $1.7\,\mu m$ corresponds to the second p-type impurity region located in a right-side portion of the fin shown in FIG. 8A, and the spreading resistance of this portion is $3.5\times10^4\Omega$. Moreover, in a region where the depth along the horizontal axis is greater than $1.7\,\mu m$ (e.g., a region where the depth along the horizontal axis is around $2.0\,\mu m$), the spreading resistance of an insulator (not shown in FIG. 8A) provided between fins for the purpose of SSRM measurement is again observed, whose value is very high. As described above, the spreading resistances of the six second impurity regions located in the opposing side portions of the three fins as represented in FIG. 8C are observed to be, from left to right, $2.1\times10^4\Omega$, $3.0\times10^4\Omega$, $3.0\times10^4\Omega$, $3.5\times10^4\Omega$, $3.0\times10^4\Omega$ and $2.9\times10^4\Omega$, and the average value of the spreading resistances of the six second p-type impurity regions is $2.9\times10^4\Omega$. This is equal to the spreading resistance of the first p-type impurity region (the fin upper portion) shown in FIG. 8B.

Figure 8D:
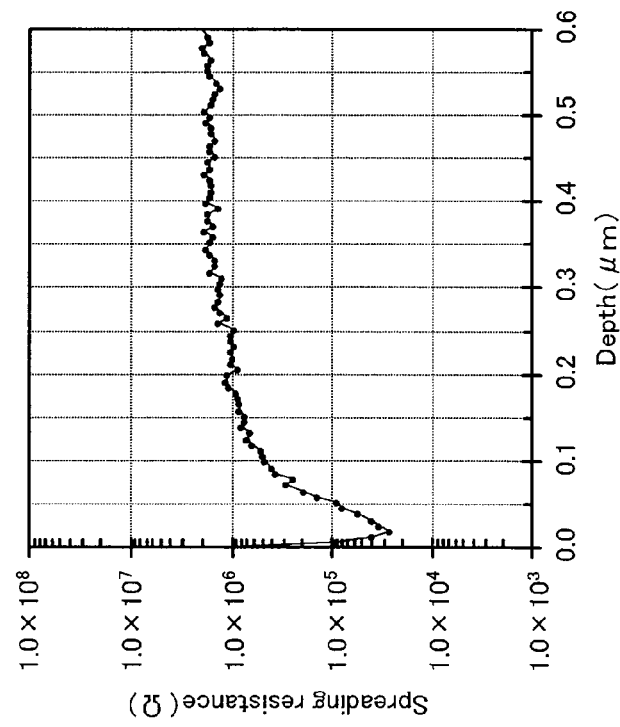
FIG. 8D shows the results of the SIMS measurement of the first impurity region (the fin upper portion) formed in the fin-shaped PMISFET of the fin-shaped CMISFET according to the first example.

In order to compare the sheet resistance of the first p-type impurity region (fin upper portion) and that of the second p-type impurity region (the fin side portion) with each other, it is necessary to identify the junction depths thereof in addition to the spreading resistances thereof. The junction depth of the first p-type impurity region (the fin upper portion) can be evaluated by performing the SIMS (secondary ion mass spectrometry) measurement on a sample produced under the same condition as that for the fin-shaped semiconductor region shown in FIG. 8A using a separate bare silicon substrate. FIG. 8D shows the results of the SIMS measurement of the first p-type impurity region (the fin upper portion). It can be seen that as shown in FIG. 8D, where the depth at which the boron concentration is $5\times10^{18}\,cm^{-3}$ is defined as the junction depth, the junction depth of the first p-type impurity region (the fin upper portion) is 28.5 nm. Moreover, the sheet resistance of the first p-type impurity region (the fin upper portion) can be evaluated by performing a four-point probe method on a sample produced under the same condition as that for the fin-shaped semiconductor region shown in FIG. 8A using a separate bare silicon substrate. Based on the results of the measurement by the four-point probe method, it was found that the sheet resistance of the first p-type impurity region (the fin upper portion) is $750\Omega/\square$. On the other hand, the junction depth of the second p-type impurity region (the side portion of the semiconductor region) can be obtained, by using the results of the SSRM observation, as being the depth of the second p-type impurity region (the fin side portion) at which the color tone of the second p-type impurity region (the fin side portion) is the same as that of the first p-type impurity region (the fin upper portion) at a depth of 28.5 nm. In such a case, although there is a measurement error by the size of a dot in the SSRM picture, the junction depth of the second p-type impurity region (the fin side portion) can be identified with a precision of 28.5 nm±10%.

Herein, $Rs=\rho/t$, where Rs is the sheet resistance of the object, $\rho$ is the specific resistance, t is the thickness (the junction depth), and $\rho w$ is the spreading resistance. The specific resistance $\rho$ and the spreading resistance $\rho w$ are in principle in a one-to-one relationship, and are substantially in one-to-one relationship also in the measurement above, whereby there is a proportional relationship between Rs and $\rho w/t$. From the experiment, the spreading resistance $\rho w$ of the first p-type impurity region (the fin upper portion) is $2.9\times10^4\Omega$, and the thickness (the junction depth) t thereof is 28.5 nm. In contrast, the spreading resistance $\rho w$ of the second p-type impurity region (the fin side portion) is $2.9\times10^4\Omega$, and the thickness (the junction depth) t thereof is 28.5 mm±10%. Thus, it can be seen that the sheet resistance of the first p-type impurity region (the fin upper portion) and that of the second p-type impurity region (the fin side portion) are in a range from 1:1.1 to 1:0.9. That is, in the first example, the sheet resistance of the first p-type impurity region (the fin upper portion) and that of the second p-type impurity region (the fin side portion) can be made equal to each other with a slight error of ±10%, which represents a conformal doping capability that cannot be achieved by the conventional techniques.

Figure 9:
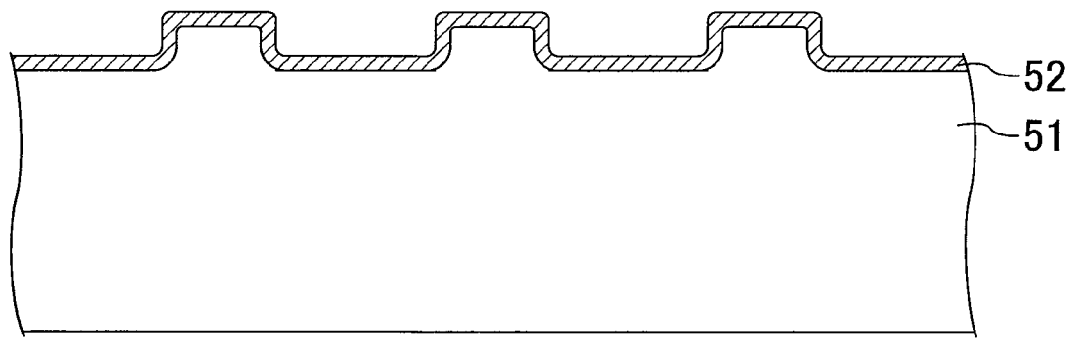
FIG. 9 schematically shows a cross-sectional structure of a fin-shaped semiconductor region after plasma doping in the fin-shaped PMISFET of the fin-shaped CMISFET according to the first example.

FIG. 9 shows how the low-resistance region 52 is formed by implanting a p-type impurity into the n-type semiconductor region 51 having fins whose aspect ratio is 0.37 and whose pitch is 1085 nm by plasma doping, and then performing a heat treatment to thereby activate the p-type impurity.

Figure 10:
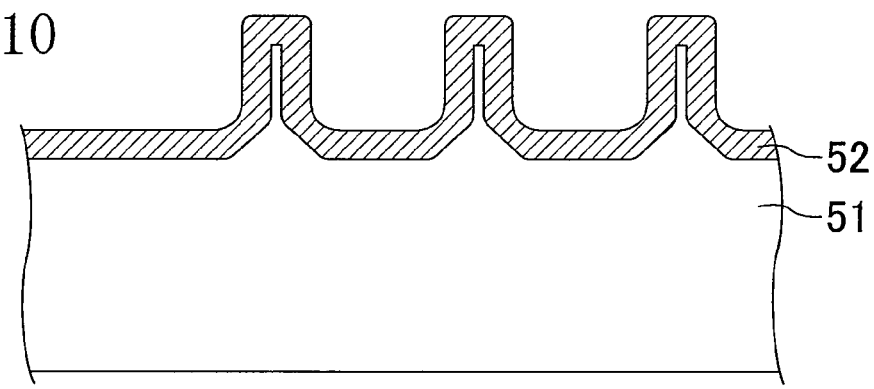
FIG. 10 schematically shows a cross-sectional structure of a fin-shaped semiconductor region after plasma doping in the fin-shaped PMISFET of the fin-shaped CMISFET according to the first example.

FIG. 10 shows how the low-resistance region 52 is formed by implanting a p-type impurity into the n-type semiconductor region 51 having fins whose aspect ratio is 1.72 and whose pitch is 196 nm by plasma doping, and then performing a heat treatment to thereby activate the p-type impurity.

Conformal doping was achieved with both p-type impurity plasma doping processes of FIGS. 9 and 10.

[Parameter Dependency of Threshold Value of Pressure During P-Type Impurity Plasma Doping]

As described above, the first example has illustrated that it is possible to control the amount of chipping of the fin corner portion of the fin-shaped PMISFET by performing a p-type impurity plasma doping while setting the pressure during the p-type impurity plasma doping to be less than or equal to 0.6 Pa, by way of an example where the material gas is $B_2H_6$ diluted with He, the $B_2H_6$ concentration in the material gas is 0.5% by mass, the chamber pressure is 0.35 Pa, and the source power (the plasma-generating high-frequency power) is 600 W, the bias voltage Vpp is 130 V, the substrate temperature is 20° C., and the plasma doping time is 200 seconds. Moreover, the first example has illustrated that it is possible to obtain a high conformal doping property by performing plasma doping while setting the pressure during the p-type impurity plasma doping to be less than or equal to 0.6 Pa by way of an example where the material gas is $B_2H_6$ diluted with He, the $B_2H_6$ concentration in the material gas is 0.8% by mass, the chamber pressure is 0.35 Pa, the source power (the plasma-generating high-frequency power) is 500 W, the bias voltage Vpp is 250 V, the substrate temperature is 20° C., and the plasma doping time is 60 seconds. Note however that the threshold value of the pressure during the p-type impurity plasma doping for obtaining a high conformal doping property while suppressing the amount of chipping of the fin corner portion of the fin-shaped PMISFET varies depending on other parameters, which will now be described.

While the first example has been described with respect to a case where the material gas is $B_2H_6$ diluted with He and the $B_2H_6$ concentration in the material gas is 0.5% by mass or 0.8% by mass, a case where the $B_2H_6$ concentration is changed will next be described. In such a case, $B_2H_6$ is diluted with a rare gas such as hydrogen or helium to 5% by mass or less, whereby the change in the $B_2H_6$ concentration has substantially no influence on the threshold value of the pressure during plasma doping. In an application where an element is implanted in order to form an extension region or a source-drain region as in the present invention, it is desirable that $B_2H_6$ is used with a high degree of dilution of about 2% by mass or less, whereby the $B_2H_6$ concentration in the material gas has little influence on the amount of chipping of the fin corner portion. It is believed that the reason is that what chips off the fin corner portion is ions in a plasma, the majority of which is ions from the diluent gas, which are dominant as ions in a plasma, whereby even if the proportion (concentration) of boron in the diluent gas is changed within a range of 5% by mass or less (preferably, a range of 2% by mass or less), the proportion of boron ions in a plasma with respect to ions from the diluent gas does not substantially change. As described above, where the material gas is $B_2H_6$ diluted with He and the $B_2H_6$ concentration in the material gas is in a range of 2% by mass or less, the influence of the change in the $B_2H_6$ concentration on the amount of chipping of the fin corner portion is negligible, and the threshold value of the pressure during plasma doping remained to be 0.6 Pa. That is, the cause of the etching of the fin corner portion in plasma doping is the ions from the diluent gas (helium ions in the first example), and the threshold value of the pressure during plasma doping is not dependent on the $B_2H_6$ concentration, i.e., the boron concentration.

While the first example has been described with respect to a case where the bias voltage Vpp during the p-type impurity plasma doping is 130 V and 250 V, a case where the bias voltage Vpp is changed will next be described. With an apparatus for an application where an element is implanted in order to form an extension region or a source-drain region as in the present invention, the bias voltage Vpp is set to be less than or equal to 1000 V. In order to form an extension region, it is desirable that boron, or the like, is implanted into a region at a depth of greater than or equal to 5 nm and less than or equal to 15 nm from the semiconductor surface. Where a bias voltage Vpp of 250 V is used in the first example, the implantation depth (defined as the depth at which the boron concentration is $1\times10^{18}$ cm$^{-3}$) is 9 nm. Even if the bias voltage Vpp is increased to about 500 V in order to make the implantation depth to be 15 nm, which is the maximum value desired for the extension region, the threshold value of the pressure during the p-type impurity plasma doping remained to be about 0.6 Pa and did not substantially change. Note however that where the bias voltage Vpp is increased to about 1000 V, which is the maximum output of the apparatus, it is preferred that the threshold value of the pressure during the p-type impurity plasma doping is set to be lower than 0.6 Pa, e.g., about 0.5 Pa.

Figure 11:
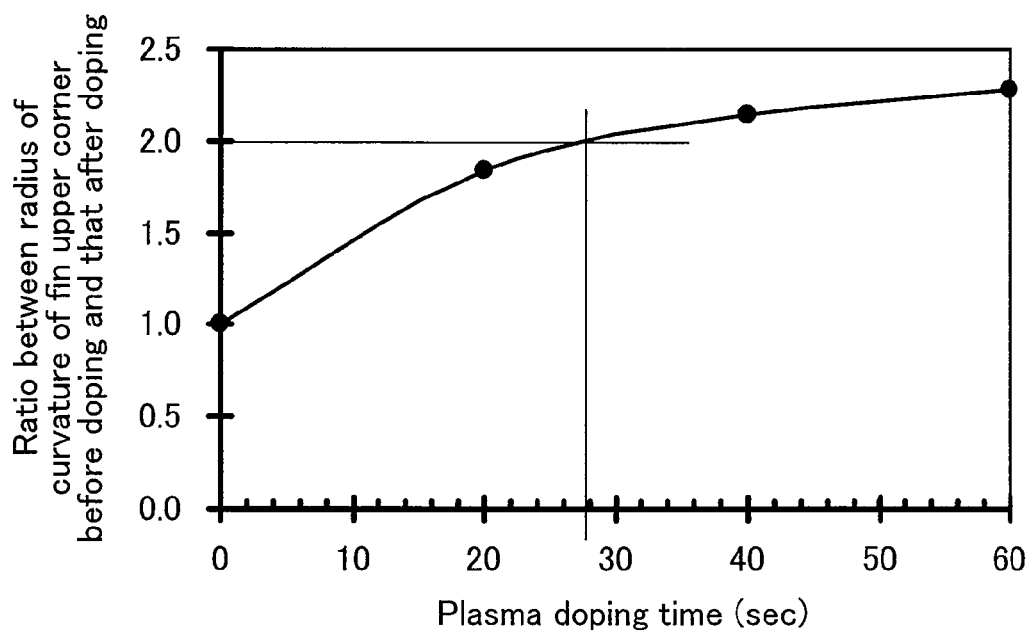
FIG. 11 shows the change in the amount of chipping of the fin corner portion over time in the fin-shaped PMISFET of the fin-shaped CMISFET according to the first example.

Moreover, while the first example has been described above with respect to a case where the p-type impurity plasma doping time is 60 seconds and 200 seconds, a case where the plasma doping time is changed will next be described. There is a tendency that the threshold value of the pressure during the p-type impurity plasma doping becomes higher than 0.6 Pa as the p-type impurity plasma doping time is decreased, whereas the threshold value of the pressure during the p-type impurity plasma doping becomes lower than 0.6 Pa as the p-type impurity plasma doping time is increased. That is, although it may seem possible to perform a p-type impurity plasma doping in a pressure range higher than 0.6 Pa by decreasing the p-type impurity plasma doping time to be shorter than 60 seconds, this is not an effective method, for the following reasons, except when the p-type impurity plasma doping time is set to be very short. When the p-type impurity plasma doping is performed for less than 60 seconds using a pressure range higher than 0.6 Pa, the amount of chipping of the fin corner portion with respect to time does not change proportionally, but the amount of chipping is greater in an initial stage of the p-type impurity plasma doping, as shown in FIG. 11. Herein, FIG. 11 shows the change in the amount of chipping of the fin corner portion over time where the p-type impurity plasma doping at a pressure of 0.9 Pa is performed for 60 seconds. Note that in FIG. 11, the amount of chipping of the fin corner portion is represented as the ratio of the radius of curvature of the fin corner portion (the upper corner) after doping with respect to that before doping. The greater the ratio is, the greater the amount of chipping is. Specifically, as shown in FIG. 11, with 28 seconds or more, the radius of curvature of the fin corner portion after plasma doping is twice or more of that before plasma doping, resulting in a large amount of chipping. Therefore, with a p-type impurity plasma doping using a long time region of 28 seconds or more, it is preferred that the pressure is set to be less than or equal to 0.6 Pa in order to suppress the amount of chipping of the fin corner portion. On the other hand, where the p-type impurity plasma doping time is less than 28 seconds, it is possible to perform plasma doping while reducing the amount of chipping of the fin corner portion even if the pressure is greater than or equal to 0.6 Pa. However, with plasma doping using such a short time region, there is a significant problem that it is difficult to ensure a dose uniformity across the substrate surface. Conversely, where the p-type impurity plasma doping time is set to be longer than 200 seconds, the productivity decreases. As described above, with the p-type impurity plasma doping using a time region from 30 seconds to 200 seconds, while there is an effect of ensuring a dose uniformity across the substrate surface without lowering the productivity, the amount of chipping of the fin corner portion will be large with a pressure range that has been used conventionally. In contrast, with the present invention, it is possible to reduce the amount of ions from the diluent gas (helium ions in the first example), which are believed to be the cause of etching, by setting the pressure during the p-type impurity plasma doping to be less than or equal to 0.6 Pa, thereby realizing a special effect that it is possible to achieve a high conformal doping property while suppressing the amount of chipping of the fin corner portion.

[Example of Conditional Acceptable Range In P-Type Impurity Plasma Doping]

In the present example, it is possible to obtain a high conformal doping property while suppressing the amount of chipping of the fin corner portion by performing a p-type impurity plasma doping under conditions where the pressure during the p-type impurity plasma doping is set to be greater than or equal to 0.6 Pa and less than or equal to 10 Pa, and the ion current density Ii (mA/cm$^2$) and the pressure during plasma doping P (Pa) satisfy Ii≦0.52 Ln(P)+0.36. Note that Ln represents a natural logarithm.

The present example used a sample similar to that of the first example as shown in FIG. 6A as an n-type fin-shaped semiconductor region (before plasma doping is performed) for examining the amount of chipping of the fin corner portion. That is, the height and the width of the fin are 120 nm and 160 nm, respectively, and the distance between fins is 210 nm. That is, the distance between the center of a fin in the width direction and that in an adjacent fin is 370 nm. Moreover, the radius of curvature of the fin corner portion (the region indicated by a broken line in the figure) is 8.7 nm.

First, the pressure and the source power during the p-type impurity plasma doping are changed to measure the electron temperature and the ion current density. Herein, the apparatus used for the measurement is a Langmuir probe manufactured by Scientific Systems (Trade name: Smart Probe). Moreover, the measurement probe is attached while being passed through 25 mm above the substrate surface so that the measurement can be done on a portion directly below. Twenty one locations within a range of a radius of 20 mm from the central position of a 300-mm substrate (specifically, 21 points with 1-mm intervals from the central position of the substrate to a position 20 mm from the central position to the side where the measurement probe is attached) are set as the measurement data detection points, with the average of the 21 measurement values being used as the measurement data.

Next, the amount of chipping of the fin corner portion is measured while changing the pressure during the p-type impurity plasma doping and the source power. The plasma doping condition is such that the bias power is 135 W (the bias voltage Vpp is 290 V), the material gas is $B_2H_6$ diluted with He, the $B_2H_6$ concentration in the material gas is 0.05% by mass, the total flow rate of the gas is 300 cc/min (standard state), and the bias application time is 60 seconds. Note that the boron implantation depth, defined as the depth at which the boron concentration is $5 \times 10^{18}$ cm$^{-3}$, is about 9 nm.

Figure 12A:
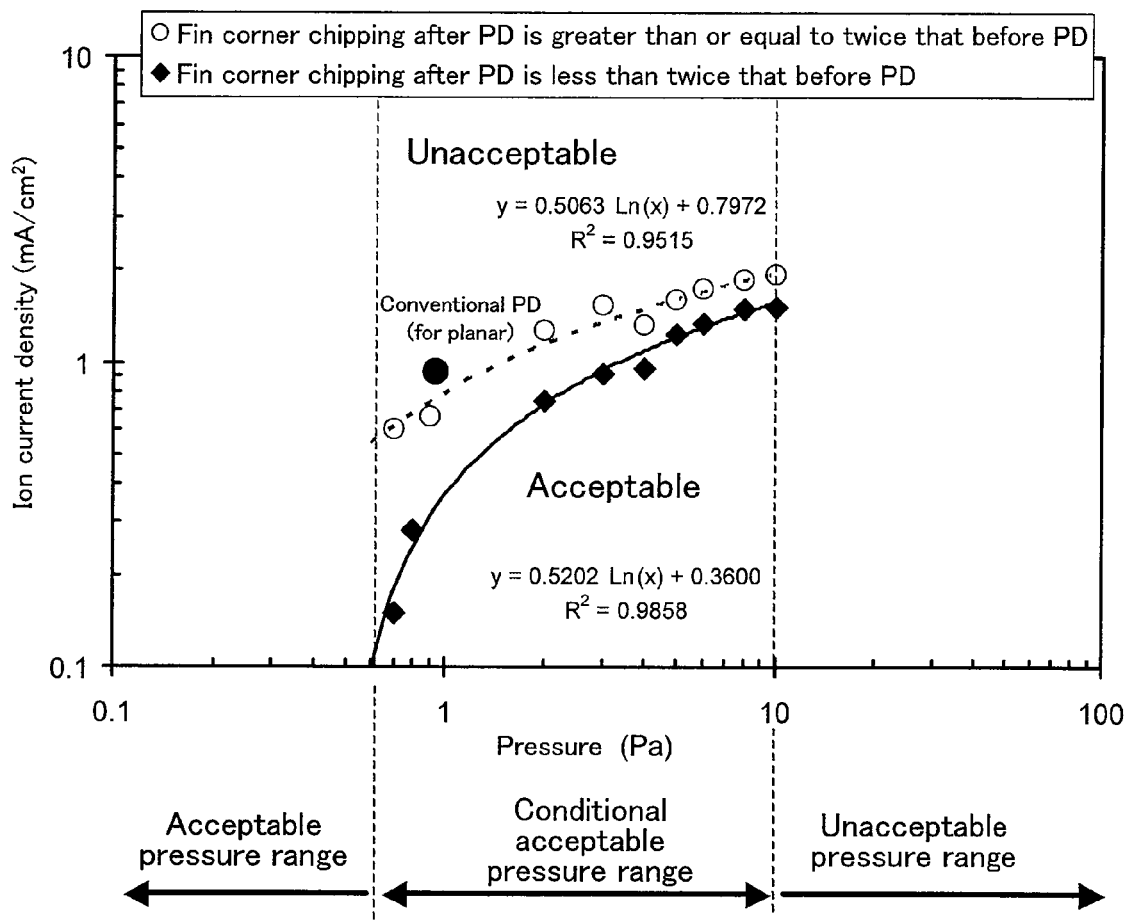
FIG. 12A shows the relationship between the pressure and the ion current density during a p-type impurity plasma doping for forming the fin-shaped PMISFET of the fin-shaped CMISFET according to the first example.
Figure 12B:
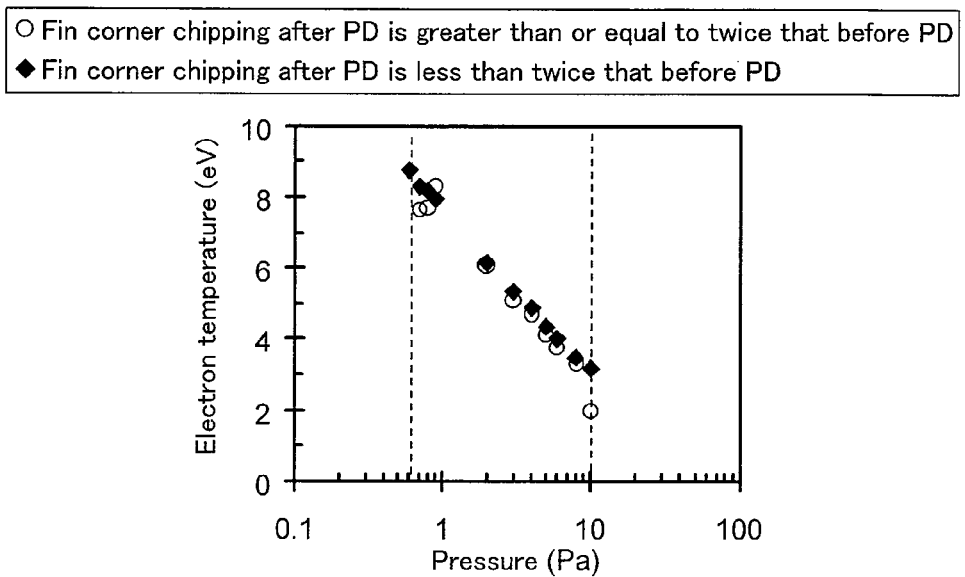
FIG. 12B shows the relationship between the pressure and the electron temperature during a p-type impurity plasma doping for forming the fin-shaped PMISFET of the fin-shaped CMISFET according to the first example.

FIGS. 12A and 12B represent various characteristics obtained from the measurement data described above. Specifically, FIG. 12A shows the range of ion current density where the radius of curvature of the fin corner portion after plasma doping is less than twice that before plasma doping and that where the radius of curvature of the fin corner portion after plasma doping is greater than or equal to twice that before plasma doping, in the range of pressure during the p-type impurity plasma doping from 0.6 Pa to 10 Pa. Where the pressure is in the range from 0.6 Pa to 10 Pa, the range of ion current density where the radius of curvature of the fin corner portion after plasma doping is reliably less than twice that before plasma doping is Ii≦0.52 Ln(P)+0.36 (Relational Expression 1: y=0.5202 Ln(x)+0.3600 in the figure). Note that $R^2$=0.9858 in the figure represents the correlation coefficient between the measurement data and the approximate curve (Relational Expression 1), and the value of $R^2$ being close to 1 indicates that the correlation between Relational Expression 1 and the corresponding measurement data is very strong. On the other hand, the range of ion current density where the radius of curvature of the fin corner portion after plasma doping is reliably greater than or equal to twice that before plasma doping is Ii≧0.51 Ln(P)+0.80 (Relational Expression 2: y=0.5063 Ln(x)+0.7972 in the figure). Note that $R^2$=0.9515 in the figure represents the correlation coefficient between the measurement data and the approximate curve (Relational Expression 2), and the value of $R^2$ being close to 1 indicates that the correlation between Relational Expression 2 and the corresponding measurement data is very strong. In the figure, the plot labeled "conventional PD (for planar)" represents the ion current density obtained where the p-type impurity plasma doping is performed with a pressure of 0.9 Pa as described above in FIG. 11. Herein, as shown in FIG. 11, when the p-type impurity plasma doping is performed for 60 seconds with a pressure of 0.9 Pa and the ion current density, the radius of curvature of the fin corner portion after plasma doping is greater than or equal to twice that before plasma doping.

Note that while the relationship between the ion current density and the pressure such that the radius of curvature of the fin corner portion after plasma doping is exactly twice that before plasma doping lies between the region represented by Relational Expression 1 and that represented by Relational Expression 2, the identification thereof requires an enormous effort. Therefore, the present example only identifies Relational Expression 1 where the radius of curvature of the fin corner portion after plasma doping is reliably less than twice that before plasma doping and Relational Expression 2 where the radius of curvature of the fin corner portion after plasma doping is reliably greater than or equal to twice that before plasma doping. FIG. 12B shows the relationship between the pressure and the electron temperature where the equations of Relational Expression 1 and Relational Expression 2 hold in the range of pressure during the p-type impurity plasma doping from 0.6 Pa to 10 Pa. It can be seen from FIGS. 12A and 12B that even if the electron temperature is at the same level, the amount of chipping of the fin corner portion may vary due to the difference in the ion current density, more specifically, that the amount of chipping of the fin corner portion can be better suppressed as the ion current density is smaller.

Figure 31:
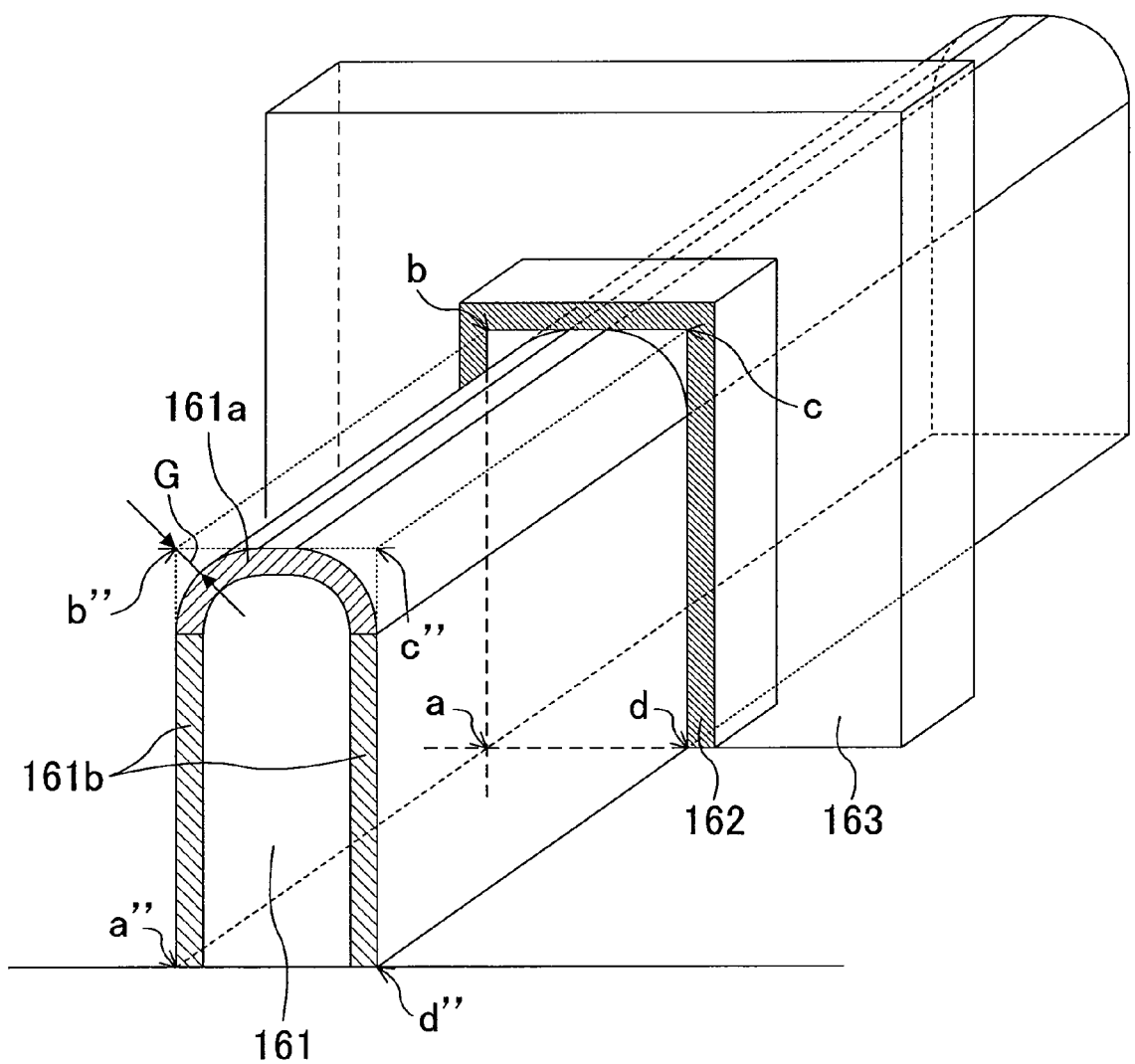
FIG. 31 is a perspective view schematically showing a structure of a conventional semiconductor device.

Note that as long as the radius of curvature after plasma doping is less than twice that before plasma doping, the influence of the radius of curvature of the fin corner portion on the performance of the semiconductor device is within an acceptable range and will not present problems. The reason is as follows. That is, of the current flowing from the source to the drain passing through a portion under the gate insulating film, it is more difficult for a current to flow through near the boundary between the first p-type impurity region (the fin upper portion) and the second p-type impurity region (the fin side portion) because the gap between the gate insulating film and the p-type impurity region increases (see FIG. 31). Therefore, as long as the radius of curvature of the fin corner portion after plasma doping is less than twice that before plasma doping, the gap between the gate insulating film and the p-type impurity region is small, whereby the influence on the performance of the semiconductor device is within an acceptable range and will not present problems. Herein, the amount of chipping of the fin corner portion does not correspond directly to the size of the gap between the gate insulating film and the p-type impurity region, but the size of the gap between the gate insulating film and the p-type impurity region, which occurs unintentionally due to the p-type impurity plasma doping, is smaller than the amount of chipping of the fin corner portion. The reason is as follows. With respect to the radius of curvature of the fin corner portion in practice, as the distance from the gate insulating film (see, for example, the distance D in FIG. 22) increases, the fin corner portion is more likely to be chipped off during plasma doping, thus increasing the radius of curvature, whereas as the distance from the gate insulating film decreases, the fin corner portion is less likely to be chipped off, thus decreasing the radius of curvature. That is, the radius of curvature of the fin corner portion changes according to the distance from the gate insulating film, and the radius of curvature of the fin corner portion tends to decrease as the distance decreases, whereby there are cases where the size of the gap between the gate insulating film and the p-type impurity region is smaller than the amount of chipping of the fin corner portion.

Conversely, if the radius of curvature of the fin corner portion after plasma doping is greater than or equal to twice that before plasma doping, the gap between the gate insulating film and the p-type impurity region becomes so large that the influence on the performance of the semiconductor device exceeds the acceptable range even if it is taken into consideration that the radius of curvature of the fin corner portion changes according to the distance from the gate insulating film.

Figure 13:
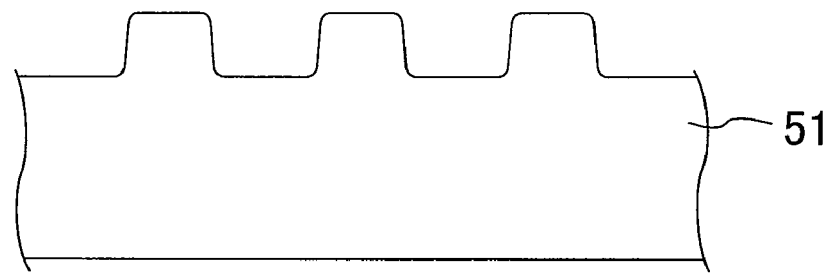
FIG. 13 schematically shows a cross-sectional structure of a fin-shaped semiconductor region after plasma doping in the fin-shaped PMISFET of the fin-shaped CMISFET according to the first example.

FIG. 13 schematically shows a cross-sectional shape of a fin-shaped semiconductor region (strictly, the semiconductor region 51 having fins) after the p-type impurity plasma doping is performed in the present example. The plasma doping condition is such that, for example, the material gas is $B_2H_6$ diluted with He, the $B_2H_6$ concentration in the material gas is 0.05% by mass, the chamber pressure is 0.9 Pa, the source power (the plasma-generating high-frequency power) is 1000 W, the bias voltage Vpp is 290 V, the substrate temperature is 20° C., and the plasma doping time is 60 seconds. An ICP method, for example, was used as a plasma generating method. Note that in the present example, in order to make the amount of implanted ions incident on the fin upper surface very small to suppress the amount of chipping of the fin corner portion, the chamber pressure is set to be as small as 0.9 Pa and the source power is set to be as small as 1000 W, thus setting the ion current density to be 0.09 mA/cm$^2$, a very small value for an ICP method. The radius of curvature of the fin corner portion after the p-type impurity plasma doping is performed under such a condition (FIG. 13) is 15.2 nm. That is, in the present example, the difference between the radius of curvature of the fin corner portion before the p-type impurity plasma doping and that after the p-type impurity plasma doping is 6.5 nm, and the amount of chipping (the amount of increase in the radius of curvature) per minute is 6.5 nm. Moreover, in the present example, the radius of curvature of the fin corner portion after plasma doping is less than twice that before plasma doping, and it can therefore be seen that the amount of chipping of the fin corner portion is acceptably small.

Note that it can be seen that if the ion current density during the p-type impurity plasma doping is less than or equal to 0.5 mA/cm$^2$ as shown in FIG. 12A, the influence of the amount of chipping of the fin corner portion on the performance of the semiconductor device is within an acceptable range and will not present problems. In view of this, it is understood that it is preferred to set the pressure during the p-type impurity plasma doping to be less than or equal to 0.6 Pa as described above in the first example.

[Suppression of Amount of Chipping of Fin Corner Portion of Fin-Shaped NMISFET]

Next, the suppression of the amount of chipping of the fin corner portion of the fin-shaped NMISFET in the first example will be described with reference to FIGS. 14A and 14B.

Figure 14A:
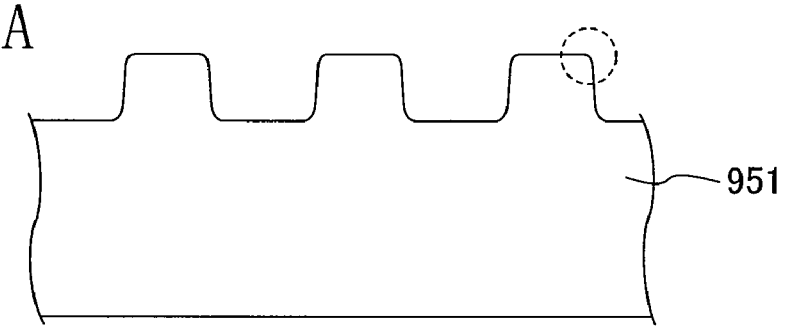
FIG. 14A schematically shows a cross-sectional shape of a fin-shaped semiconductor region before plasma doping in the fin-shaped NMISFET of the fin-shaped CMISFET according to the first example, and FIG. 14B schematically shows a cross-sectional shape of a fin-shaped semiconductor region after plasma doping in the fin-shaped NMISFET of the fin-shaped CMISFET according to the first example.

FIG. 14A schematically shows a cross-sectional shape of the fin-shaped semiconductor region (strictly, a semiconductor region 951 having fins) before an n-type impurity plasma doping. Herein, the height and the width of the fin are 120 nm and 160 nm, respectively, and the distance between fins is 210 nm. That is, the distance between the center of a fin in the width direction and that in an adjacent fin is 370 nm. Moreover, the radius of curvature of the fin corner portion (the region indicated by a broken line in the figure) is 8.7 nm. Note that the fin corner portion is in a shape with a curvature, but not a completely right-angled shape, even before the n-type impurity plasma doping because the fin corner portion is chipped off slightly in the dry etching step and the cleaning step before the n-type impurity plasma doping.

Figure 14B:
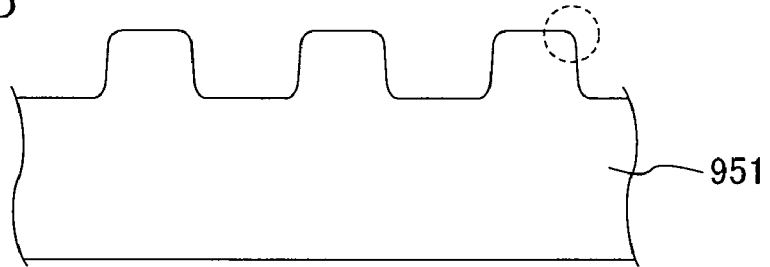

FIG. 14B schematically shows a cross-sectional shape of a fin-shaped semiconductor region (strictly, the semiconductor region 951 having fins) after an n-type impurity plasma doping. The n-type impurity plasma doping condition is such that, for example, the material gas is $AsH_3$ diluted with He, the $AsH_3$ concentration in the material gas is 0.05% by mass, the chamber pressure is 0.4 Pa, the source power (the plasma-generating high-frequency power) is 2000 W, the bias voltage Vpp is 290 V, the substrate temperature is 20° C., and the plasma doping time is 60 seconds. An ICP method, for example, was used as a plasma generating method. Herein, in order to make the amount of implanted ions incident on the fin upper surface very small to control the amount of chipping of the fin corner portion, the chamber pressure is set to be 0.4 Pa, a very small value for an ICP method. The radius of curvature of the fin corner portion (the region indicated by a broken line in the figure) after the n-type impurity plasma doping is performed under such a condition is 16.2 nm. That is, in the first example, the difference between the radius of curvature of the fin corner portion before the n-type impurity plasma doping and that after the n-type impurity plasma doping is 7.5 nm, and the radius of curvature of the fin corner portion after the n-type impurity plasma doping is less than twice that before the n-type impurity plasma doping, indicating that the amount of chipping (the amount of increase in the radius of curvature) is suppressed sufficiently.

Next, how the amount of chipping changes when the pressure during the n-type impurity plasma doping, among other conditions, is changed within a range of 0.4 Pa or less.

First, a case will be described where the n-type impurity plasma doping condition is such that, for example, the material gas is $AsH_3$ diluted with He, the $AsH_3$ concentration in the material gas is 0.5% by mass, the chamber pressure is 0.35 Pa, the source power (the plasma-generating high-frequency power) is 600 W, the bias voltage Vpp is 130 V, the substrate temperature is 20° C., and the plasma doping time is 200 seconds. An ICP method, for example, was used as a plasma generating method. Herein, in order to make the amount of implanted ions incident on the fin upper surface very small to suppress the amount of chipping of the fin corner portion, the chamber pressure is set to be 0.35 Pa, a very small value for an ICP method. The radius of curvature of the fin corner portion after the n-type impurity plasma doping is performed under such a condition is greater than 10.6 nm and less than 17.4 nm. That is, in the first example, the difference between the radius of curvature of the fin corner portion before the n-type impurity plasma doping and that after the n-type impurity plasma doping is greater than 1.9 nm and less than 8.7 nm. It can be seen that since this is the amount of change over a plasma doping time of 200 seconds, the amount of chipping (the amount of increase in the radius of curvature) per minute is greater than 0.6 nm and less than 2.6 nm, and the amount of chipping is suppressed sufficiently.

Next, another case will be described where the n-type impurity plasma doping condition is such that, for example, the material gas is AsH$_3$ diluted with He, the AsH$_3$ concentration in the material gas is 0.5% by mass, the chamber pressure is 0.30 Pa, the source power (the plasma-generating high-frequency power) is 600 W, the bias voltage Vpp is 130 V, the substrate temperature is 20° C., and the plasma doping time is 200 seconds. An ICP method, for example, was used as a plasma generating method. Herein, in order to further decrease the amount of implanted ions incident on the fin upper surface to suppress the amount of chipping of the fin corner portion to be very small, the chamber pressure is set to be 0.30 Pa, a very small value for an ICP method. The radius of curvature of the fin corner portion after the n-type impurity plasma doping is performed under such a condition is about 10.6 nm. That is, in the present example, the difference between the radius of curvature of the fin corner portion before the n-type impurity plasma doping and that after the n-type impurity plasma doping is about 1.9 nm. It can be seen that since this is the amount of change over a plasma doping time of 200 seconds, the amount of chipping (the amount of increase in the radius of curvature) per minute is about 0.6 nm, and the amount of chipping is very small. The amount of chipping is substantially equal to that in a case where the plasma doping condition is such that, for example, the material gas is B$_2$H$_6$ diluted with He, the B$_2$H$_6$ concentration in the material gas is 0.5% by mass, the chamber pressure is 0.35 Pa, the source power (the plasma-generating high-frequency power) is 600 W, the bias voltage Vpp is 130 V, the substrate temperature is 20° C., and the plasma doping time is 200 seconds (the amount of chipping (the amount of increase in the radius of curvature) per minute was about 0.6 nm also in this case). That is, by setting the pressure during the plasma doping using AsH$_3$ to be 0.30 Pa, which is less than 0.35 Pa, it is possible to realize an amount of chipping that is substantially equal to the very small amount of chipping obtained by setting the pressure during the plasma doping using B$_2$H$_6$ to be 0.35 Pa.

[Conformal Doping Property of Fin-Shaped NMISFET]

Figure 15A:
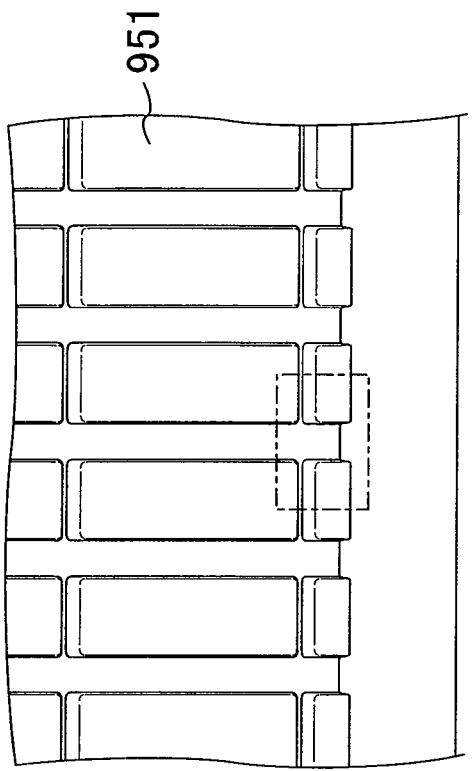
FIG. 15A is a diagram schematically showing a cross-sectional shape of a fin-shaped semiconductor region before plasma doping in the fin-shaped NMISFET of the fin-shaped CMISFET according to the first example.
Figure 15C:
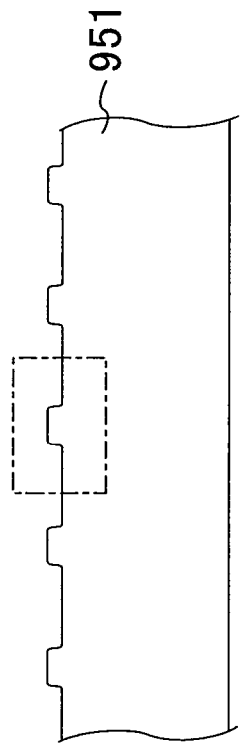
FIG. 15C is a perspective view of the fin-shaped semiconductor region shown in FIGS. 15A and 15B.
Figure 15B:
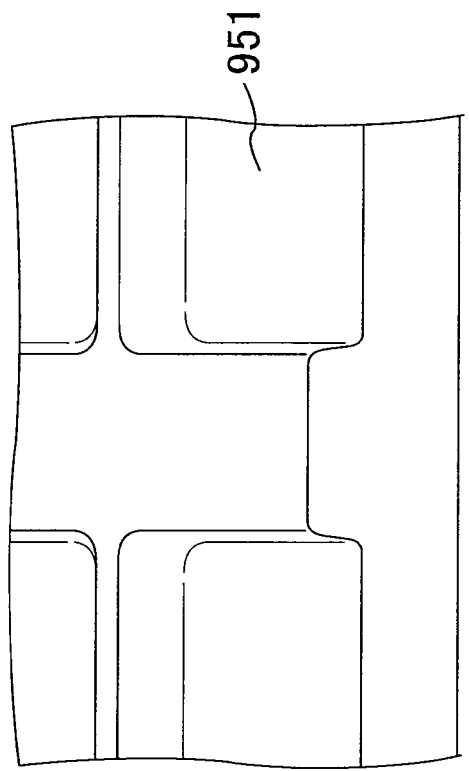
FIG. 15B is an enlarged view thereof.
Figure 15D:
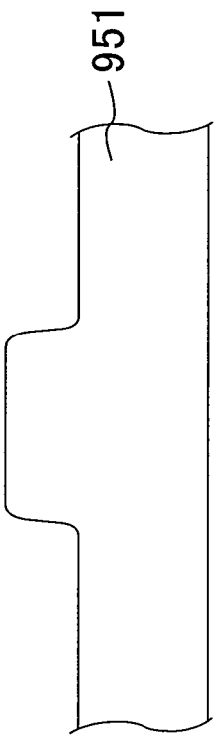
FIG. 15D is an enlarged view thereof.

Next, the sheet resistance of the first n-type impurity region (the impurity region of the fin upper portion) and that of the second n-type impurity region (the impurity region of the fin side portion) in the fin-shaped NMISFET of the first example will be described with reference to the drawings. The n-type impurity plasma doping condition is such that, for example, the material gas is AsH$_3$ diluted with He, the AsH$_3$ concentration in the material gas is 0.8% by mass, the chamber pressure is 0.30 Pa, the source power (the plasma-generating high-frequency power) is 500 W, the bias voltage Vpp is 250V, the substrate temperature is 20° C., and the plasma doping time is 60 seconds. An ICP method, for example, was used as a plasma generating method. Moreover, the chamber pressure is set to be 0.30 Pa, a very small value for an ICP method, in order to make the amount of implanted ions incident on the fin upper surface very small so that the amount of doping by the adsorbed species is the main factor influencing the implantation dose of the first n-type impurity region (the fin upper portion); in other words, so that the implantation dose of the first n-type impurity region (the fin upper portion) approaches that of the second n-type impurity region (the fin side portion) where the main factor is the amount of doping by the adsorbed species in the first place. The amount of chipping of the fin corner portion in this case is also very small, and about the same as that described above in Suppression Of Amount Of Chipping Of Fin Corner Portion Of Fin-Shaped NMISFET. FIG. 15A is a diagram schematically showing a cross-sectional shape of the fin-shaped semiconductor region (strictly, the semiconductor region 951 having fins) before the n-type impurity plasma doping, FIG. 15B is an enlarged view thereof, FIG. 15C is a perspective view of the fin-shaped semiconductor region shown in FIGS. 15A and 15B, and FIG. 15D is an enlarged view thereof. The height and the width of the fin-shaped semiconductor region shown in FIGS. 15A-15D are 128 nm and 342 nm, respectively, and the distance between fins is 743 nm. That is, the distance between the center of a fin in the width direction and that in an adjacent fin is 1085 nm.

Figure 16:
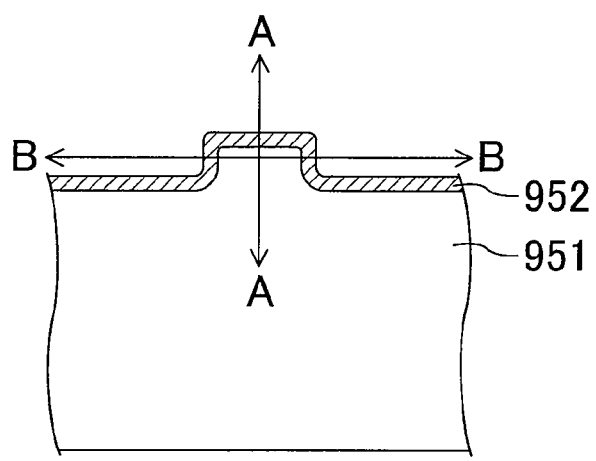
FIG. 16 schematically shows a cross-sectional structure of a fin-shaped semiconductor region after plasma doping in the fin-shaped NMISFET of the fin-shaped CMISFET according to the first example.

FIG. 16 shows how a low-resistance region 952 is formed by implanting arsenic into silicon of the p-type fin-shaped semiconductor region (strictly, the semiconductor region 951 having fins) by plasma doping and then performing a heat treatment to thereby electrically activate arsenic in silicon. As shown in FIG. 16, the low-resistance region 952 is formed not only in the first n-type impurity region (fin upper portion) but also in the second n-type impurity region (the fin side portion). Also with the fin-shaped NMISFET shown in FIG. 16, as with the fin-shaped PMISFET shown in FIG. 8A, the sheet resistance of the first n-type impurity region (the fin upper portion) and that of the second n-type impurity region (the fin side portion) can be made equal to each other with a slight error of ±10%, which represents a conformal doping capability that cannot be achieved by the conventional techniques.

Figure 17A:
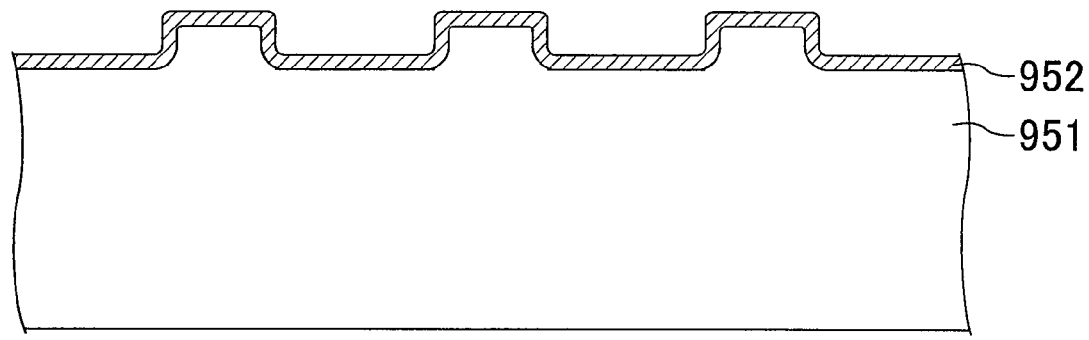
FIGS. 17A and 17B schematically show a cross-sectional structure of a fin-shaped semiconductor region after plasma doping in the fin-shaped NMISFET of the fin-shaped CMISFET according to the first example.

FIG. 17A shows how the low-resistance region 952 is formed by implanting an n-type impurity into the p-type semiconductor region 951 having fins whose aspect ratio is 0.37 and whose pitch is 1085 nm by plasma doping, and then performing a heat treatment to thereby activate the n-type impurity.

Figure 17B:
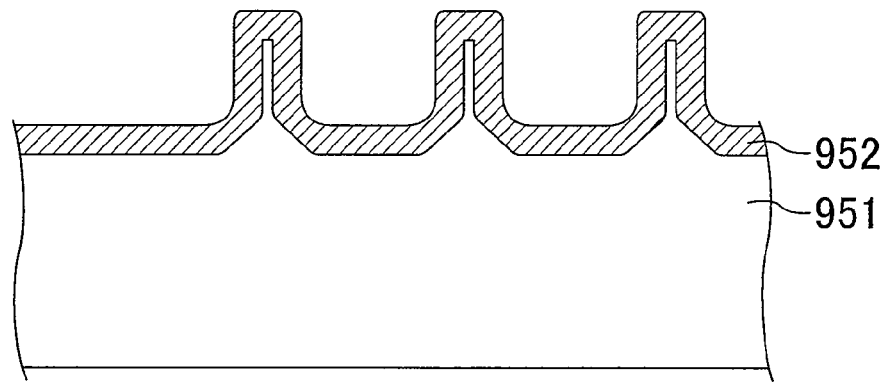

FIG. 17B shows how the low-resistance region 952 is formed by implanting an n-type impurity into the p-type semiconductor region 951 having fins whose aspect ratio is 1.72 and whose pitch is 196 nm by plasma doping, and then performing a heat treatment to thereby activate the n-type impurity.

Conformal doping was achieved with both n-type impurity plasma doping processes of FIGS. 17A and 17B.

[Parameter Dependency of Threshold Value of Pressure During N-Type Impurity Plasma Doping]

As described above, the first example has illustrated that it is possible to control the amount of chipping of the fin corner portion of the fin-shaped NMISFET by performing an n-type impurity plasma doping while setting the pressure during the n-type impurity plasma doping to be less than or equal to 0.4 Pa, by way of an example where the material gas is AsH$_3$ diluted with He, the AsH$_3$ concentration in the material gas is 0.5% by mass, the chamber pressure is 0.30 Pa, and the source power (the plasma-generating high-frequency power) is 600 W, the bias voltage Vpp is 130 V, the substrate temperature is 20° C., and the plasma doping time is 200 seconds. Moreover, the first example has illustrated that it is possible to obtain a high conformal doping property by performing plasma doping while setting the pressure during the n-type impurity plasma doping to be less than or equal to 0.4 Pa by way of an example where the material gas is AsH$_3$ diluted with He, the AsH$_3$ concentration in the material gas is 0.8% by mass, the chamber pressure is 0.30 Pa, the source power (the plasma-generating high-frequency power) is 500 W, the bias voltage Vpp is 250 V, the substrate temperature is 20° C., and the plasma doping time is 60 seconds. Note however that the threshold value of the pressure during the n-type impurity plasma doping for obtaining a high conformal doping property while suppressing the amount of chipping of the fin corner portion of the fin-shaped NMISFET (the amount of increase in the radius of curvature of the fin corner portion) varies depending on other parameters, which will now be described.

While the first example has been described with respect to a case where the material gas is $AsH_3$ diluted with He and the $AsH_3$ concentration in the material gas is 0.05% by mass, 0.5% by mass or 0.8% by mass, a case where the $AsH_3$ concentration is changed will next be described.

In plasma doping, $B_2H_6$, $PH_3$, $AsH_3$, or the like, is diluted with a rare gas such as hydrogen or helium to 5% by mass or less, depending on the impurity to be implanted, e.g., boron, phosphorus, arsenic, etc. Particularly, in an application where an element is implanted in order to form an extension region or a source-drain region as in the present invention, it is desirable that boron, phosphorus, arsenic, or the like, is implanted in a dose range from $5 \times 10^{14}$ $cm^{-2}$ to $5 \times 10^{15}$ $cm^{-2}$. On the other hand, where $B_2H_6$, $PH_3$, $AsH_3$, or the like, is used while being diluted to 2% by mass or more, there is likely to be a problem that the dose of boron, phosphorus, arsenic, or the like, will be as much as $5 \times 10^{15}$ $cm^{-2}$ or more. Therefore, it is desirable to use $B_2H_6$, $PH_3$, $AsH_3$, or the like, with a high degree of dilution of about 2% by mass or less. In such a case, ions from the diluent gas account for 98% by mass or more of the ion source in a plasma. Therefore, for example, the concentration of $B_2H_6$, $PH_3$, $AsH_3$, or the like, in the material gas diluted with a diluent gas such as hydrogen or helium can be changed within a range of 2% by mass or less.

The atomic weight of the diluent gas, e.g., helium, is 4.0, and the atomic weight of arsenic is 74.9, indicating that arsenic is an element that is about 18.7 times heavier than helium. The n-type impurity plasma doping of the first example has been described with respect to cases where the material gas is $AsH_3$ diluted with He, and the $AsH_3$ concentration in the material gas is 0.05% by mass, 0.5% by mass and 0.8% by mass. In such cases, ions from the diluent gas account for 99.95% by mass, 99.5% by mass and 99.2% by mass, respectively, of the ion source in a plasma. Herein, what chips off the fin corner portion is ions in a plasma, the majority of which is ions of the diluent gas, e.g., helium, which are dominant as ions in a plasma, and the heavier the ions chipping off the fin corner portion are, the greater the amount of chipping of the fin corner portion becomes. On the other hand, when the arsenic concentration in the material gas is increased, the proportion of arsenic ions with respect to the ion source in a plasma increases. Therefore, if the amount of arsenic, which is a heavy element, increases in the material gas, the fin corner portion is more likely to be chipped off during the n-type impurity plasma doping. Note however that when the $AsH_3$ concentration was within a range from 0.05% by mass to 0.8% by mass, no significant increase was observed for the amount of chipping of the fin corner portion due to an increase in the amount of arsenic. That is, at least when the $AsH_3$ concentration is within the above range, the chamber pressure is the primary factor that dictates the amount of chipping of the fin corner portion, and the $AsH_3$ concentration has little influence on the amount of chipping of the fin corner portion. Conversely, if the $AsH_3$ concentration substantially exceeds 0.8% by mass, e.g., if it is as high as over 2% by mass, it is preferred to set the threshold value of the pressure during the plasma doping for suppressing the amount of chipping of the fin corner portion to be lower than 0.4 Pa, e.g., about 0.3 Pa.

While the first example has been described with respect to a case where the bias voltage Vpp during the n-type impurity plasma doping is 290 V, a case where the bias voltage Vpp is changed will next be described. With an apparatus for an application where an element is implanted in order to form an extension region or a source-drain region as in the present invention, the bias voltage Vpp is set to be less than or equal to 1000V. In order to form an extension region, it is desirable that arsenic, phosphorus, or the like, is implanted into a region at a depth of greater than or equal to 5 nm and less than or equal to 15 nm from the semiconductor surface. Herein, where the bias voltage Vpp is increased to about 1000 V, which is the maximum output of the apparatus, for the adjustment of the arsenic implantation depth, it is preferred that the threshold value of the pressure during the n-type impurity plasma doping is set to be lower than 0.4 Pa, e.g., about 0.3 Pa.

Moreover, while the first example has been described above with respect to a case where the n-type impurity plasma doping time is 60 seconds, a case where the n-type impurity plasma doping time is changed will next be described. There is a tendency that the threshold value of the pressure during the n-type impurity plasma doping becomes higher than 0.4 Pa as the n-type impurity plasma doping time is decreased, whereas the threshold value of the pressure during the n-type impurity plasma doping becomes lower than 0.4 Pa as the n-type impurity plasma doping time is increased. That is, it may seem possible to perform the n-type impurity plasma doping in a pressure range higher than 0.4 Pa by decreasing the n-type impurity plasma doping time to be shorter than 60 seconds. In such a case, however, there is an increased chipping of the fin corner portion during the initial stage of the n-type impurity plasma doping, as with the p-type impurity plasma doping, whereby it is necessary to significantly shorten the n-type impurity plasma doping time. Even if the amount of chipping of the fin corner portion (the amount of increase in the radius of curvature) is reduced by significantly shortening the n-type impurity plasma doping time, it will be difficult to ensure a dose uniformity across the substrate surface when the n-type impurity plasma doping is performed for such a short period of time. Conversely, when the n-type impurity plasma doping time is too long, the productivity decreases. In contrast, with the present invention, it is possible to reduce the amount of ions, which are believed to be the cause of etching of the fin corner portion, by setting the pressure during the n-type impurity plasma doping to be less than or equal to 0.4 Pa, thereby realizing a special effect that it is possible to achieve a high conformal doping property while suppressing the amount of chipping of the fin corner portion.

[Example of Conditional Acceptable Range In N-Type Impurity Plasma Doping]

In the present example, it is possible to obtain a high conformal doping property while suppressing the amount of chipping of the fin corner portion by performing an n-type impurity plasma doping under conditions where the pressure during the n-type impurity plasma doping is set to be greater than or equal to 0.4 Pa and less than or equal to 10 Pa, and the ion current density Ii (mA/cm$^2$) and the pressure during plasma doping P (Pa) satisfy $Ii \leq 0.53 \, Ln(P) + 0.59$ in the region where $0.4 \leq P \leq 1.2$ and $Ii \leq 0.67$ in the region where $1.2 \leq P \leq 10$. Note that Ln represents a natural logarithm.

The present example used a sample similar to that of the first example as shown in FIG. 14A as a p-type fin-shaped semiconductor region (before plasma doping is performed) for examining the amount of chipping of the fin corner portion. That is, the height and the width of the fin are 120 nm and 160 nm, respectively, and the distance between fins is 210 nm. That is, the distance between the center of a fin in the width direction and that in an adjacent fin is 370 nm. Moreover, the radius of curvature of the fin corner portion (the region indicated by a broken line in the figure) is 8.7 nm.

First, the pressure and the source power during the n-type impurity plasma doping are changed to measure the electron temperature and the ion current density. Herein, the apparatus used for the measurement is a Langmuir probe manufactured by Scientific Systems (Trade name: Smart Probe). Moreover, the measurement probe is attached while being passed through 25 mm above the substrate surface so that the measurement can be done on a portion directly below. Twenty one locations within a range of a radius of 20 mm from the central position of a 300-mm substrate (specifically, 21 points with 1-mm intervals from the central position of the substrate to a position 20 mm from the central position to the side where the measurement probe is attached) are set as the measurement data detection points, with the average of the 21 measurement values being used as the measurement data.

Next, the amount of chipping of the fin corner portion is measured while changing the pressure during the n-type impurity plasma doping and the source power. The plasma doping condition is such that the bias voltage Vpp is 290 V, the material gas is $AsH_3$ diluted with He, the $AsH_3$ concentration in the material gas is 0.05% by mass, the total flow rate of the gas is 300 cc/min (standard state), and the bias application time is 60 seconds.

Figure 18A:
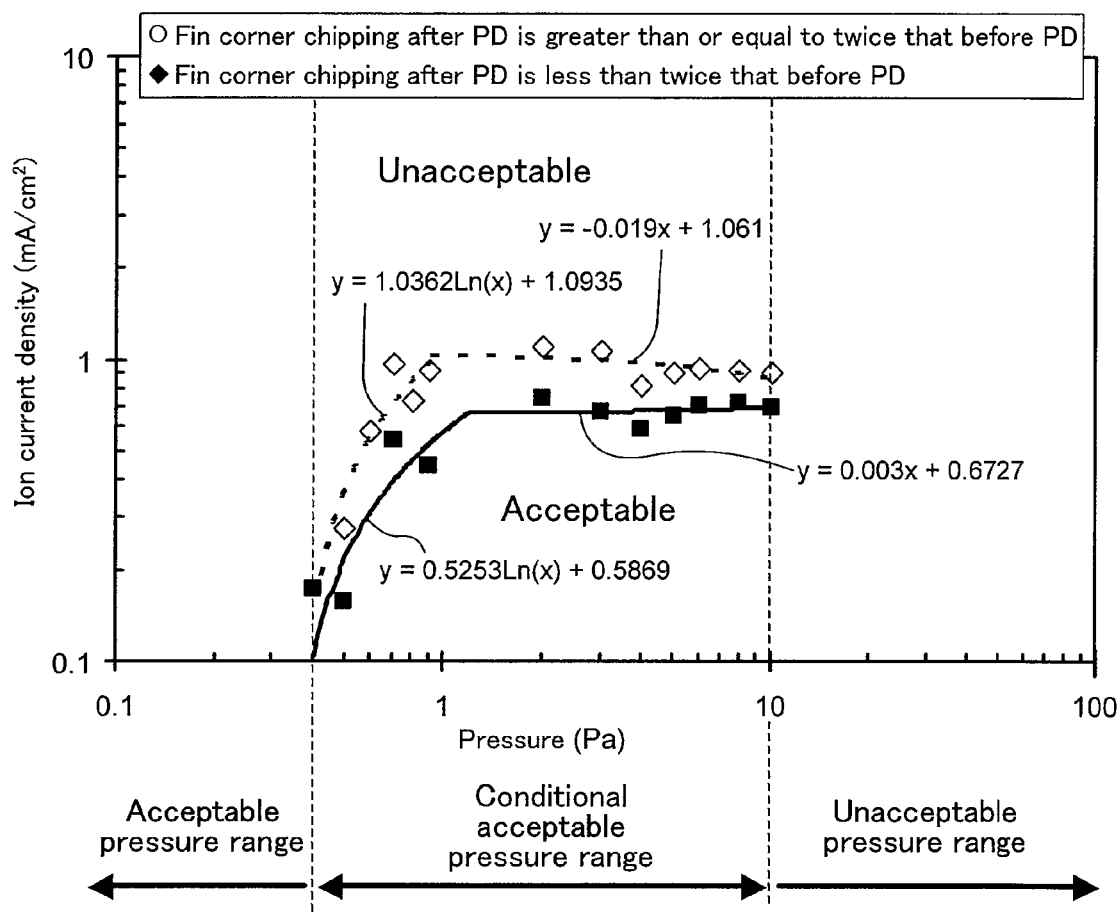
FIG. 18A shows the relationship between the pressure and the ion current density during an n-type impurity plasma doping for forming the fin-shaped NMISFET of the fin-shaped CMISFET according to the first example.
Figure 18B:
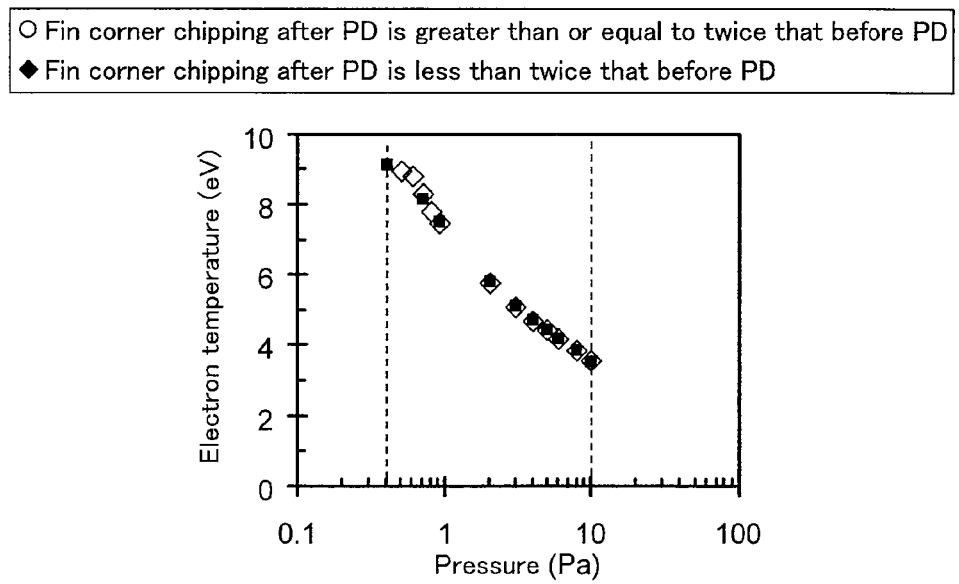
FIG. 18B shows the relationship between the pressure and the electron temperature during an n-type impurity plasma doping for forming the fin-shaped NMISFET of the fin-shaped CMISFET according to the first example.

FIGS. 18A and 18B represent various characteristics obtained from the measurement data described above. Specifically, FIG. 18A shows the range of ion current density where the radius of curvature of the fin corner portion after plasma doping is less than twice that before plasma doping and that where the radius of curvature of the fin corner portion after plasma doping is greater than or equal to twice that before plasma doping, in the range of pressure during the n-type impurity plasma doping from 0.4 Pa to 10 Pa. Where the pressure is in the range from 0.4 Pa to 10 Pa, the range of ion current density where the radius of curvature of the fin corner portion after plasma doping is reliably less than twice that before plasma doping is $Ii \leq 0.53 \ Ln(P)+0.59$ (Relational Expression 3: $y=0.5253 \ Ln(x)+0.5869$ in the figure) in the region where $0.4 \leq P \leq 1.2$, and $Ii \leq 0.67$ (Relational Expression 4: $y=0.003x+0.6727$ in the figure) in the range where $1.2 \leq P \leq 10$. On the other hand, the range of ion current density where the radius of curvature of the fin corner portion after plasma doping is reliably greater than or equal to twice that before the n-type impurity plasma doping is $Ii \geq 1.04 \ Ln(P)+1.09$ (Relational Expression 5: $y=1.0362 \ Ln(x)+1.0935$ in the figure) in the region where $0.4 \leq P \leq 0.95$, and $Ii \geq 1.04$ (Relational Expression 6: $y=1.04295$ as obtained by substituting $x=0.95$ into $y=-0.019x+1.061$ in the figure) in the region where $0.95 \leq P \leq 10$.

Note that while the relationship between the ion current density and the pressure such that the radius of curvature of the fin corner portion after plasma doping is exactly twice that before plasma doping lies between the region represented by Relational Expressions 3 and 4 and that represented by Relational Expressions 5 and 6, the identification thereof requires an enormous effort. Therefore, the present example only identifies Relational Expressions 3 and 4 where the radius of curvature of the fin corner portion after plasma doping is reliably less than twice that before plasma doping and Relational Expressions 5 and 6 where the radius of curvature of the fin corner portion after plasma doping is reliably greater than or equal to twice that before plasma doping. FIG. 18B shows the relationship between the pressure and the electron temperature where the equations of Relational Expressions 3 to 6 hold in the range of pressure during the n-type impurity plasma doping from 0.4 Pa to 10 Pa. It can be seen from FIGS. 18A and 18B that even if the electron temperature is at the same level, the amount of chipping of the fin corner portion may vary due to the difference in the ion current density, more specifically, that the amount of chipping of the fin corner portion can be better suppressed as the ion current density is smaller.

As long as the radius of curvature after plasma doping is less than twice that before plasma doping, the influence of the radius of curvature of the fin corner portion on the performance of the semiconductor device is within an acceptable range and will not present problems. The reason is as follows. That is, of the current flowing from the source to the drain passing through a portion under the gate insulating film, it is more difficult for a current to flow through near the boundary between the first n-type impurity region (the fin upper portion) and the second n-type impurity region (the fin side portion) because the gap between the gate insulating film and the n-type impurity region increases (see FIG. 31). Therefore, as long as the radius of curvature of the fin corner portion after plasma doping is less than twice that before plasma doping, the gap between the gate insulating film and the n-type impurity region is small, whereby the influence on the performance of the semiconductor device is within an acceptable range and will not present problems. Herein, the amount of chipping of the fin corner portion does not correspond directly to the size of the gap between the gate insulating film and the n-type impurity region, but the size of the gap between the gate insulating film and the n-type impurity region, which occurs unintentionally due to the n-type impurity plasma doping, is slightly smaller than the amount of chipping of the fin corner portion. The reason is as described above in Example Of Conditional Acceptable Range In P-Type Impurity Plasma Doping.

Conversely, if the radius of curvature of the fin corner portion after plasma doping is greater than or equal to twice that before plasma doping, the gap between the gate insulating film and the n-type impurity region becomes so large that the influence on the performance of the semiconductor device exceeds the acceptable range.

Figure 19:
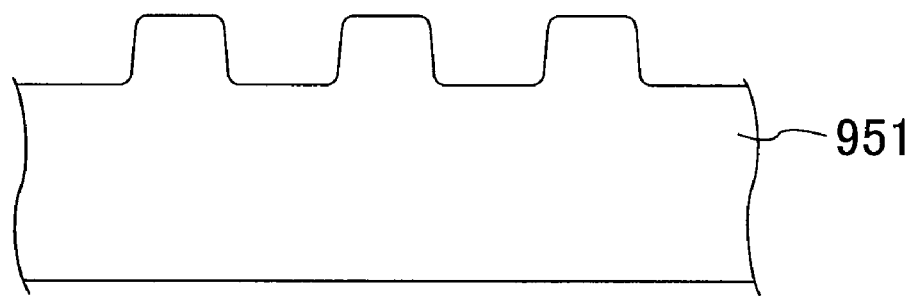
FIG. 19 schematically shows a cross-sectional structure of a fin-shaped semiconductor region after plasma doping in the fin-shaped NMISFET of the fin-shaped CMISFET according to the first example.

FIG. 19 schematically shows a cross-sectional shape of a fin-shaped semiconductor region (strictly, the semiconductor region 951 having fins) after the n-type impurity plasma doping is performed in the present example. The plasma doping condition is such that, for example, the material gas is $AsH_3$ diluted with He, the $AsH_3$ concentration in the material gas is 0.05% by mass, the chamber pressure is 0.4 Pa, the source power (the plasma-generating high-frequency power) is 2000 W, the bias voltage Vpp is 290 V, the substrate temperature is 20° C., and the plasma doping time is 60 seconds. An ICP method, for example, was used as a plasma generating method. Note that in the present example, in order to make the amount of implanted ions incident on the fin upper surface very small to suppress the amount of chipping of the fin corner portion, the chamber pressure is set to be as small as 0.4 Pa and the ion current density is set to be 0.18 mA/cm$^2$, a very small value for an ICP method, though the source power is set to be as large as 2000 W. The radius of curvature of the fin corner portion after the n-type impurity plasma doping is performed under such a condition (FIG. 19) is 16.2 nm. That is, in the present example, the difference between the radius of curvature of the fin corner portion before the n-type impurity plasma doping and that after the n-type impurity plasma doping is 7.5 nm, and the amount of chipping (the amount of increase in the radius of curvature) per minute is 7.5 nm. Moreover, in the present example, the radius of curvature of the fin corner portion after plasma doping is less than twice that before plasma doping, and it can therefore be seen that the amount of chipping of the fin corner portion is acceptably small.

Note that it can be seen that if the ion current density during the n-type impurity plasma doping is less than or equal to 0.1 mA/cm$^2$ as shown in FIG. 18A, the influence of the amount of chipping of the fin corner portion on the performance of the semiconductor device is within an acceptable range and will not present problems. In view of this, it is understood that it is preferred to set the pressure during the n-type impurity plasma doping to be less than or equal to 0.4 Pa as described above in the first example.

As opposed to the above approach, where the n-type impurity plasma doping is performed while setting the chamber pressure to be 10 Pa or more, one may set the source power to be very low (e.g., 25 w) and thus set the ion current density to be very small, to thereby suppress the radius of curvature of the fin corner portion after plasma doping to be less than or equal to twice that before plasma doping. However, setting the source power to be so low is equal to forcibly decreasing the ion current density by placing a high load on the plasma doping apparatus. Then, it may become no longer possible to maintain a plasma in the chamber. Therefore, it is not practical for one to attempt to reduce the amount of chipping of the fin corner portion by setting the pressure during the n-type impurity plasma doping to be 10 Pa or more.

SECOND EXAMPLE

Figure 20A:
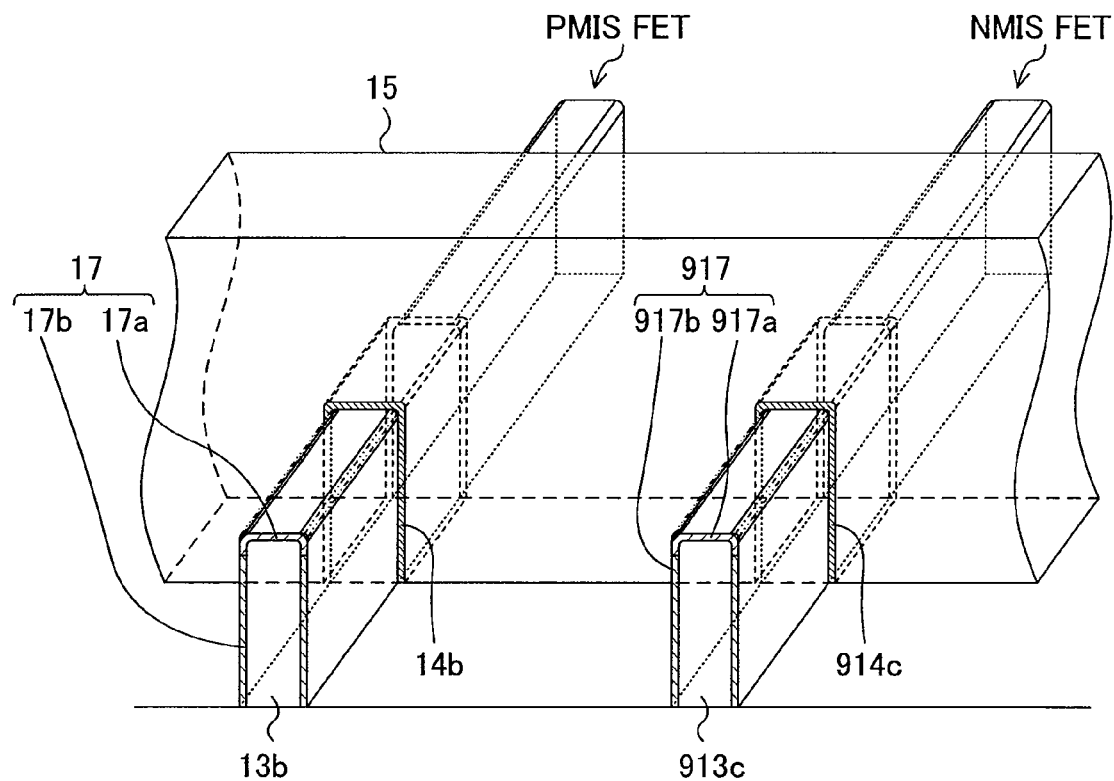
FIG. 20A is a perspective view of a fin-shaped CMISFET according to a second example.
Figure 20B:
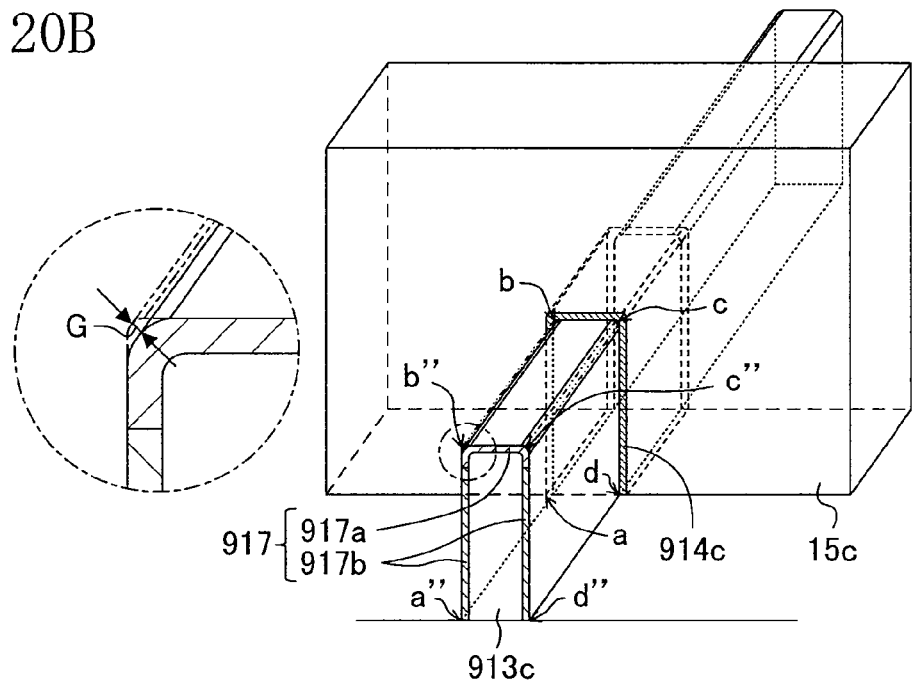
FIG. 20B is an enlarged perspective view showing an NMISFET of the fin-shaped CMISFET shown in FIG. 20A.

FIG. 20A is a perspective view of another example (second example) of a fin-shaped CMISFET, and FIG. 20B is an enlarged perspective view showing an NMISFET of the fin-shaped CMISFET shown in FIG. 20A. In FIGS. 20A and 20B, like elements to those of the fin-shaped CMISFET shown in FIGS. 1A-1E are denoted by like reference numerals and will not be described redundantly.

First, referring to FIG. 20B, the chipping of the fin corner portion (the upper corner) of a fin-shaped NMISFET, and the specific resistance of the n-type impurity region in the fin upper portion and that of the n-type impurity region in the fin side portion will be described. They similarly apply to a fin-shaped PMISFET. While "specific resistance (resistivity)" is mainly used in the following description, the magnitude of the resistance can be represented by "sheet resistance" or "spreading resistance" instead of "specific resistance". As shown in FIG. 20B, the gate electrode 15c is formed so as to extend across the p-type fin-shaped semiconductor region 913c having the n-type impurity region 917a in an upper portion thereof and the n-type impurity region 917b in a side portion thereof, with the gate insulating film 914c interposed therebetween. Herein, the height and the width of the p-type fin-shaped semiconductor region 913c (and those of the n-type fin-shaped semiconductor region 13b) are about 50 nm and 20 nm, respectively. That is, the present example is directed to a fin-shaped CMISFET where the fin width is reduced to about 20 nm, which is a value on the practically required level. In FIG. 20B, a, b, c and d denote corners on the source side along the inner wall of the gate insulating film 914c having a pommel horse shape, and a'', b'', c'' and d'' are obtained by translating the corners a, b, c and d to the source-side end surface of the p-type fin-shaped semiconductor region 913c.

In the present example, the distance G between the corner b'' and the upper-portion n-type impurity region 917a, i.e., the distance G between the corner c'' and the upper-portion n-type impurity region 917a, is 0.6 nm.

The corners a, b, c and d on the source side along the inner wall of the gate insulating film 914c having a pommel horse shape are covered and protected by the gate insulating film 914c and the gate electrode 15c in the plasma doping process and the following cleaning step. On the other hand, the fin corner portion of the p-type fin-shaped semiconductor region 913c which is not covered by the gate insulating film 914c and the gate electrode 15c is chipped off in the plasma doping process and the following cleaning step. Herein, the above distance G of 0.6 nm is the amount of chipping of the fin corner portion in the plasma doping process and the following cleaning step (not including the amount of chipping before plasma doping), and is suppressed to be very small though it is not zero.

Also in the present example, as in the first example, the specific resistance of the n-type impurity region 917b in the fin side portion is substantially equal to the specific resistance of the n-type impurity region 917a in the fin upper portion.

That is, the fin-shaped CMISFET of the present example also realizes a characteristic device configuration where the amount of chipping of the fin corner portion is small and the specific resistance of the impurity region in a fin side portion is substantially equal to that of the impurity region in a fin upper portion.

While the method for making the specific resistance of the impurity region in the fin side portion substantially equal to that of the impurity region in the fin upper portion has been described above in Mechanism Of Present Invention, this mechanism is effective also in the present example where the fin width is reduced to about 20 nm.

Figure 21A:
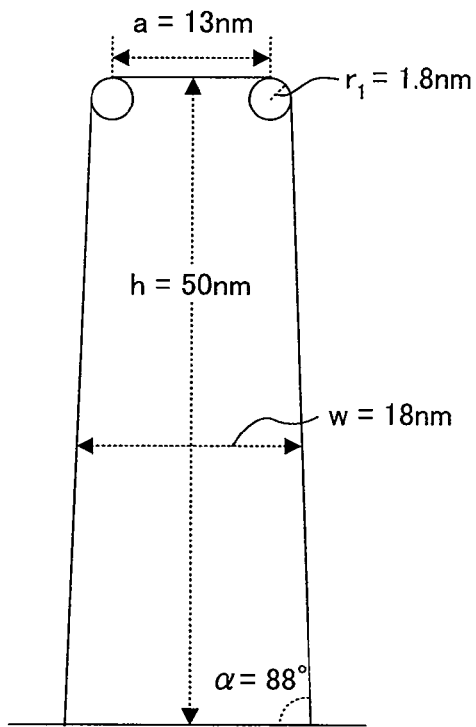
FIGS. 21A-21C are diagrams illustrating the amount of chipping of the fin corner portion in the fin-shaped NMISFET of the fin-shaped CMISFET according to the second example.

In view of this, referring to FIGS. 21A-21C, the amount of chipping of the fin corner portion in a case where the fin width is as small as about 20 nm will now be described in greater detail. FIG. 21A shows the outline of a cross section including the corners a, b, c and d on the source side along the inner wall of the gate insulating film 914c having a pommel horse shape, FIG. 21B shows the outline of a cross section of the p-type fin-shaped semiconductor region 913c (hereinafter also referred to simply as a "fin") outside the gate insulating film 914c, and FIG. 21C shows the fin corner portion shown in FIG. 21A and the fin corner portion shown in FIG. 21B superimposed on each other.

As shown in FIG. 21A, before the plasma doping process, the fin height is 50 nm, the fin width is 18 nm, the taper angle of the fin is 88°, the width of the flat portion of the fin upper surface is 13 nm, and the radius of curvature of the fin corner portion is 1.8 nm. Note that the fin corner portion is in a shape with a curvature, but not a completely right-angled shape, even before the n-type impurity plasma doping process because the fin corner portion is chipped off slightly in the fin-forming dry etching step and the cleaning step before the n-type impurity plasma doping process.

Figure 21B:
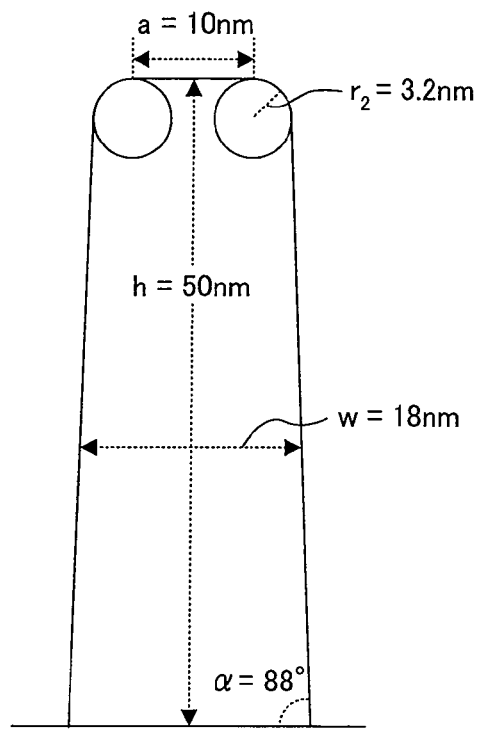

As shown in FIG. 21B, after the plasma doping process (strictly, at the point when the device is completed after the subsequent cleaning step), the fin height is 50 nm, the fin width is 18 nm, the taper angle of the fin is 88°, the width of the flat portion of the fin upper surface is 10 nm, and the radius of curvature of the fin corner portion is 3.2 nm.

Figure 21C:
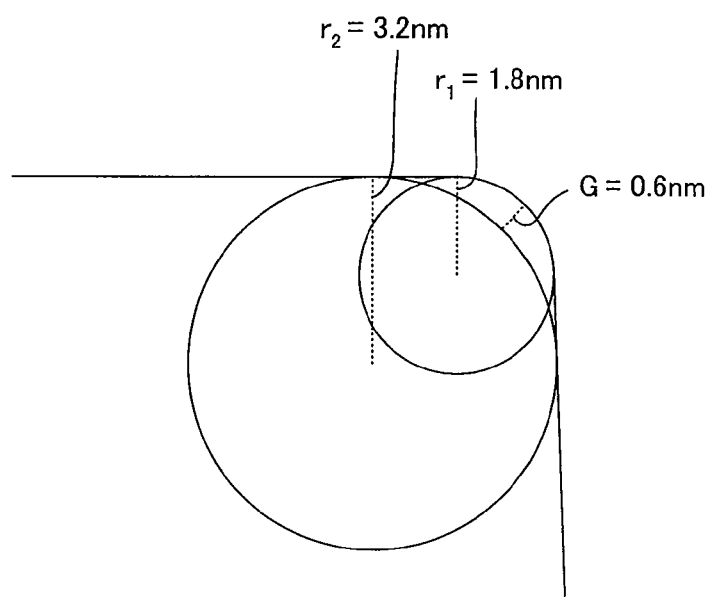

Moreover, as shown in FIG. 21C, the amount of chipping of the fin corner portion, i.e., the distance G, in the plasma doping process and the following cleaning step is 0.6 nm.

A plasma doping condition capable of producing a fin-shaped NMISFET in which the amount of chipping of the fin corner portion is small, and the specific resistance of the impurity region in the fin side portion is substantially equal to that of the impurity region in the fin upper portion, as described above, is such that, for example, the material gas is $AsH_3$ (arsine) diluted with He (helium), the $AsH_3$ concentration in the material gas is 0.5% by mass, the total flow rate of the material gas is 100 $cm^3$/min (standard state), the chamber pressure is 0.30 Pa, the source power (the plasma-generating high-frequency power) is 500 W, the bias voltage (Vpp) is 250 V, the substrate temperature is 30° C., and the plasma doping time is 60 seconds. An ICP method, for example, was used as a plasma generating method. Herein, in order to make the amount of implanted ions incident on the fin upper surface very small to control the amount of chipping of the fin corner portion, and to make the specific resistance of the impurity region in the fin side portion substantially equal to that of the impurity region in the fin upper portion, the chamber pressure is set to be 0.30 Pa, a very small value for an ICP method.

Moreover, as described above, the radius of curvature of the fin corner portion of the fin-shaped NMISFET in the example fin-shaped CMISFET is 1.8 nm before the plasma doping process, but the radius of curvature is 3.2 nm when the device is completed, indicating that the amount of increase in the radius of curvature due to the chipping in the plasma doping process and the following cleaning step is 1.4 nm. In other words, the radius of curvature of the fin corner portion at the point when the device is completed after the plasma doping process, etc., is suppressed to be about 1.8 times that before the plasma doping process, and the amount of chipping of the fin corner portion (the amount of increase in the radius of curvature) is within an acceptable range.

The description has been directed to the fin-shaped NMISFET of the example fin-shaped CMISFET. Also with the fin-shaped PMISFET, however, the amount of chipping of the fin corner portion, i.e., the distance G is about 0.6 nm, and the specific resistance of the impurity region in the fin side portion is substantially equal to that of the impurity region in the fin upper portion. A plasma doping condition capable of producing such a fin-shaped PMISFET is, for example, such that the material gas is $B_2H_6$ (diborane) diluted with He (helium), the $B_2H_6$ concentration in the material gas is 0.5% by mass, the total flow rate of the material gas is 100 cm$^3$/min (standard state), the chamber pressure is 0.35 Pa, the source power (the plasma-generating high-frequency power) is 500 W, the bias voltage (Vpp) is 250 V, the substrate temperature is 30° C., and the plasma doping time is 60 seconds. An ICP method, for example, was used as a plasma generating method. Herein, in order to make the amount of implanted ions incident on the fin upper surface very small to control the amount of chipping of the fin corner portion, and to make the specific resistance of the impurity region in the fin side portion substantially equal to that of the impurity region in the fin upper portion, the chamber pressure is set to be 0.35 Pa, a very small value for an ICP method.

As described above, where boron is used as a p-type impurity for forming the fin-shaped PMISFET and arsenic, which has a greater mass than boron, is used as an n-type impurity for forming the fin-shaped NMISFET, it is a characteristic of the present example that the pressure during plasma doping for forming the fin-shaped NMISFET is set to be less than or equal to that during plasma doping for forming the fin-shaped PMISFET, as can be seen from a comparison between the above plasma doping condition for forming the fin-shaped PMISFET and that for forming the fin-shaped NMISFET. Then, it is possible to make the amount of chipping of the fin corner portion for the fin-shaped PMISFET substantially equal to that for the fin-shaped NMISFET, and to make the specific resistance of the impurity region in the fin side portion substantially equal to that of the impurity region in the fin upper portion for both of the fin-shaped PMISFET and the fin-shaped NMISFET (note however that the level of specific resistance of the impurity region differs between the fin-shaped PMISFET and the fin-shaped NMISFET). Where the mass of the p-type impurity is greater than the mass of the n-type impurity, similar effects to those of the present example can be obtained by setting the pressure during plasma doping for forming the fin-shaped PMISFET to be less than or equal to that during plasma doping for forming the fin-shaped NMISFET.

[Basic Structure Of Semiconductor Device Obtained In First And Second Examples]

Figure 22:
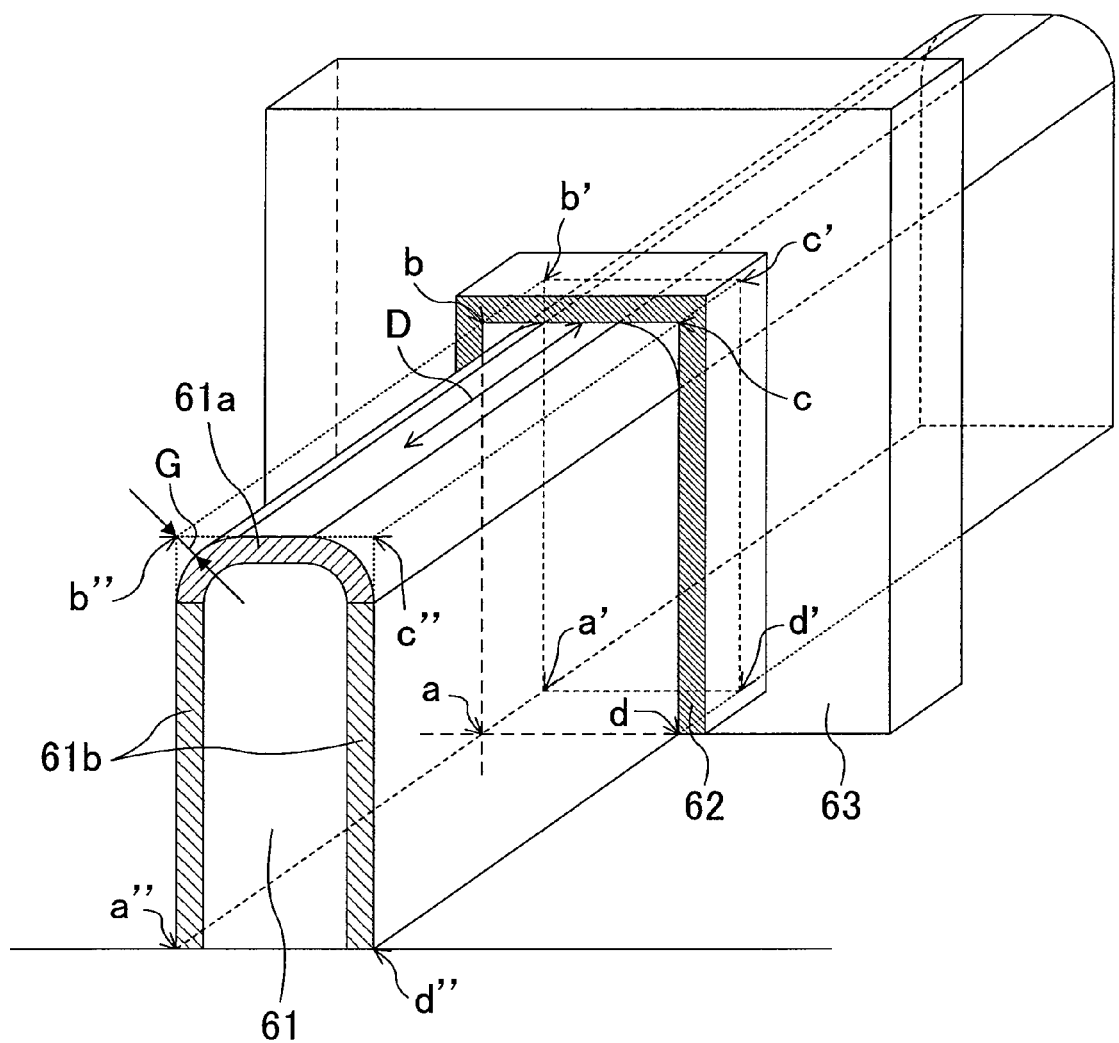
FIG. 22 is a perspective view schematically showing an example of a basic structure of a semiconductor device according to the first and second examples.

FIG. 22 is a perspective view schematically showing an example of a basic structure of a semiconductor device obtained in the first example and the second example. Specifically, the figure shows a structure of the device before plasma doping where a gate electrode has been formed on a fin-shaped semiconductor region having a substantially right-angled upper corner with a gate insulating film interposed therebetween. As shown in FIG. 22, a gate electrode 63 is formed so as to bridge over a fin-shaped semiconductor region 61 having an impurity region 61*a* in an upper portion thereof and an impurity region 61*b* in a side portion thereof, with the gate insulating film 62 interposed therebetween. Herein, a, b, c and d denote corners on the source side along the inner wall of the gate insulating film 62 having a pommel horse shape, and a'', b'', c'' and d'' are obtained by translating the corners a, b, c and d to the source-side end surface of the fin-shaped semiconductor region 61. The height of the fin is 10-500 nm, for example, the width of the fin is 10-500 nm, for example, and the distance between fins is 20-500 nm. Where the present invention is applied to a semiconductor device having such minute fins, it is possible to realize a semiconductor device having a characteristic that the distance G between the corner b'' and the first impurity region 61*a* (the fin upper portion), i.e., the distance G between the corner c'' and the first impurity region 61*a* (the fin upper portion), is greater than zero and less than or equal to 10 nm and a characteristic that the sheet resistance of the second impurity region 61*b* (the fin side portion) normalized with the sheet resistance of the first impurity region 61*a* (the fin upper portion) is less than or equal to 1.25, thus obtaining effects of the present invention. Note that the distance G between the corner b'' and the first impurity region 61*a* (the fin upper portion) or the distance G between the corner c'' and the first impurity region 61*a* (the fin upper portion) means the maximum value of the distance between the plane including the rectangle a-a'-b'-b, the plane including the rectangle b-b'-c'-c or the plane including the rectangle c-c'-d'-d and the first impurity region 61*a* (where a, b, c and d are the corners on the source side along the inner wall of the gate insulating film 62 having a pommel horse shape and a', b', c' and d' are the corresponding corners on the drain side), and this is a quantity that reflects the amount of the upper corner of the fin-shaped semiconductor region chipped off by plasma doping. Moreover, the characteristic that the distance G between the corner b'' and the first impurity region 61*a* (the fin upper portion), i.e., the distance G between the corner c'' and the first impurity region 61*a* (the fin upper portion), is greater than zero and less than or equal to 10 nm is normally equivalent to the characteristic that the radius of curvature r' of the upper corner in the semiconductor region 61 located outside the gate insulating film 62 (i.e., the radius of curvature after plasma doping) is greater than the radius of curvature r of the upper corner in the semiconductor region 61 located under the gate insulating film 62 (i.e., the radius of curvature before plasma doping) and is less than or equal to 2×r.

Figure 23:
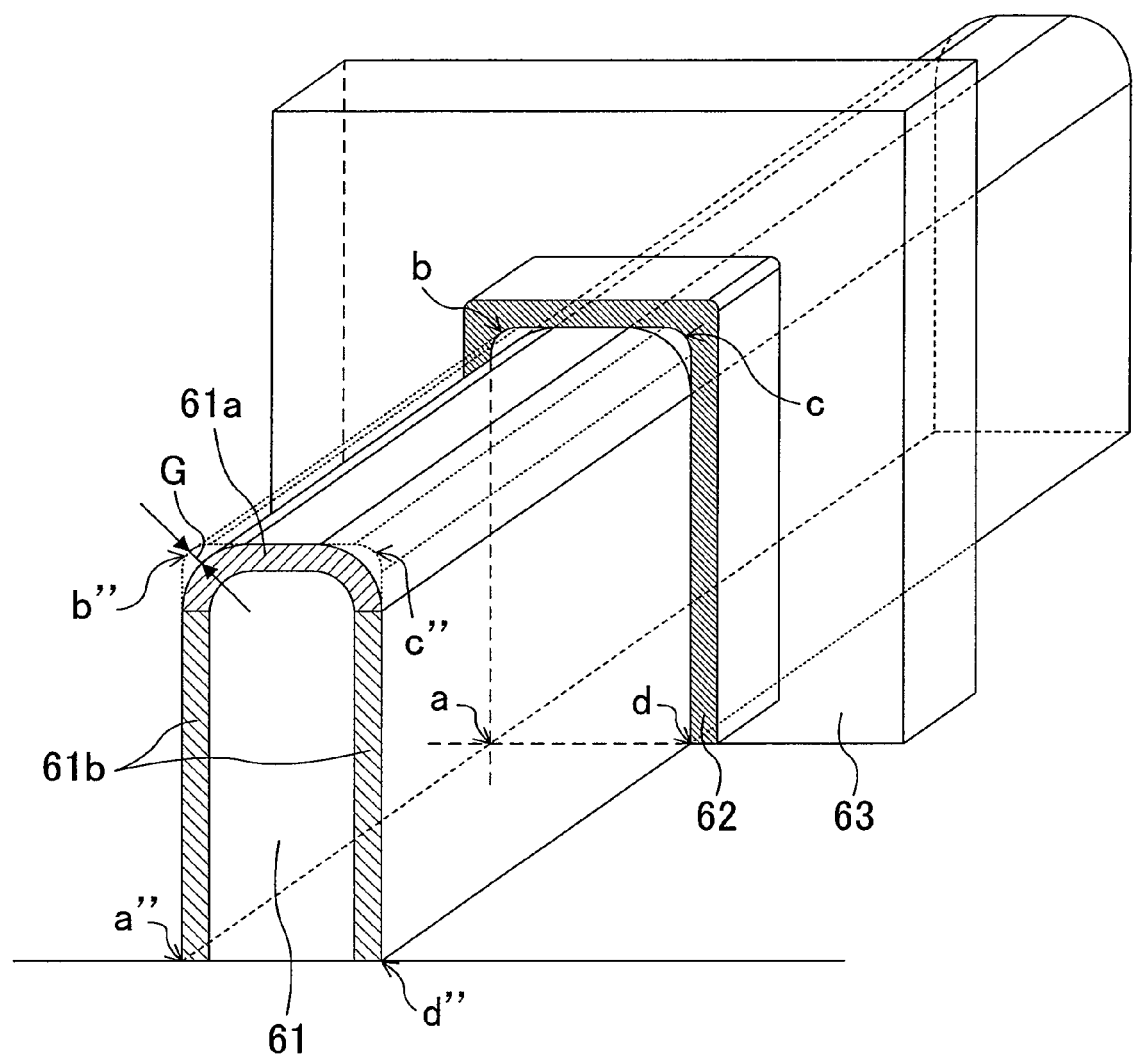
FIG. 23 is a perspective view schematically showing another example of a basic structure of a semiconductor device according to the first and second examples.

FIG. 23 is a perspective view schematically showing another example of a structure of a semiconductor device obtained in the first example and the second example. Specifically, the figure shows a structure of the device where the semiconductor region is formed so that the fin corner portion in advance has some radius of curvature before the formation of the gate insulating film, and then the gate electrode is formed thereon with the gate insulating film interposed therebetween. Note that in FIG. 23, like elements to those shown in FIG. 22 are denoted by like reference numerals and will not be described redundantly. It has been pointed out that when the fin corner portion is nearly right-angled, it is difficult for a current to flow from the source to the drain through the fin corner portion. This is a problem that occurs depending on whether there is a nearly right-angled corner portion in a connecting portion between the gate insulating film 62 and the first impurity region 61a (the fin upper portion), irrespective of the presence/absence or the magnitude of the chipping of the fin corner portion by plasma doping. In view of this, in order to solve the problem, it is preferred that the fin corner portion is in advance provided with a radius of curvature from about 3 nm to about 10 nm before the formation of the gate insulating film. Then, there will not be a nearly right-angled corner portion in a connecting portion between the gate insulating film 62 and the first impurity region 61a (the fin upper portion), and it will not be difficult for a current flow from the source to the drain to flow under the gate insulating film 62. Also where the present invention is applied to a semiconductor device having such fins, it is possible to realize a semiconductor device having a characteristic that the distance G between the corner b" and the first impurity region 61a (the fin upper portion), i.e., the distance G between the corner c" and the first impurity region 61a (the fin upper portion), is greater than zero and less than or equal to 10 nm and a characteristic that the sheet resistance of the second impurity region 61b (the fin side portion) normalized with the sheet resistance of the first impurity region 61a (the fin upper portion) is less than or equal to 1.25, thus obtaining effects of the present invention.

[Plasma Apparatus Used in First And Second Examples]

An ICP-type plasma apparatus is used in the first example and the second example. The reason is that it is then possible to also use a characteristic "being a plasma with large angles of incidence of ions" that is inherent to an ICP-type plasma, whereby it becomes easier to obtain the effects of the present invention. In addition, with an ICP method, the plasma density and the implantation depth can be controlled independently, whereby it is likely to be able to generate a plasma uniformly even for a substrate having a large diameter of 300 mm, for example, without increasing the electron temperature as much as that with the ECR (electron cyclotron resonance) plasma method. Therefore, it is possible to perform a plasma doping process uniformly for a plurality of fins within the surface of a large-diameter substrate while suppressing the chance of breaking the gate insulating film and freely choosing the implantation depth. That is, it is desirable to use an ICP-type plasma apparatus.

Problems occurring when the present invention is carried out using other plasma methods will now be described.

First, the RIE (reactive ion etching) plasma method will be discussed. With the RIE plasma method, a high-frequency power is applied to the cathode electrode. Thus, the generation of a plasma starts, and the plasma density is adjusted while the bias voltage is adjusted at the same time. Where the RIE plasma method is used, the generation of a plasma starts only at a high pressure. Therefore, in order to decrease the pressure to a low pressure such as that used in the example process after the plasma generation is once started at a high pressure, the pressure adjustment requires a long period of time, thereby lowering the productivity. Moreover, with the RIE plasma method, a plasma is generated only by applying a high-frequency power to a cathode electrode, whereby the plasma density and the implantation depth change simultaneously, and cannot be controlled independently, thus resulting in a poor process controllability. In contrast, with the ICP method described above, the plasma density is controlled by controlling the high-frequency power applied to the anode electrode and the implantation depth is controlled by controlling the high-frequency power applied to the cathode electrode, whereby the plasma density and the implantation depth can be controlled independently. Moreover, with the ICP method described above, it is possible to set the high-frequency power to be applied to the anode electrode at the start of the plasma generation to be high, whereby it is possible to start the plasma generation without using a pressure significantly higher than that used in a doping process.

Next, the ECR plasma method will be discussed. In the ECR plasma method, the excitation frequency is greater than or equal to 900 MHz. That is, with the ECR plasma method, since the excitation frequency is very high, the electron temperature is high, whereby the dielectric breakdown of the gate insulating film is likely to occur. In contrast, with the ICP method, the excitation frequency is 13.56 MHz, for example, i.e., smaller than that of the ECR plasma method by an order or magnitude or more, and the dielectric breakdown of the gate insulating film is relatively unlikely to occur. That is, it is desirable to use the ICP method as compared with the ECR plasma method.

Next, the pulsed DC plasma method will be discussed. With the pulsed DC plasma method, a pulsed DC high-frequency voltage is applied to the cathode electrode. With this method, the angle of incidence of ions is basically close to zero (i.e., at nearly a right angle with respect to the fin upper surface), whereby the sheet resistance of the fin side portion will be higher than that of the fin upper portion. In contrast, with the ICP method, an AC high-frequency voltage whose frequency is 500 MHz, 600 MHz or 13.56 MHz is applied to the cathode electrode. Thus, the angle of incidence of ions increases, whereby the sheet resistance of the fin side portion is likely to be substantially equal to that of the fin upper portion. That is, it is desirable to use the ICP method as compared with the pulsed DC plasma method.

Next, the helicon plasma method will be discussed. The helicon plasma method has a characteristic that a magnetic field of at least one 10 gauss or more is applied to the plasma and a characteristic that the distance between the plasma source and the substrate is long. With this method, since the distance between the plasma source and the substrate is long, it is difficult to obtain a good plasma uniformity for a large-diameter substrate such as a wafer having a diameter of 300 mm. In contrast, with the ICP method, it is not necessary to apply a magnetic field to the plasma, and the distance between the plasma source and the substrate is short, whereby it is likely to be able to obtain a good plasma uniformity for a large-diameter substrate such as a wafer having a diameter of 300 mm. That is, it is desirable to use the ICP method as compared with the helicon plasma method.

First Variation of First Embodiment

A structure of a semiconductor device according to a first variation of the first embodiment (including the first example and the second example) will now be described with reference to the drawings.

Figure 24:
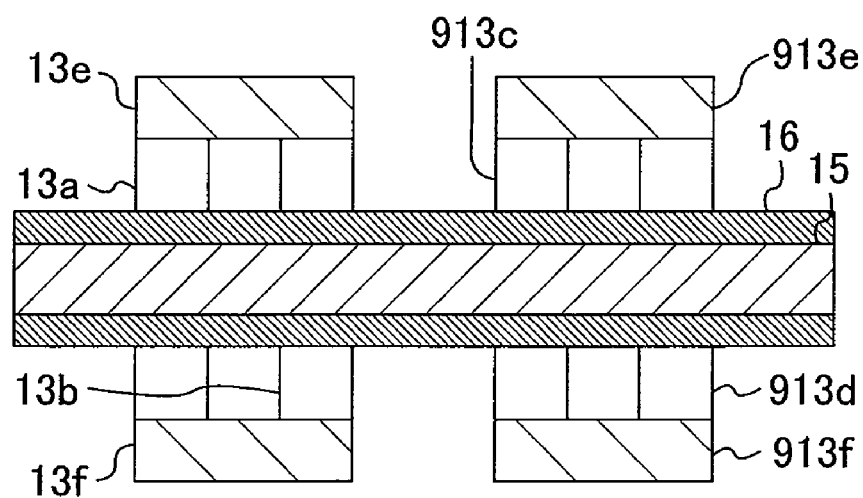
FIG. 24 is a plan view of a semiconductor device according to a first variation of the first embodiment.

FIG. 24 is a plan view of a semiconductor device of this variation, specifically, a semiconductor device including a fin-shaped CMISFET. Note that in FIG. 24, like elements to those of the first embodiment shown in FIGS. 1A-1E are denoted by like reference numerals and will not be described redundantly.

As shown in FIG. 24, this variation differs from the first embodiment shown in FIGS. 1A-1E in that other fin-shaped semiconductor regions 13e and 13f connect together end portions of the n-type fin-shaped semiconductor regions 13a and 13b on each side of the n-type fin-shaped semiconductor regions 13a and 13b in the gate length direction, and that other fin-shaped semiconductor regions 913e and 913f connect together end portions of the p-type fin-shaped semiconductor regions 913c and 913d on each side of the p-type fin-shaped semiconductor regions 913c and 913d in the gate length direction.

According to this variation, it is possible to obtain the following effects, in addition to effects similar to those of the first embodiment. That is, one fin-shaped PMISFET can be formed by the n-type fin-shaped semiconductor regions 13a and 13b and the other fin-shaped semiconductor regions 13e and 13f, and one fin-shaped NMISFET can be formed by the p-type fin-shaped semiconductor regions 913a and 913b and the other fin-shaped semiconductor regions 913e and 913f.

Second Variation of First Embodiment

A structure of a semiconductor device according to a second variation of the first embodiment (including the first example and the second example) will now be described with reference to the drawings.

Figure 25A:
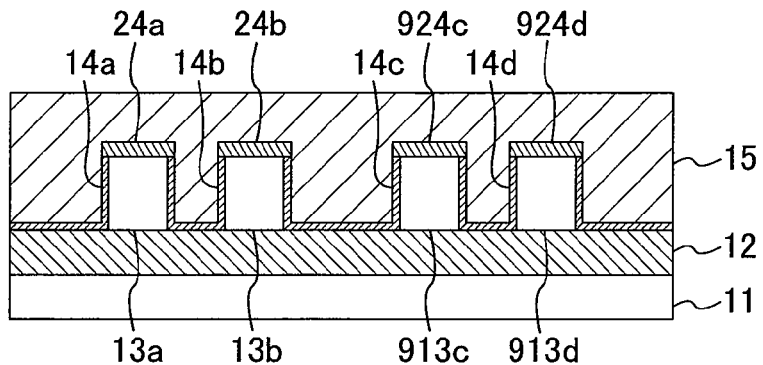
Figure 25B:
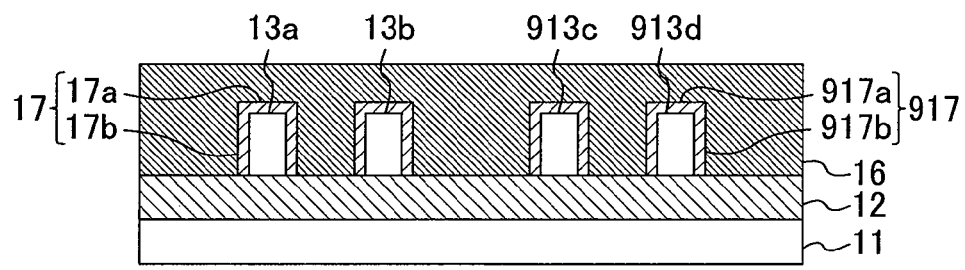
Figure 25C:
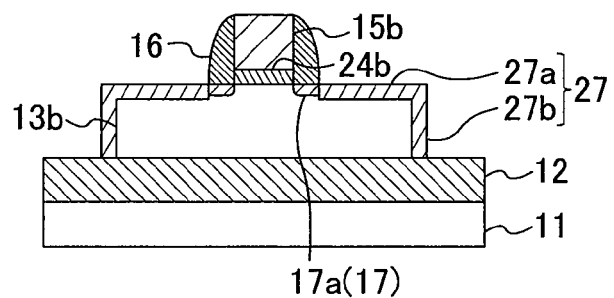
Figure 25D:
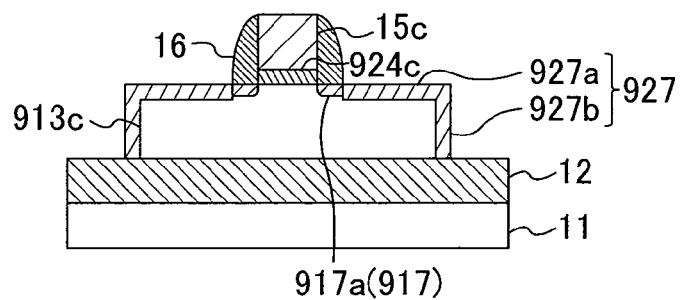

A plan view showing a structure of a semiconductor device of this variation, specifically, a semiconductor device including a fin-shaped CMISFET, is the same as FIG. 1A being a plan view of the first embodiment. FIGS. 25A-25D show cross-sectional structures of the semiconductor device of this variation, wherein FIG. 25A is a cross-sectional view taken along line A-A in FIG. 1A, FIG. 25B is a cross-sectional view taken along line B-B in FIG. 1A, FIG. 25C is a cross-sectional view taken along line C-C in FIG. 1A, and FIG. 25D is a cross-sectional view taken along line D-D in FIG. 1A.

As shown in FIGS. 25A-25D, this variation differs from the first embodiment shown in FIGS. 1A-1E as follows. That is, in the first embodiment, the gate insulating films 14a and 14b having a thickness of 3 nm and made of a silicon oxynitride film, for example, are formed on the upper surface and the side surface of the n-type fin-shaped semiconductor regions 13a and 13b, and the gate insulating films 914c and 914d having a thickness of 3 nm and made of a silicon oxynitride film, for example, are formed on the upper surface and the side surface of the p-type fin-shaped semiconductor regions 913c and 913d. In contrast, in this variation, the gate insulating films 14a and 14b are formed only on the side surface of the n-type fin-shaped semiconductor regions 13a and 13b, the gate insulating films 914c and 914d are formed only on the side surface of the p-type fin-shaped semiconductor regions 913c and 913d, insulating films 924a and 924b having a thickness of 20 nm and made of a silicon oxide film, for example, are formed on the upper surface of the n-type fin-shaped semiconductor regions 13a and 13b, and insulating films 924c and 924d having a thickness of 20 nm and made of a silicon oxide film, for example, are formed on the upper surface of the p-type fin-shaped semiconductor regions 913c and 913d.

That is, in this variation, only the side portion of the n-type fin-shaped semiconductor regions 13a and 13b and the p-type fin-shaped semiconductor regions 913c and 913d is used as a channel region. Also with such a structure, it is possible to obtain effects similar to those of the first embodiment if the aspect ratio ("the height of the side surface of the fin-shaped semiconductor region"/"the width of the upper surface of the fin-shaped semiconductor region in the gate width direction") is large.

COMPARATIVE EXAMPLE

Figure 26A:
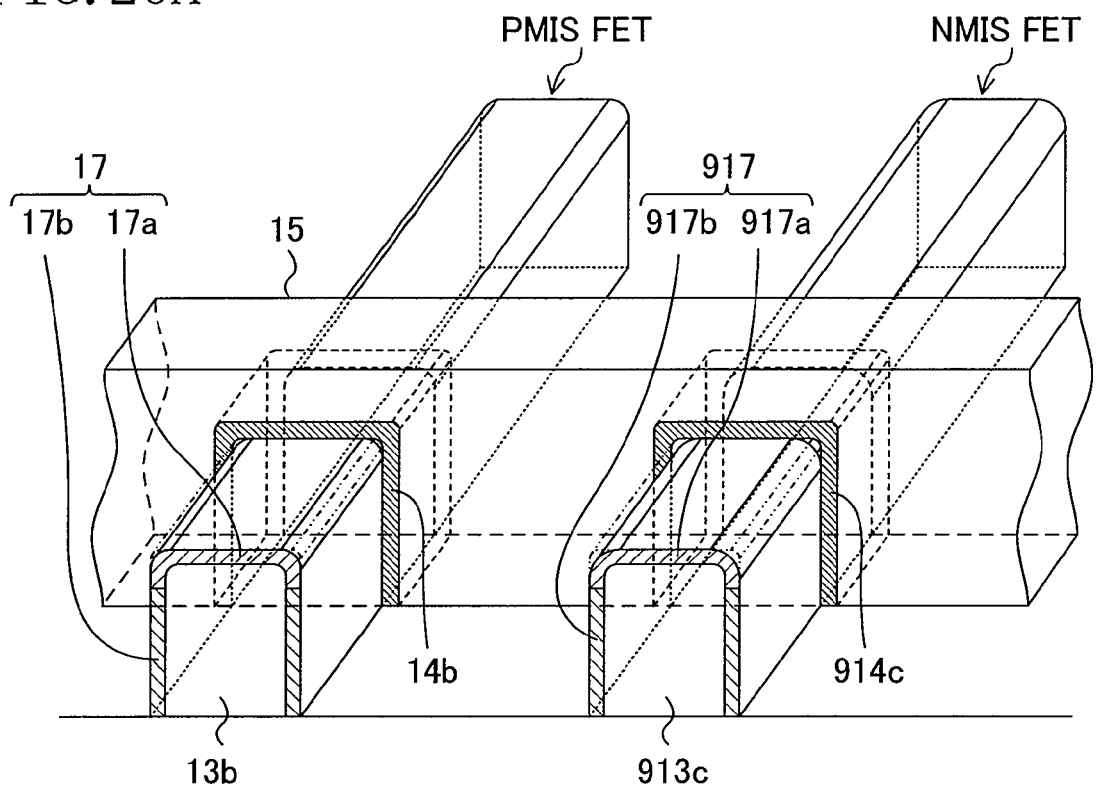
FIG. 26A is a perspective view of a fin-shaped CMISFET according to a comparative example.
Figure 26B:
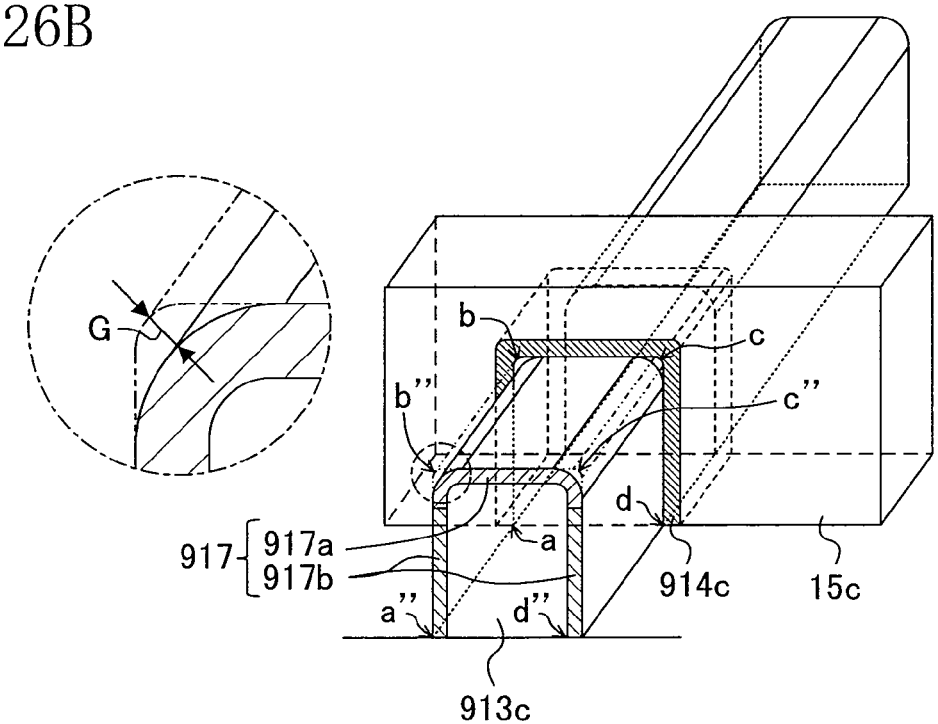
FIG. 26B is an enlarged perspective view of the fin-shaped NMISFET of the fin-shaped CMISFET shown in FIG. 26A.
Figure 27A:
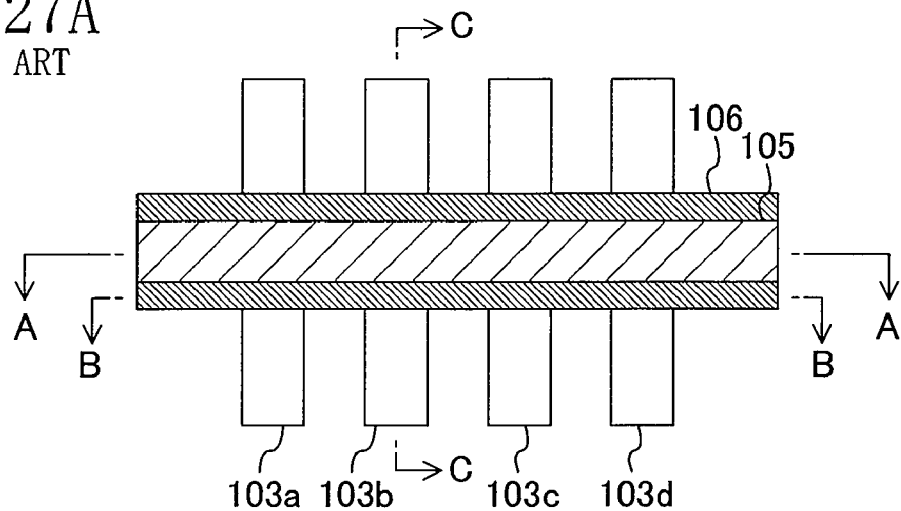
Figure 27B:
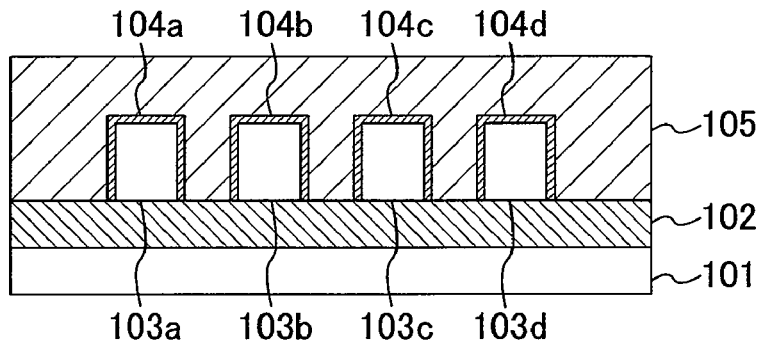
Figure 27C:
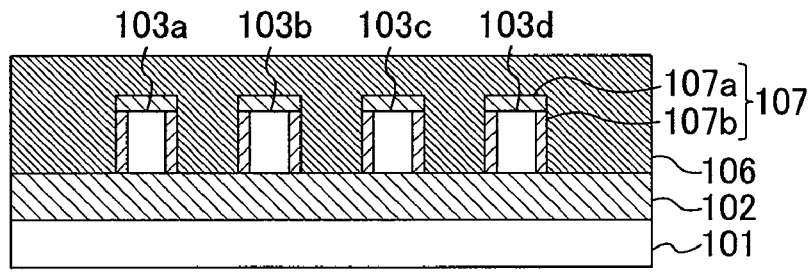
Figure 27D:
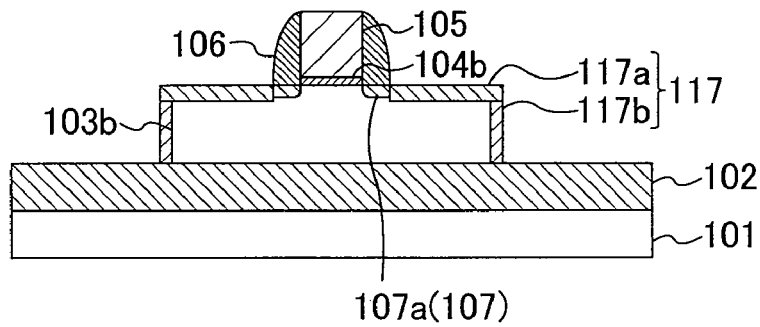
Figure 28A:
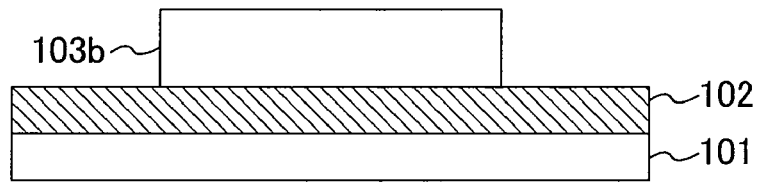
FIGS. 28A-28D are cross-sectional views showing step by step a conventional method for producing a semiconductor device.
Figure 28B:
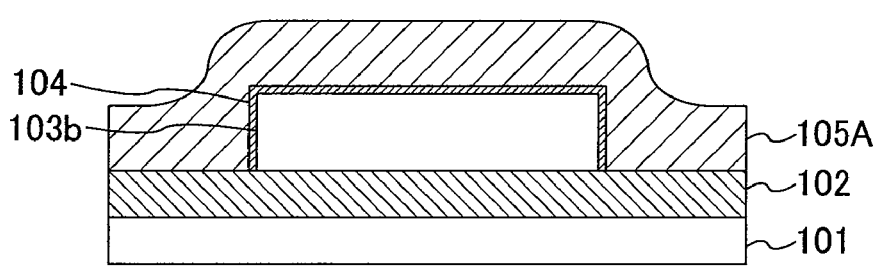
Figure 28C:
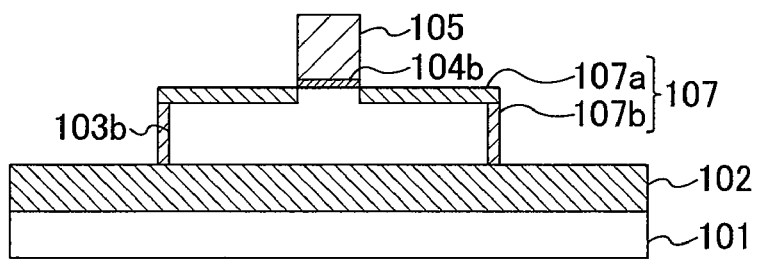
Figure 28D:
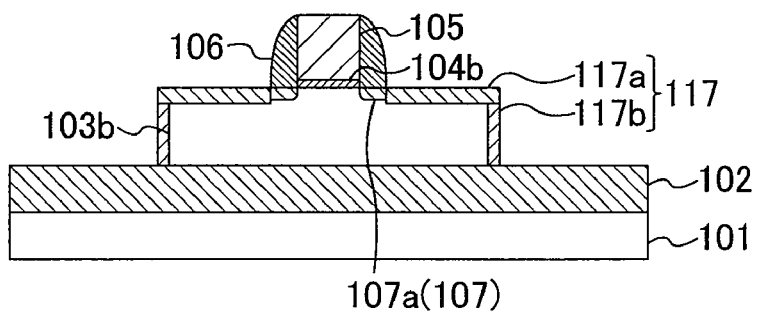
Figure 29A:
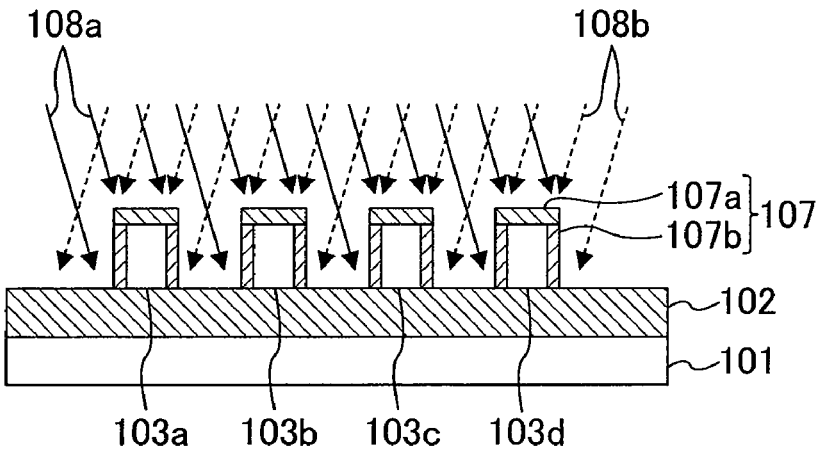
FIG. 29A is a cross-sectional view showing the step of forming a source-drain region of a fin-shaped FET as described in Patent Document 1.
Figure 29B:
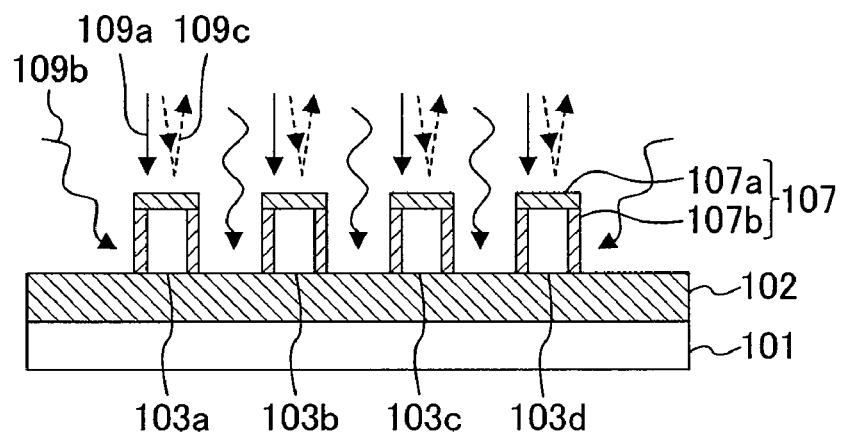
FIG. 29B is a cross-sectional view showing the step of forming a source-drain region of a fin-shaped FET as described in Non-Patent Document 1.
Figure 30A:
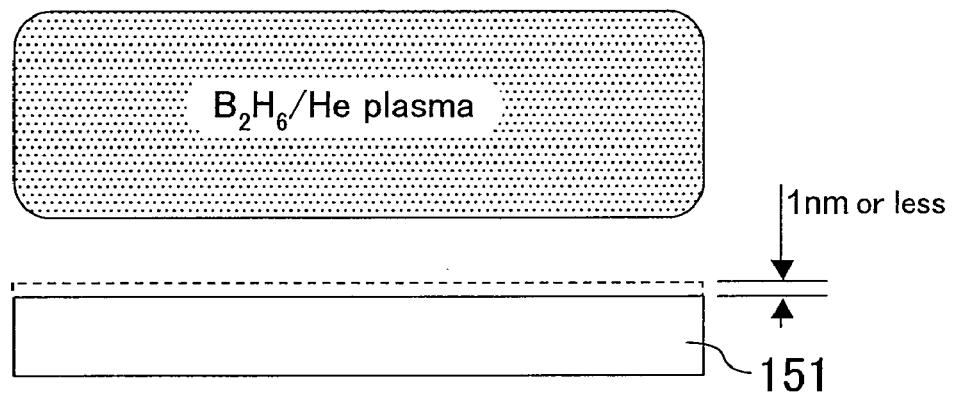
FIG. 30A shows the amount of chipping where a plasma doping method disclosed in Patent Document 2 is applied to a flat semiconductor region.
Figure 30B:
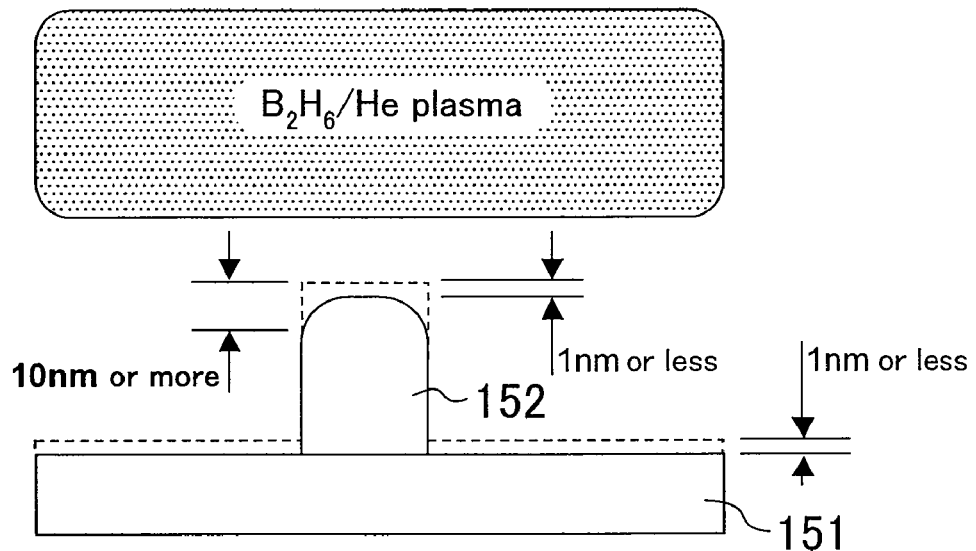
FIG. 30B shows the amount of chipping where a plasma doping method disclosed in Patent Document 2 is applied to a fin-shaped semiconductor region.

FIG. 26A is a perspective view of a fin-shaped CMISFET according to a comparative example, and FIG. 26B is an enlarged perspective view of the fin-shaped NMISFET of the fin-shaped CMISFET shown in FIG. 26A. In FIGS. 26A and 26B, like elements to those of the fin-shaped CMISFET shown in FIGS. 1A-1E are denoted by like reference numerals and will not be described redundantly.

This comparative example differs from the first example and the second example in that where boron is used as a p-type impurity for forming the fin-shaped PMISFET and arsenic, which has a greater mass than boron, is used as an n-type impurity for forming the fin-shaped NMISFET, the pressure during the n-type impurity plasma doping is set to be substantially equal to or greater than that during the p-type impurity plasma doping.

Referring to FIG. 26B, the chipping of the fin corner portion of the fin-shaped NMISFET of the comparative example will now be described. As shown in FIG. 26B, the gate electrode 15c is formed so as to extend across the p-type fin-shaped semiconductor region 913c having the n-type impurity region 917a in an upper portion thereof and the n-type impurity region 917b in a side portion thereof, with the gate insulating film 914c interposed therebetween. In FIG. 26B, a, b, c and d denote corners on the source side along the inner wall of the gate insulating film 914c having a pommel horse shape, and a", b", c" and d" are obtained by translating the corners a, b, c and d to the source-side end surface of the p-type fin-shaped semiconductor region 913c.

In this comparative example, the distance G between the corner b" and the upper-portion n-type impurity region 917a, i.e., the distance G between the corner c" and the upper-portion n-type impurity region 917a, was over 10 nm. Therefore, the amount of chipping of the fin corner portion (the amount of increase in the radius of curvature) after the plasma doping process for the fin-shaped NMISFET of the fin-shaped CMISFET of this comparative example is not within an acceptable range.

As described above, in a case where a fin-shaped PMISFET and a fin-shaped NMISFET are formed on the same substrate, wherein boron is used as a p-type impurity for forming the fin-shaped PMISFET (specifically, the p-type extension region thereof) and arsenic, which has a greater mass than boron, is used as an n-type impurity for forming the fin-shaped NMISFET (specifically, the n-type extension region thereof), if the pressure during the n-type impurity plasma doping is set to be substantially equal to or greater than that during the p-type impurity plasma doping, the amount of chipping of the fin corner portion (the amount of increase in the radius of curvature) of the fin-shaped NMISFET is increased, thereby increasing the gap between the gate insulating film and the extension region, thus deteriorating the transistor performance.

What is claimed is:

1. A semiconductor device comprising:
a first fin-shaped semiconductor region formed on a substrate, the first fin-shaped semiconductor region having first-conductivity-type impurity region formed therein;
a second fin-shaped semiconductor region formed on the substrate, the second fin-shaped semiconductor region having second-conductivity-type impurity region formed therein;
a first gate insulating film formed so as to cover at least a side surface and an upper corner of a predetermined portion of the first fin-shaped semiconductor region, the upper corner of the first fin-shaped semiconductor region having a radius of curvature of r1 under the first gate insulating film different from a radius of curvature of r1' outside the first gate insulating film; and
a second gate insulating film formed so as to cover at least a side surface and an upper corner of a predetermined portion of the second fin-shaped semiconductor region, the upper corner of the second fin-shaped semiconductor region having a radius of curvature of r2 under the second gate insulating film different from a radius of curvature of r2' outside the second gate insulating film, wherein
r1' is greater than r1 and less than or equal to 2×r1, and
r2' is greater than r2 and less than or equal to 2×r2.

2. The semiconductor device of claim 1, wherein
the first-conductivity type impurity region includes a first first-conductivity-type impurity region formed in an upper portion of the first fin-shaped semiconductor regions and a second first-conductivity-type impurity region formed in a side portion of the first fin-shaped semiconductor region, and
the second-conductivity-type impurity region includes a first second-conductivity-type impurity region formed in an upper portion of the second fin-shaped semiconductor region and a second second-conductivity-type impurity region formed in a side portion of the second fin-shaped semiconductor region.

3. The semiconductor device of claim 2, wherein
a sheet resistance of the second first-conductivity-type impurity region is less than or equal to 1.25 times that of the first first-conductivity-type impurity region, and
a sheet resistance of the second second-conductivity-type impurity region is less than or equal to 1.25 times that of the first second-conductivity-type impurity region.

4. The semiconductor device of claim 2, wherein
a resistivity of the second first-conductivity-type impurity region is less than or equal to 1.25 times that of the first first-conductivity-type impurity region, and
a resistivity of the second second-conductivity-type impurity region is less than or equal to 1.25 times that of the first second-conductivity-type impurity region.

5. The semiconductor device of claim 2, wherein
a spreading resistance of the second first-conductivity-type impurity region is less than or equal to 1.25 times that of the first first-conductivity-type impurity region, and
a spreading resistance of the second second-conductivity-type impurity region is less than or equal to 1.25 times that of the first second-conductivity-type impurity region.

6. The semiconductor device of claim 2, wherein
a junction depth of the second first-conductivity-type impurity region is substantially equal to or greater than that of the first first-conductivity-type impurity region, and
a junction depth of the second second-conductivity-type impurity region is substantially equal to or greater than that of the first second-conductivity-type impurity region.

7. The semiconductor device of claim 2, further comprising:
a first gate electrode formed on the first gate insulating film; and
a second gate electrode formed on the second gate insulating film, wherein
the first first-conductivity-type impurity region and the second first-conductivity-type impurity region are formed in another portion of the first fin-shaped semiconductor region other than the predetermined portion, and
the first second-conductivity-type impurity region and the second second-conductivity-type impurity region are formed in another portion of the second fin-shaped semiconductor region other than the predetermined portion.

8. The semiconductor device of claim 7, wherein
the first gate insulating film is formed also on an upper surface of the predetermined portion of the first fin-shaped semiconductor region, and
the second gate insulating film is formed also on an upper surface of the predetermined portion of the second fin-shaped semiconductor region.

9. The semiconductor device of claim 7, wherein
the first first-conductivity-type impurity region and the second first-conductivity-type impurity region are p-type extension regions, and
the first second-conductivity-type impurity region and the second second-conductivity-type impurity region are n-type extension regions.

10. The semiconductor device of claim 7, further comprising:
a first insulative sidewall spacer formed on a side surface of the first gate electrode;
a second insulative sidewall spacer formed on a side surface of the second gate electrode;
a third first-conductivity-type impurity region formed in the upper portion of the first fin-shaped semiconductor region;
a fourth first-conductivity-type impurity region formed in the side portion of the first fin-shaped semiconductor region;
a third second-conductivity-type impurity region formed in the upper portion of the second fin-shaped semiconductor region; and
a fourth second-conductivity-type impurity region formed in the side portion of the second fin-shaped semiconductor region, wherein
the third first-conductivity-type impurity region and the fourth first-conductivity-type impurity region are formed in a portion of the other portion of the first fin-shaped semiconductor region that is located outside the first insulative sidewall spacer, and
the third second-conductivity-type impurity region and the fourth second-conductivity-type impurity region are formed in a portion of the other portion of the second fin-shaped semiconductor region that is located outside the second insulative sidewall spacer.

11. The semiconductor device of claim 10, wherein
the third first-conductivity-type impurity region and the fourth first-conductivity-type impurity region are p-type source-drain regions, and the third second-conductivity-type impurity region and the fourth second-conductivity-type impurity region are n-type source-drain regions.

12. The semiconductor device of claim 1, wherein
an insulating film is formed between the substrate and each of the first fin-shaped semiconductor region and the second fin-shaped semiconductor region.

13. The semiconductor device of claim 1, wherein
a height of a side surface of the first fin-shaped semiconductor region is greater than a width in a gate width direction of an upper surface of the first fin-shaped semiconductor region, and
a height of a side surface of the second fin-shaped semiconductor region is greater than a width in a gate width direction of an upper surface of the second fin-shaped semiconductor region.

14. The semiconductor device of claim 1, wherein
a width in a gate width direction of an upper surface of each of the first fin-shaped semiconductor region and the second fin-shaped semiconductor region is less than or equal to 20 nm.

* * * * *